United States Patent [19]

Groom, Jr. et al.

[11] Patent Number: 4,483,002

[45] Date of Patent: Nov. 13, 1984

[54] DIGITAL DEVICE TESTING APPARATUS AND METHOD

[75] Inventors: Jay L. Groom, Jr., Longmont; Patricia J. Smith; Gary G. Vair, both of Boulder, all of Colo.

[73] Assignee: International Business Machines Corporation, Armonk, N.Y.

[21] Appl. No.: 369,782

[22] Filed: Apr. 19, 1982

[51] Int. Cl.³ .......................................... G06F 11/00
[52] U.S. Cl. ...................................... 371/29; 340/747
[58] Field of Search ................. 371/29, 25; 364/520; 340/721, 722, 745, 747, 754; 324/73 R

[56] References Cited

U.S. PATENT DOCUMENTS

| | | | |
|---|---|---|---|
| 3,771,131 | 11/1973 | Ling | 371/29 |
| 3,813,647 | 5/1974 | Loo | 340/172.5 |
| 3,818,201 | 6/1974 | Hartwich et al. | 235/151.31 |
| 3,831,149 | 8/1974 | Job | 340/172.5 |
| 3,927,310 | 12/1975 | D'Anna et al. | 235/153 |
| 3,937,938 | 2/1976 | Matthews | 371/29 |
| 3,976,864 | 8/1976 | Gordon et al. | 235/153 |
| 4,009,437 | 2/1977 | Lacher | 324/73 |
| 4,250,562 | 2/1981 | Haag et al. | 340/747 |

FOREIGN PATENT DOCUMENTS

| | | |
|---|---|---|
| 0021794 | 7/1981 | European Pat. Off. |
| 155215 | 5/1982 | Fed. Rep. of Germany |
| 2042420 | 9/1980 | United Kingdom |
| 1593128 | 7/1981 | United Kingdom |
| 2071886 | 9/1981 | United Kingdom |

OTHER PUBLICATIONS

Publication Entitled "Rechnernetzwerke", by H. Kerner and G. Bruckner, (1981).
Computer Design article entitled "Logic Analyzers Simplify System Integration Tasks", Mar. 1981, pp. 119–126.

Primary Examiner—Joseph F. Ruggiero
Assistant Examiner—Mark Ungerman
Attorney, Agent, or Firm—Gunter A. Hauptman; Earl C. Hancock

[57] ABSTRACT

Testing apparatus monitors signals at selected test points in a tested device. An operator specifies sets of signals defining a display window during which all signals at the selected test points will be available to the operator for immediate or later examination. One set of signals defines the beginning of the window. Another set defines the end of the window, but only after other sets or conditions, also specified by the operator, occur. For each set, the operator specifies test points monitored, signal states expected and what happens when the expected states occur.

2 Claims, 14 Drawing Figures

FIG. 4A

```
COMMAND
INPUT ====>
                            DATA REDUCTION
                       SINGLE PROCESS OPERATIONS
                                                        ─ SCREEN 300

*********************************************************************
SIGNAL SET CODE: C=COPY CYCLE; R=RESET; F=FROM SIGNAL; T=TO SIGNAL;
Q=QUALIFIER; D*=DELAY; A*=ADDR COMPARE; N=NOT; #P=PULSE COUNTER
S01  F ____  S02  2P S03  T  S04____  S05____  S06____  S07____  S08____
S09____      S10____   S11____      S12____  S13____  S14____  S15____  S16____
D1 ____      D2 ____   A1 ____      A2 ____   LOOP TO S01 (YES/NO) N
PROCESS DEFINITIONS-ENTER SIGNAL SET NUMBER AND ACTIVE/DEACTIVE FOR DMS
      1A      001 SIGNAL A
      3A      002 SIGNAL B
      2A      003 SIGNAL C
```

DIGITAL DEVICE TESTING APPARATUS AND METHOD

BACKGROUND OF THE INVENTION

1. Field of the Invention

The invention relates to automatic testing and, more particularly, to testing a device with a programmed digital computer.

2. Description of the Prior Art

Intermittent failures in complex digital electronic devices, such as microprocessor-controlled copiers, are extremely difficult to identify and correct. Because the failures occur infrequently, repair personnel must watch large numbers of points for long periods of time merely to observe a single failure; correction of the cause requires repeated observations. Standard cathode ray oscilloscopes transiently monitor only a few points and do not record observed phenomena for later analysis. Chart recorders make a paper record of relatively slow signals not commonly monitored in complex digital devices.

Logic analyzers simplify repair by simultaneously watching many points and displaying signals at these points only when prespecified failures occur. An article in *Computer Design*, March 1981, "Logic Analyzers Simplify System Integration Tasks" pages 119-126 describes displaying signals, at monitored points of a tested device, only when these signals occur within a specified address range or time interval. U.S. Pat. No. 3,831,149, issued Aug. 20, 1974, describes preselection of conditions under which data received from a tested system will be recorded (viz. identity between preset data and test data either records the test data only or starts recording from that time on). A circuit in U.S. Pat. No. 3,927,310, issued Dec. 16, 1975, strobes a display when preselected timing signals occur. In U.S. Pat. No. 3,976,864, issued Aug. 24, 1976, pulses start and stop data signature generation in accordance with preselected patterns and qualifiers which are compared with data conditions in a device under test. Apparatus described in U.S. Pat. No. 3,818,201, issued June 18, 1974, freezes a display of sampled signals upon detection of predetermined coincidences between sampled signals and external keys.

The prior art does not show testing apparatus which repeatedly displays portions of signals, at a plurality of test points in a tested digital device selected in accordance with predefined conditions and signals occurring at the test points.

SUMMARY OF THE INVENTION

A plurality of specified test points in a digital device to be tested supply test signals indicating operations in the tested device. Selected states of selected test point signals define a window during which all of the selected test point signals, including those not having one of the selected states, are displayed. The beginning and end of the window are defined in terms of the signal states at the selected test points, the occurrence of various types of control inputs (such as addresses) from the tested device, the completion of a delay period, the occurrence of a specified number of timing pulses, etc.

An operator specifies window criteria by identifying signal sets in a desired sequence. Each signal set includes a criteria-condition code (TO, FROM and intervening required conditions), signal states (i.e., levels at which a test point will meet the criteria), and the test points to be monitored. Each signal set is checked until all requirements are satisfied. The testing apparatus scans all the identified test points until signals at the specified test points match a signal set. Each match is noted until all test signals are scanned. The testing apparatus displays the signals from the test points occurring between a TO criterion and those FROM criteria which follow the completion of any specified intervening conditions.

BRIEF DESCRIPTION OF THE DRAWINGS

FIGS. 4A and 4B show the terminal input menu and the printer output, respectively, during operation of the apparatus of FIG. 1.

DETAILED DESCRIPTION

Figure 1:
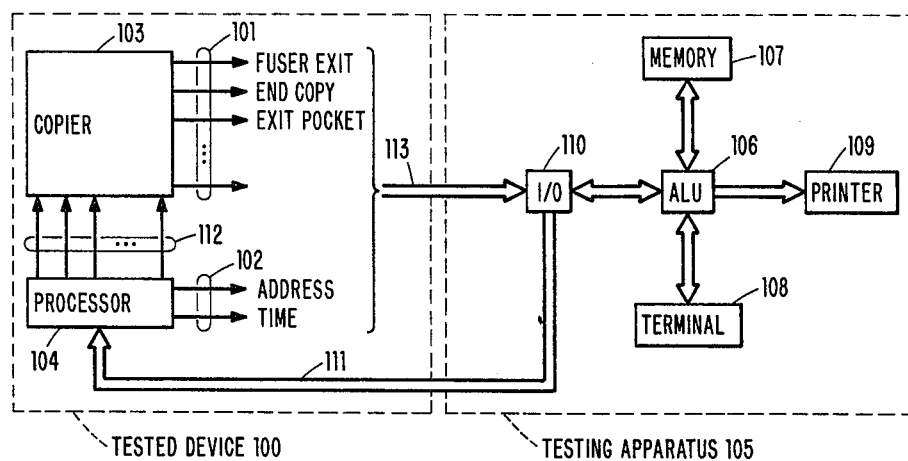
FIG. 1 is a block diagram showing testing apparatus connected to a tested device.

Referring to FIG. 1, a tested device 100 comprises an electronically controlled electromechanical apparatus, such as an electromechanical copier 103 having electrical test signal test point lines 101, and a digital electronic processor 104 for controlling the copier via copier control inputs 112. The processor operation may be monitored via additional condition test point lines 102. The tested device 100 may be any one of a large variety of complex digitally controlled devices; a typical microprocessor-controlled device 100 is the IBM Series III Copier/Duplicator.

Testing is facilitated by making available test point lines 101 carrying test point signals from within the copier 103; for example: Fuser Exit, End Copy, etc. The copier 103 is controlled by signals on lines 112 from the processor 104 and operation of the processor is monitored by interpretation of signals on test point lines 102; for example: the current address of the program counter in the processor 104, the number of clock cycles that have occurred ("time") etc. The signals on the test point lines 101 carrying signals from the copier 103 and on the test point lines 102 indicating the state of the processor 104 are connected to the testing apparatus 105 which controls the processor 104, by a cable 113. Cable 113 connects to an input/output section 110 of testing apparatus 105 which apparatus also includes an arithmetic logic unit 106 connected to a memory 107, to terminal 108 and a printer 109. A control bus 111 supplies signals from the input/output section 110 to the processor 104. An operator at the terminal 108 enters information into the testing apparatus 105 indicating which ones of the test point lines 101 and 102 are to be monitored, and what they are to be monitored for. The information entered via the terminal 108 is stored in the memory 107 and in accordance with a program, also stored in the memory 107, the arithmetic logic unit 106 processes, as data, test point signals present on cable 113. As a result of the processing of the data, signals on selected ones of the test point lines 101 and 102 may appear in real time at either the printer 109 or the terminal 108 for periods of time and under conditions specified by the operator at terminal 108. Alternatively, the signals on test point lines 101 and 102 may be stored in memory 107, or an associated mass storage memory (not shown), for later processing as though the information appears on cable 113 then. Thus a portable mass storage device may record operation of the tested device 100 at a remote location for later transportation to, and analysis by, the testing apparatus 105. Also, the results of the processing may be placed in either the memory 107 or the mass storage for later detailed analysis and repetition in place of, or in addition to, display on the terminal 108 or recording by the printer 109.

Figure 2A:
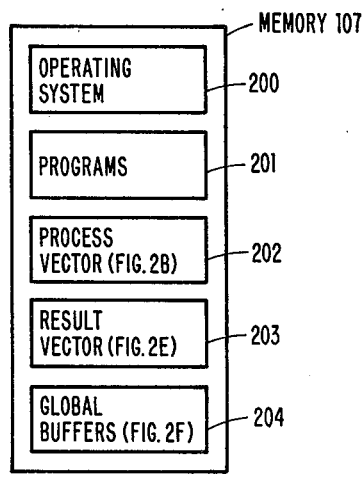
FIGS. 2A-2F are a map of information stored in the testing apparatus' memory of FIG. 1.
Figure 2B:
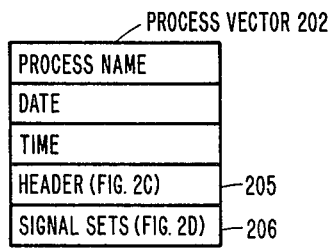
Figure 2C:
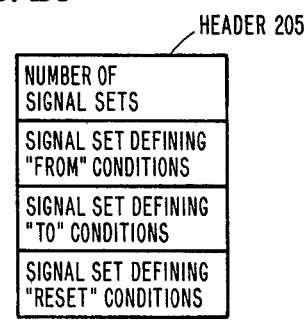
Figure 2D:
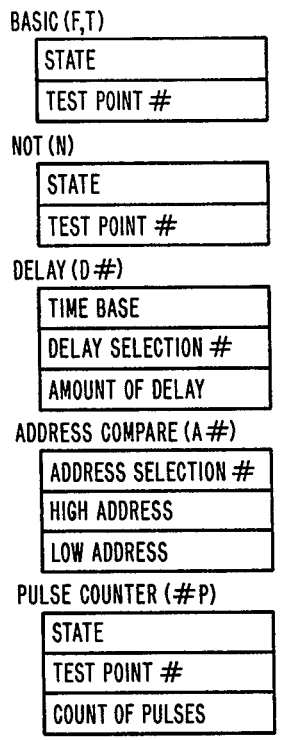
Figure 2E:
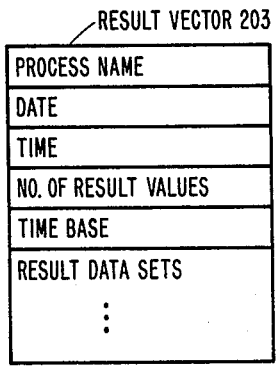
Figure 2F:
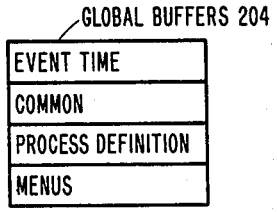

Referring now to FIGS. 2A through 2F, the arrangement of data in the memory 107 of FIG. 1 will be described. Memory 107 contains information received from a variety of sources including a mass storage. Areas 200–204 of memory 107 represent information available in the memory 107 at various times, but not necessarily at any one time. An operating system 200 controls the interface between the "hardware", such as the arithmetic logic unit 106, and the input/output controller 110 and other devices such as the printer 109 and the terminal 108. Programs 201 (described in detail below) use primitive commands in the operating system 200 to operate the testing apparatus 105 in accordance with instructions provided by a programmer. A process vector 202, to be described in more detail with reference to FIGS. 2B–2D, includes a number of signal sets defining the types of tests to be performed by the testing apparatus 105 on the tested device 100. The results of the tests are stored in memory 107 in a result vector 203, described with reference to FIG. 2E. Global buffers 204, described with reference to FIG. 2F, provide interim storage areas required during the processing of data by the testing apparatus 105.

In FIG. 2B, the process vector 202 includes a series of locations identifying the name assigned by the operator to the particular test being conducted, the date that the test is conducted, the time of the test, header 205, to be described with reference to FIG. 2C, and a number of signal sets 206, to be described with reference to FIG. 2D. In FIG. 2C, the header 205 identifies the number of signal sets provided in the processor vector 202, which ones of the signal sets define the FROM condition, the TO condition and, if provided, the RESET condition (which starts testing from the beginning). In FIG. 2D, the signal sets 206, from which particular conditions may be selected, are shown. Any one of these may be placed in the signal sets 206 of the process vector 202. The signal sets 206 specify test parameters, as will be described below. The BASIC signal set may be either a FROM or TO set defining the beginning or end, respectively, of a window. The state (active or deactive) is specified in the BASIC signal set along with the number of the test point line 101 upon which a test point signal with the desired state is to occur. The NOT signal set specifies states and test point numbers in the same way as a BASIC signal set. A DELAY signal set identifies clock speed (i.e., a time base of one microsecond means a clock rate of one megaHertz). The amount of delay is specified in accordance with the identified time base clock period and, since more than one delay may be specified, the number of the delay to which the set corresponds is also identified in the signal set. The AD-DRESS COMPARE signal set similarly permits specification of several addresses either individually or in a separate table of processor addresses. The PULSE COUNTER signal set counts the number of pulses of a specified state occurring at a specified test point.

Referring to FIG. 2E, process vector 202 of FIG. 2B generates result vector 203 containing a process name, date and time similar to the process vector 202. The number of result values and the time base selected is followed by the result data sets. Each result data set contains data for displaying or printing one test. This data includes the time at which the test was run, the number of elements in the result and the results of each successful FROM/TO calculation. In FIG. 2F, the global buffers 204 include, among others, an event time buffer which accumulates or counts time events, a common work buffer available for miscellaneous operations, a process definition buffer reserved for processing data, and a menu area used for holding information needed to display to the operator menus at the terminal 108.

Figure 3:
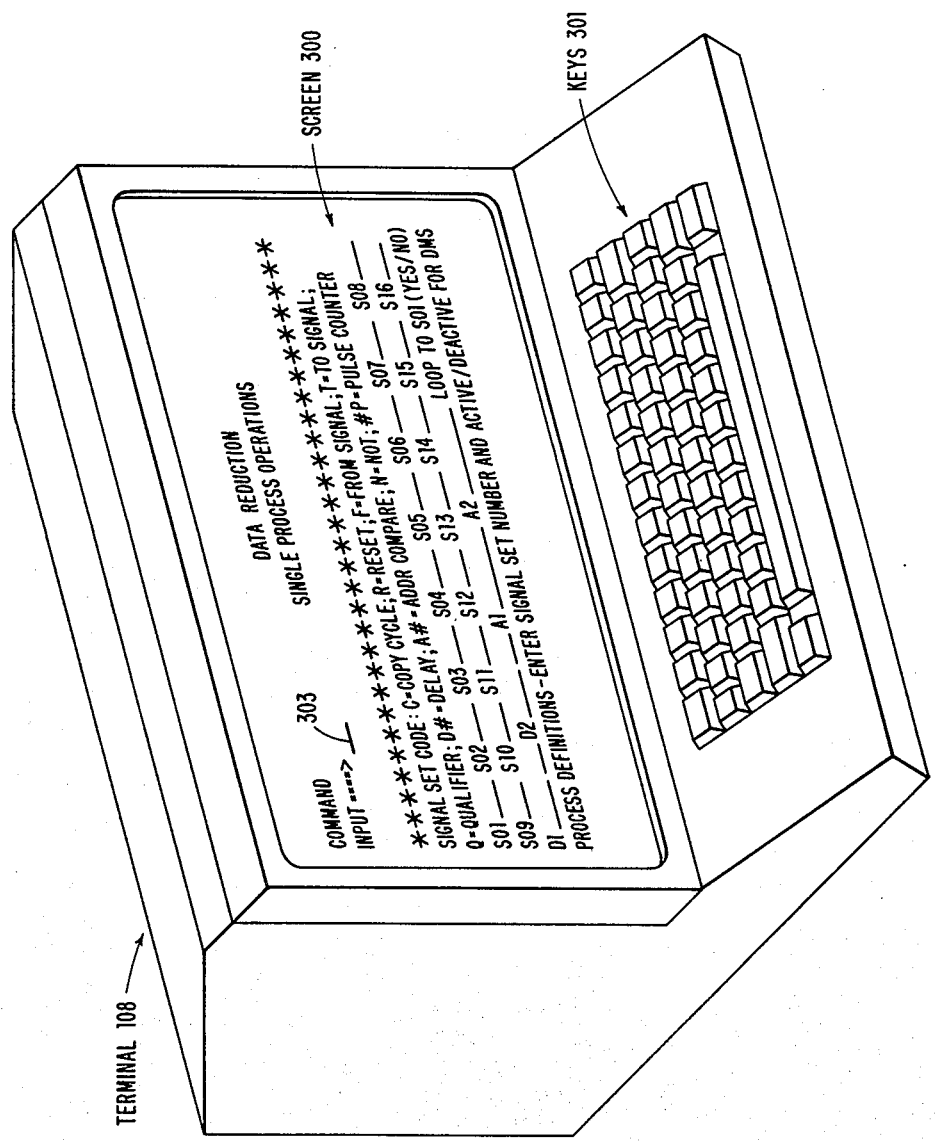
FIG. 3 shows the terminal of FIG. 1 and illustrates an input menu.

Set up and operator specification of process operations will be described with reference to FIGS. 3 and 4. In FIG. 3, the terminal 108 includes keys 301 permitting an operator to enter information into the testing apparatus 105 by filling in specified areas of a menu displayed on a screen 300. The screen 300 displays a series of menus showing information required before the tested device 100 can be tested by the testing apparatus 105. Only one of the menus will be described, a large number of menus being required for editing and selection, report options, event timer reporting, test case data scanning, report selection, multiple process operations, etc. Keys 301 permit the operator to move a cursor 303, or other marker, on the screen 300 to positions indicated by blanks and horizontal lines. For example, with the cursor 303 at the blank following the legend "COMMAND INPUT" the operator may enter a command instructing the testing apparatus 105 to perform some other operation, resulting in removal of the menu shown in FIG. 3. If the operator moves the cursor 303 to one of the lines following the legend "S01", the operator may enter one of the signal set codes defined in the two lines above this position. If the cursor is placed next to one of the legends "D1", "D2", "A1", or "A2", the operator may enter a number. The space following the words "PROCESS DEFINITIONS" are reserved for entry by the operator of a process vector comprising rows of signal sets which must specify operational information in a certain order and convention, to be described below. In place of keys 301, transparent switches, a light pen or other control may move the cursor 303 on the screen 300 or otherwise assist the operator in entering data.

Figure 4B:
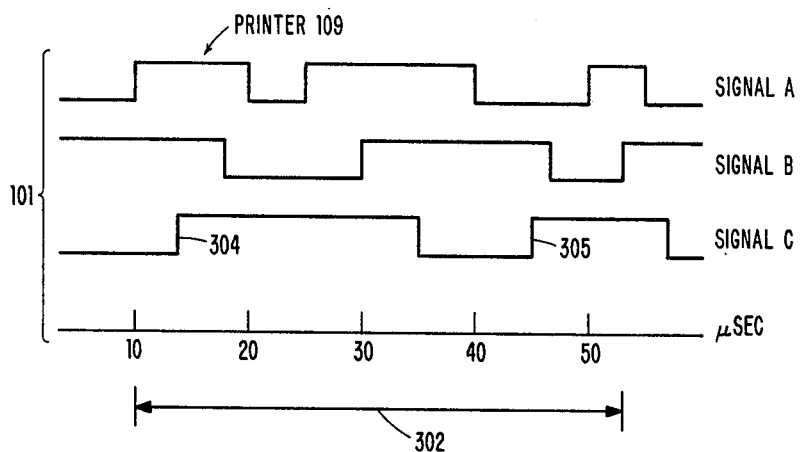

In FIG. 4A, the operator at keys 301 in FIG. 3 has entered the information shown on the screen 300. Next to the legend "S01" he has entered the letter "F" meaning that signal set 1 defines the FROM signal. The letter "T" next to the legend "S03" indicates that the signal set 3 defines the TO signal. Thus, the operator has defined a window for the display of signals defined by the occurrence of the signal set number 1 and ending with the signal set number 3. The entry "2P" next to the legend "S02" indicates that the end of the window, occurring at the time that set 3 is satisfied, will not be recognized until the conditions specified in set 2 are first satisfied. In this case, the set of conditions "S02" requires that two external pulses occur before the window ends. The "N" next to the "Loop to S01" legend is a negative reply to the "(yes/no)" question. While the entries so far have defined the types of conditions which signal sets must satisfy, the signal sets themselves have not been specified. This occurs below the legend "PROCESS DEFINITIONS" where the process vector comprising a series of signal sets appears. The operator has entered as the first signal set "001" the requirement that the window start from the active level of signal A. This is indicated by the entry "1A" meaning that the signal set code for "S01" (i.e., FROM) is defined when signal A is active ("A"). Similarly, the second line indicates that the window ends ("TO") at the active level of signal B. The third line conditions the occurrence of the "2" condition upon the prior occurrence of two (see "2P" adjacent "S02") active transitions of signal C. The results appear in FIG. 4B which illustrates the output on printer 109 of testing of lines 101 connected to three points on the copier 103 and processor 104. The window 302 starts at time 10 when signal A becomes active. It ends after time 50 when signal B becomes active following two active transitions 304, 305 of signal C.

Figure 5:
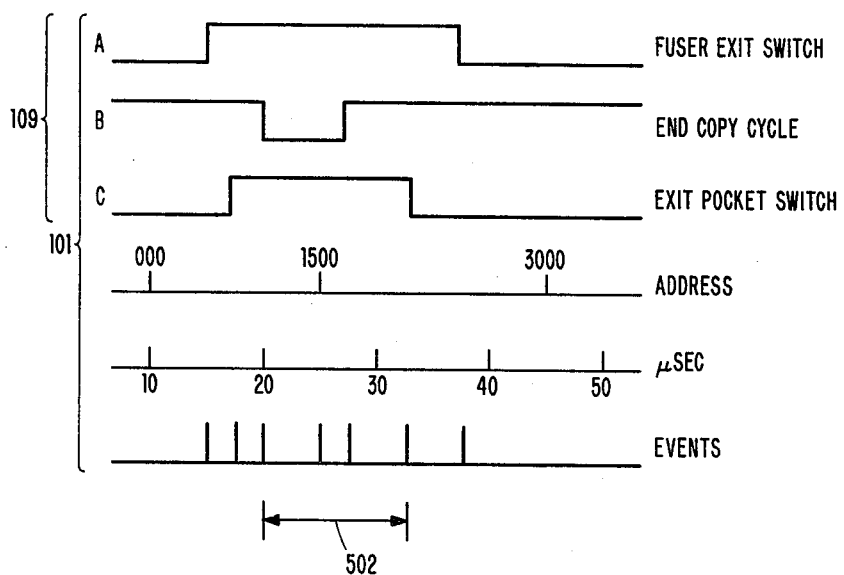
FIG. 5 is a waveform diagram illustrating signals present during operation of the tested device and testing apparatus shown in FIG. 1.

An additional example of testing of the tested device 100 by the testing apparatus 105 appears in FIG. 5 where the tested apparatus 105 is directly connected to the test points 101: Fuser Exit Switch, End Copy Cycle, Exit Pocket and Address indicating operations in the copier 103 and processor 104. The test operator wishes to watch signals occurring during a narrow time window starting when only the Fuser Exit Switch and Exit Pocket Switch are active and ending when the Exit Pocket Switch signal become deactive following a processor 104 address 1500. If, after this address occurs, the Exit Pocket Switch signal becomes deactive, the copier 103 is operating correctly. If the Exit Pocket Switch signal stays active, there is an error in the operation of the copier 103. Therefore, by monitoring the window 502, the operator detects malfunctions.

To initiate this test, the operator must complete the information required on the screen 300 in FIG. 3. The desired operation is a window 502 extending from the coincidence of the active level of line A, deactive level of line B and active level of line C to the one deactive level of line C which follows the occurrence of address 1500. If the menu is on screen 300, the operator enters, adjacent the legend "S01", an "F" indicating that the first signal set is the FROM condition. He enters, adjacent the legend "S03", a "T" indicating the TO condition. Adjacent the legend "S02", "A1" will specify the need to monitor an address prior to recognition of the TO condition. The particular address (in this case "1500") that is to be monitored is entered by the operator adjacent the legend "A1". Then, below the legend "PROCESS DEFINITIONS", the operator identifies the conditions necessary to satisfy each one of the three sets in the process vector. The first line, "1A 001 SIGNAL A", indicates that the active level of signal A is considered in the determination of whether the FROM condition is satisfied. The second line, "1D 002 SIGNAL B", indicates that the deactive level of signal B is also considered in the FROM condition. The third and last line, "1A3D 003 SIGNAL C", indicates that signal C's active state must be considered for the FROM condition, and that the deactive signal C is necessary for the TO condition.

Once the operator has specified the conditions and signal sets, the testing apparatus 105 scans the test point lines 101 for any signal transition, active to deactive, or vice versa. When the first selected (deactive to active) transition of the Fuser Exit Switch line A occurs, the testing apparatus 105 records the time at which the event occurs and the conditions surrounding the recognition of the event in the result vector 203. The other signal sets are then compared to the event. The second signal set (1D 001 SIGNAL A) does not satisfy the event, nor does the third signal set (1A3D 003 SIGNAL C). The next event occurs when the Exit Pocket line C becomes active. This event satisfies none of the three signal sets. The third event occurs when the End Copy Cycle line B becomes deactive. This condition satisfies the second signal set and since the three conditions for the FROM code type are now simultaneously satisfied, the beginning of the window is defined. This is the point at which display of information on lines A, B and C will begin whenever visual observation is requested. The next event, which occurs when address 1500 appears on test point 102 from the processor 104, is a precondition to subsequent recognition of the TO condition. When the End Copy Cycle line B becomes active, it does not satisfy any of the signal sets. However, when the Exit Pocket line C becomes deactive, the conditions for recognition of the third signal set are satisfied and the end of window 502 is defined. If the test point lines 101 and 102 are continually scanned, the information on lines A, B and C will, when requested, repeatedly appear on the printer 109 during the window 502. The information displayed on the printer 109 may simultaneously, or instead, be displayed on the terminal 108 or the result vector may be entered in a mass storage unit for later use.

DESCRIPTION OF THE OPERATION

While the invention may be built using commercially available logic circuits, the preferred embodiment uses an IBM Series/1 general-purpose minicomputer programmed to provide the necessary controls. The Appendix illustrates the source-code listing of relevant portions of an IBM Series/1 Event Driven Executive program facilitating practice of the invention. If desired, an equivalent program can instead be written for the same, or another machine, in any appropriate high-level language, assembler mnemonics or directly in machine code. The publication *Series/1 Digest* (Third Edition, September 1978, Form No. G360-0061-2), available from the IBM Corporation, Atlanta, Ga., summarizes the Series/1 system.

Figure 6:
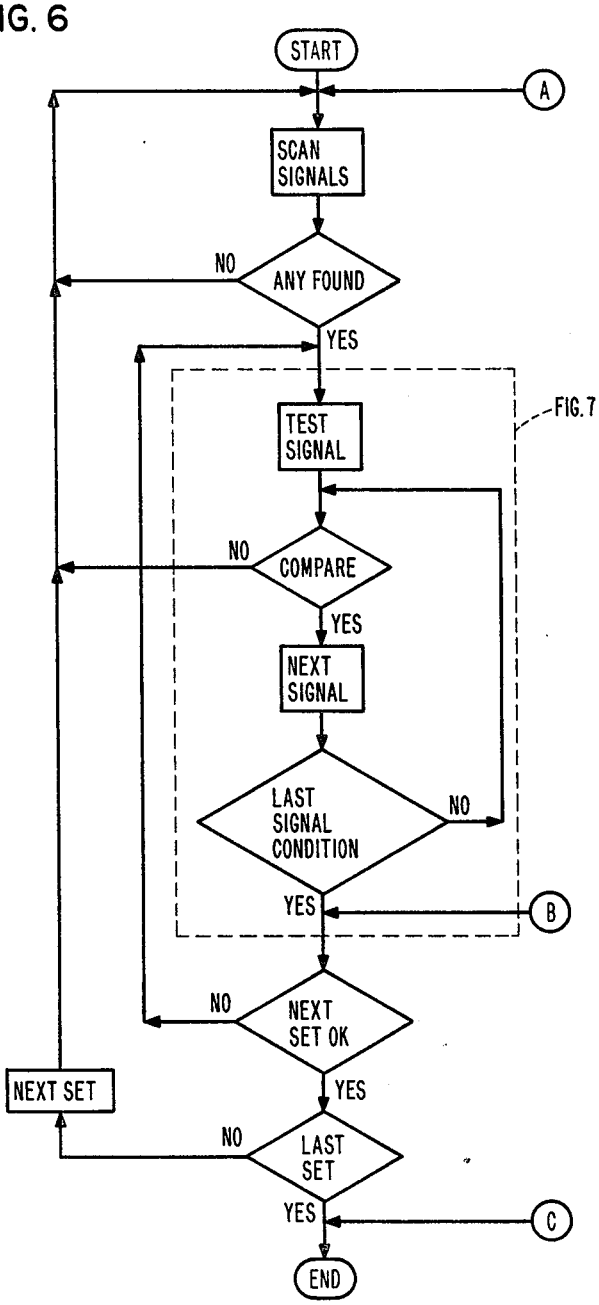
FIGS. 6 and 7 are flow diagrams tracing the operation of the apparatus of FIG. 1.

Operation of the preferred embodiment will now be described by referring to the Appendix and FIGS. 6-8. In FIG. 6, the FIG. 1 tested device 100 test point lines 101 are scanned by the testing apparatus 105 until the selected state (active or deactive) of one of the test point signals (A, B, etc.) specified in the menu by the operator is found. If any one signal with a selected state is found, that signal is checked against the various types of signal sets (criteria and conditions) defined in the menu by the operator to see if it (along with other test point signals) satisfies the sets with which it is associated. If it does not, scanning resumes until a signal state does match a specified set. One defined limit of a display window is recognized in accordance with a match and scanning continues until all the limits of the window are defined.

In more detail, scanning of test point signals starts at point A in the FIG. 6 flow diagram and ends at point C when the last defined test point signal has been scanned. Each test point line is scanned once for a signal transition to a selected state on that line. When a signal is found, its state is compared (FIG. 7) against the possible sets of criteria and conditions which were specified in the menu by the operator. If a specified signal state appears and matches a satisfied criteria or condition set, that fact is recorded. The signal state is compared with the next set, whether or not it matches a criteria or element in the current set. When a signal state does not satisfy a criteria or condition in any signal set, the test point lines will be scanned for the next test point signal transition on any test point line and the signal sets will be tested again from the beginning. When the end is reached, execution returns to the beginning. This cycling through the process continues until all the sets of criteria and conditions have been successfully compared with the test point signals.

Figure 7:
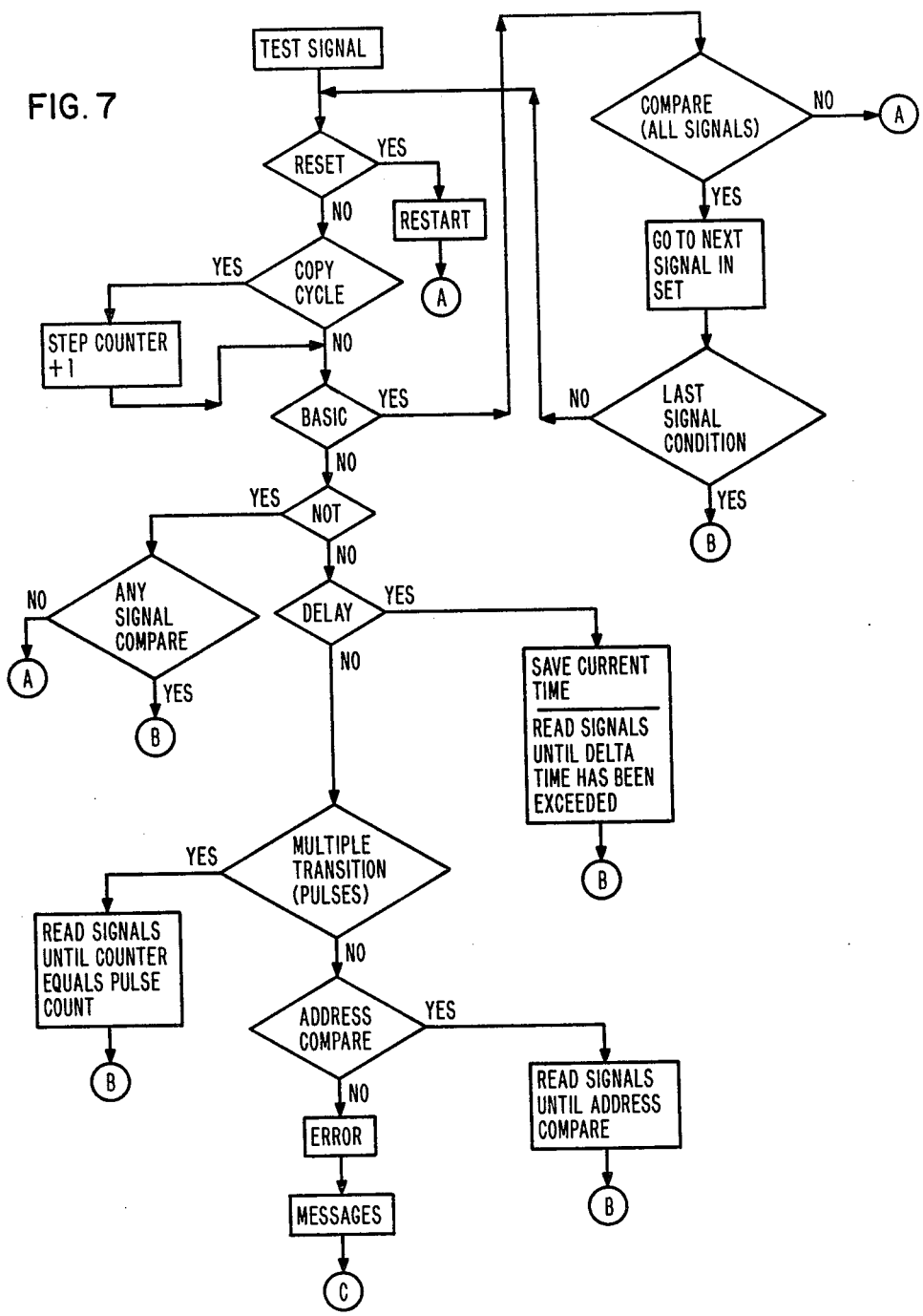

A signal transition initiates in FIG. 7 a comparison of its selected (Active or Deactive) state with the RESET and COPY conditions (if specified) and then, in order, every other selected condition. If a test point signal having a selected state matches criteria in the RESET signal set, execution returns to the start of the program at point A. Assuming that there is no RESET condition, the COPY CYCLE signal set is tested next. When the designated COPY CYCLE signal conditions are found, a counter is incremented and the current time (based on the value of the counter) is stored. The test point signals are then compared against all the selected conditions in turn starting with the BASIC condition and ending with the MULTIPLE TRANSITIONS and ADDRESS COMPARE conditions. If the operator specified a BASIC signal set (FROM, TO, OR, etc.), all of the Active and Deactive signals for all of the elements in that BASIC signal set must be satisfied before the next test point signal is tested. The NOT condition is next if the operator has specified one at this point. When one of the inverted signal levels in the NOT signal set is satisfied, execution moves to the DELAY signal set, if specified. If a DELAY signal set is specified at this point, the delay time put into the menu by the operator must elapse before the next test point signal will be tested. Similarly, in the case of a MULTIPLE TRANSITION signal set, execution will wait for a specified number of transitions of a test point signal at a single test point before the next test point will be tested. If the operator chose an ADDRESS COMPARE signal set, execution will wait for the occurrence of the specified address. When a table of addresses has been specified, execution will wait until one (the first) of the addresses in the table is found. The process ends when the last signal set is satisfied.

Result vector memory locations record the matched signal sets and times elapsed between FROM and TO matches. This data ultimately creates a visual representation of test point signal states as a function of time with the FROM and TO times defining window limits. The times when the FROM and TO conditions are recognized are both also internally recorded. The time differences are calculated and stored continuously in sequential locations of an event time buffer area of memory. If a COPY COUNT set is specified, each count increment is associated with a corresponding time buffer location whether or not a time difference occurred.

Figure 8:
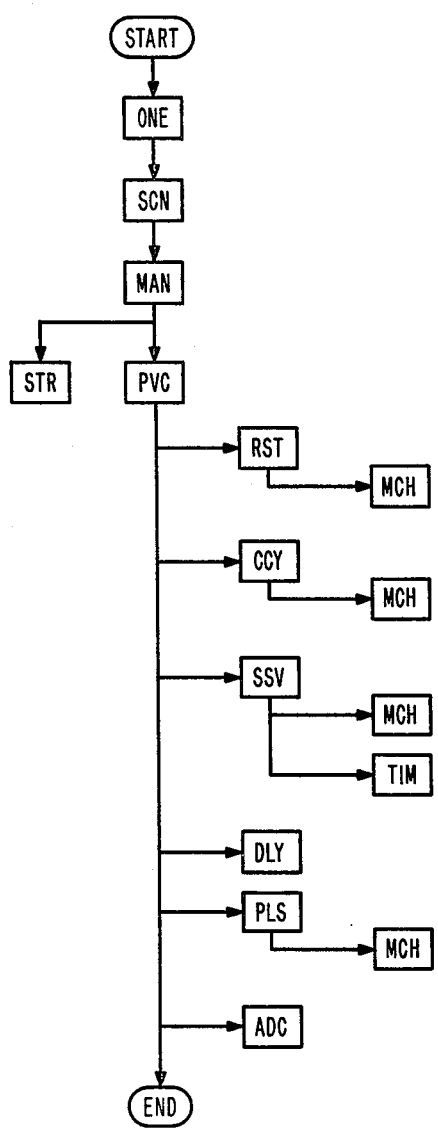
FIG. 8 is a program module diagram showing the order in which a program controls operation of the testing apparatus of FIG. 1.

The program in the Appendix performs the operations in the FIGS. 6 and 7 flow diagrams by executing program modules, including those identified in FIG. 8, in the order shown. The functions of the modules are:

| MODULE MTSDR | FUNCTION PERFORMED |
|---|---|
| ONE | Executes functions specified in the menu. |
| SCN | Scans test points to select signal timing transitions. |
| MAN | Manages data reduction processes and storage. |
| STR | Used by MTSDRMAN to store reduced data. |
| PVC | Used by MTSDRMAN to execute process vectors. It, in turn, uses the modules below. |
| RST | Processes reset signal sets with the aid of MTSDRMCH. |
| CCY | Processes copy cycle signal sets with the aid of MTSDRMCH. |
| SSV | Processes Basic signal sets and not signal sets with the aid of MTSDRMCH and MTSDRTIM. |
| DLY | Processes Delay signal sets. |
| PLS | Processes Multiple Signal Transition signal sets with the aid of MTSDRMCH. |
| ADC | Processes Address Compare signal sets. |
| MCH | Matches levels and values specified in the menu with test point signals. |
| TIM | Calculates result times. |

While the invention has been particularly shown and described with reference to preferred embodiments thereof, it will be understood by those skilled in the art that various changes in form and details may be made therein without departing from the spirit and scope of the invention.

BO981024

List of Modules

MTSDRONE

MTSDRSCN

MTSDRMAN

MTSDRSTR

MTSDRPVC

MTSDRRST

MTSDRCCY

MTSDRSSV

MTSDRDLY

MTSDRPLS

MTSDRADC

MTSDRMCH

MTSDRTIM

```
******************** MTS MODULE PROLOG ****************************  MTS00010
*                                                                    MTS00020
* PROGRAM NAME: MTSDRONE                                              MTS00030
*                                                                    MTS00040
* LEVEL: 01                                                           MTS00050
*                                                                    MTS00060
* FUNCTION: EXECUTE FNCTIONS OF MTSDRONE PANEL, INCLUDING PROCESS     MTS00070
*           DEFINITION, EXECUTION, EDITING.                           MTS00080
*           THIS PROGRAM CONTAINS INDEX POINTERS USED BY              MTS00090
*           MTSDRSTR AND WILL INITIALIZE THESE POINTERS TO THE        MTS00100
*           FIRST RECORD AND FIRST BYTE OF STORE AREA.                MTS00110
*                                                                    MTS00120
* INPUT PARAMETERS:                                                   MTS00130
*           1 - ADDRESS OF SCAN BUFFER1                               MTS00140
*           2 - ADDRESS OF WORK BUFFER2                               MTS00150
*           3 - ADDRESS OF PROCESS DEFINITION BUFFER3                 MTS00160
*           4 - ADDRESS EVENT DESCRIPTOR DATA BUFFER                  MTS00170
*           5 - ADDRESS OF T.C. HEADER RECORD                         MTS00180
*           6 - ADDRESS OF NUMBER OF RECORDS IN T.C. FILE             MTS00190
*           7 - ADDRESS OF RELATIVE RECORD NUMBER OF T.C. HEADER RECORD MTS00200
*           8 - ADDRESS OF PANEL WORK BUFFER                          MTS00210
*           9 - ADDRESS OF TCB FOR SYSTEM RET CODES                   MTS00220
*          10 - ADDRESS OF HALT REPORT PRINT FLAG                     MTS00230
*          11 - DEBUG TRACE FLAG                                      MTS00240
*          12 - ADDRESS OF RETURN CODE AREA                           MTS00250
*                                                                    MTS00260
* OUTPUT PARAMETERS:                                                  MTS00270
*           1 - ADDRESS OF SCAN BUFFER1                               MTS00280
*           2 - ADDRESS OF WORK BUFFER2                               MTS00290
*           3 - ADDRESS OF PROCESS DEFINITION BUFFER3                 MTS00300
*           4 - ADDRESS EVENT DESCRIPTOR DATA BUFFER                  MTS00310
*           5 - ADDRESS OF T.C. HEADER RECORD                         MTS00320
*           6 - ADDRESS OF NUMBER OF RECORDS IN T.C. FILE             MTS00330
*           7 - ADDRESS OF RELATIVE RECORD NUMBER OF T.C. HEADER RECORD MTS00340
*           8 - ADDRESS OF PANEL WORK BUFFER                          MTS00350
*           9 - ADDRESS OF TCB FOR SYSTEM RET CODES                   MTS00360
*          10 - ADDRESS OF HALT REPORT PRINT FLAG                     MTS00370
*          11 - DEBUG TRACE FLAG                                      MTS00380
*          12 - ADDRESS OF RETURN CODE AREA                           MTS00390
*          13 - ADDRESS OF RELATIVE RECORD NO INDEX IN DRESULTS,MTSCTL MTS00400
*          14 - ADDRESS OF SCREEN IOCB                                MTS00410
*          15 - ADDRESS OF SCROLL BUFFER WORK AREA                    MTS00420
*          16 - ADDRESS OF SCROLL BUFFER FLAG                         MTS00430
*          17 - ADDRESS OF SCROLL BUFFER SIZE FLAG                    MTS00440
*          18 - ADDRESS OF FILE COMMAND                               MTS00450
*                                                                    MTS00460
* PROGRAMS LOADED: MTSDRSCN,MTSDRDMS,MTSDRDIS,MTSDRAPL,MTSDRGET        MTS00470
*                  MTSDRFIL,MTSDRPAV,MTSDRPAR,MTSDRPRT,MTSDRADR        MTS00480
*                  MTSDRDMR                                            MTS00490
*                                                                    MTS00500
* PROGRAMS LINKED: MTSDRSTR,MTSETMSG,MTSRDPDS,$IMDEFN,$IMPROT,$IMDATA  MTS00510
*                                                                    MTS00520
* SUBTASKS ATTACHED: NONE                                             MTS00530
*                                                                    MTS00540
* INTERNAL SUBROUTINES: RESTORE                                       MTS00550
*                                                                    MTS00560
* DATA SETS USED: DS1 = CELLOX,MTSCTL TEST CASE DATA SET              MTS00570
*                 DS2 = EVENT TIMER DATA SET                          MTS00580
*                 DS3 = PRODUCT CHAR DATA SET                         MTS00590
*                 DS4 = DRESULTS, MTSCTL                              MTS00600
*                 DS5 = DRPROCES, MTSCTL                              MTS00610
*                                                                    MTS00620
* RETURN CODES:   -1 = GOOD, 1 = DISK I/O ERROR,                      MTS00630
*                  2 = DRESULTS,MTSCTL FULL, 3 = DATA REDUCTION       MTS00640
*                     PROCESSING ERROR, 4 = EVENT TIMER FILE READ     MTS00650
*                     ERROR, 5 = NO DATA IN TEST CELL                 MTS00660
*                                                                    MTS00670
* ERROR EXITS:    ABNORMAL IF LOAD ERROR OCCURS                       MTS00680
*                                                                    MTS00690
*********************************************************************  MTS00700
          ENTRY    MTSDRONE                                            MTS00710
MTSDRONE  PROGRAM  START,DS=(??,??,??,??,??),PARM=12                   MTS00720
          EXTRN    $IMDEFN,$IMPROT,$IMDATA                              MTS00730
```

```
         EXTRN    MTSETMSG,MTSDRSTR                                MTS00740
DRESULT  EQU      DS4                                              MTS00750
         ENTRY    DRESULT           REFERENCE FOR MTSDRSTR         MTS00760
* LINE DELETED: 'ENTRY TCBADDR' *                               /C MTS00770
START    EQU      *                 PROGRAM START                  MTS00780
*************************************************************     MTS00790
*     DEBUG TRACE AT ENTRY TO THIS ROUTINE                    *    MTS00800
*************************************************************     MTS00810
         IF       (DRDEBUG,NE,0),THEN  DEBUG FLAG IS ON             MTS00820
            DEQT                                                   MTS00830
            ENQT  $SYSLOG                                          MTS00840
            PRINTEXT '@MTSDRONE'    THIS MODULE ENTERE MSG         MTS00850
            WAIT  KEY                                              MTS00860
            DEQT                                                   MTS00870
         ENDIF                                                     MTS00880
*************************************************************     MTS00890
*   SETUP AND DISPLAY SINGLE DATA REDUCTION PROCESS FUNCTIONS PANEL * MTS00900
*************************************************************     MTS00910
         MOVE     OPPANADR,PANADDR    ADDRESS OF PANNEL BUFFER     MTS00920
         RESET    LOADWAIT                                         MTS00930
         LOAD     (MTSETOPN,LODLIB),OPENPARM,LOGMSG=NO,  OPEN SCREEN XMTS00940
               EVENT=LOADWAIT,ERROR=LOADERR                        MTS00950
         WAIT     LOADWAIT                                         MTS00960
         IF       (LOADWAIT,NE,-1),THEN        TEST FOR GOOD OPEN  MTS00970
            PRINTEXT '@$IMOPEN ERROR IN MTSDRONE = '               MTS00980
            PRINTNUM LOADWAIT                PRINT ERROR           MTS00990
            PRINTEXT ', DEPRESS "ENTER" TO END'                    MTS01000
            WAIT     KEY            LET OPERATOR READ ERROR MESSAGE MTS01010
            GOTO     ABNORMAL       UNRECOVERABLE ERROR, END PROGRAM MTS01020
         ENDIF  WILL CONTINUE HERE IF ABNORMAL BRANCH IS NOT TAKEN MTS01030
         CALL     $IMDEFN,(ONEIOCB),PANADDR,0,0 GET PANLIB PANEL   MTS01040
         ENQT     ONEIOCB                                          MTS01050
         TERMCTRL BLANK                                            MTS01060
         CALL     $IMPROT,PANADDR,(FTAB)   BUILD PROTECTED AREA    MTS01070
         CALL     $IMDATA,PANADDR          SETUP TO WRITE IN DATA  MTS01080
         MOVE     ENDPANEL,0       SET UP PANEL LOOP TEST FLAG     MTS01090
         DO       WHILE,(ENDPANEL,EQ,0)   REPORT UNTIL USER REQ QUIT MTS01100
            DEQT                                                   MTS01110
            ENQT  ONEIOCB                                          MTS01120
            IF    (FILERET,EQ,0),OR,(PAVRET,EQ,0),THEN POINT TO NAME MTS01130
               PRINTEXT LINE=CMDLINE+6,SPACES=CMDSPACE+6 PT TO NAME AREA MTS01140
            ELSE  POINT TO COMMAND ENTRY                           MTS01150
               PRINTEXT LINE=CMDLINE,SPACES=CMDSPACE PT TO CMD AREA MTS01160
            ENDIF                                                  MTS01170
            TERMCTRL DISPLAY                                       MTS01180
            WAIT     KEY                WAIT FOR USER TO INPUT     MTS01190
            CALL  MTSETMSG,0,(BLNKMSG)  CLEAR MESSAGE AREA         MTS01200
            CALL  MTSETMSG,1,(BLNKMSG)  CLEAR MESSAGE AREA         MTS01210
            CALL  MTSETMSG,2,(BLNKMSG)  CLEAR MESSAGE AREA         MTS01220
            MOVE  INDEX,0              RESET COMMAND INDEX         MTS01230
            GETVALUE INDEX,LINE=CMDLINE,SPACES=CMDSPACE,FORMAT=(2,0,I) MTS01240
*************************************************************     MTS01250
*      BUILD SUBROUTINES PARAMETER LIST - FOR MULTIPLE USES   *    MTS01260
*************************************************************     MTS01270
            MOVE  ETRTCBAD,TCBADDR   ETR TCB ADDR TO MTSDRFIL PARM MTS01280
            MOVE  PAVEDTAD,EDTBUFAD  EDT DATA ADDR TO PAV PARM     MTS01290
            MOVE  ETRTCBA,TCBADDR    ETR TCB ADDR TO MTSDRPAV      MTS01300
            MOVE  PAVBUF3,BUF3ADR    DATA RED WORK BUFR TO MTSDRPAV MTS01310
            MOVE  APLBUF3,BUF3ADR    DATA RED WORK BUFR TO MTSDRAPL MTS01320
            MOVE  ADRBUF3,BUF3ADR    DATA RED WORK BUFR TO MTSDRADR /C MTS01330
            MOVE  APLBUF2,BUF2ADR    2560 BYTE WORK BUFR TO MTSDRAPL /C MTS01340
            MOVE  ADRBUF2,BUF2ADR    2560 BYTE WORK BUFR TO MTSDRADR /C MTS01350
            MOVE  PABUFADR,PANADDR   PANEL WORK BUFFER TO MTSDRDMS MTS01360
            MOVE  PABFFADR,PANADDR   PANEL WORK BUFFER TO MTSDRAPL MTS01370
            MOVE  PANBUF,PANADDR     PANEL WORK BUFFER TO MTSDRADR /C MTS01380
            MOVE  HDRADDR,RECADDR    HEADER REC ADDR TO MTSDRSCN   /C MTS01390
            MOVE  HDRADDR1,RECADDR   HEADER REC ADDR TO MTSDRADR   /C MTS01400
            MOVE  HDRADDR2,RECADDR   HEADER REC ADDR TO MTSDRPAV   /C MTS01410
*************************************************************     MTS01420
*      CASE STATEMENT FOR DATA REDUCTION OPTIONS              *    MTS01430
*************************************************************     MTS01440
            GOTO  (ERR,QUIT,EDIT,SAV,REP,GET,EXEC,DIS,APL,        *MTS01450
                  PRINT,ADRTAB,HELP),INDEX                        /C MTS01460
```

```
***********************************************************************  MTS01470
*      INVALID TEST PARAMETER, POINT TO COMMAND INPUT AREA            *  MTS01480
***********************************************************************  MTS01490
ERR       EQU       *         EXECUTE IF INVALID NUMBER SPECIFIED IN CMD  MTS01500
          ENQT      ONEIOCB        ENQUE ON DATA REDUCTION PANEL           MTS01510
          PRINTEXT  LINE=CMDLINE,SPACES=CMDSPACE  PT TO CMD                MTS01520
          GOTO      ENDCASE                                                MTS01530
***********************************************************************  MTS01540
*   USER HAS REQUESTED QUIT                                           *  MTS01550
***********************************************************************  MTS01560
QUIT      EQU       *         CONTROL HERE FROM CASE STATEMENT ABOVE       MTS01570
          MOVE      ENDPANEL,1     SET FLAG TO END REPORT PROGRAM          MTS01580
          GOTO      ENDCASE        GO TO END OF CASE STATEMENT SECTION     MTS01590
***********************************************************************  MTS01600
*   DEFINE DATA REDUCTION PROCESS                                     *  MTS01610
***********************************************************************  MTS01620
EDIT      EQU       *         CONTROL HERE FROM CASE STATEMENT ABOVE       MTS01630
          MOVE      DMSBUFAD,BUF2ADR  WORK BUF ADDR TO DRDMS PARM          MTS01640
          MOVE      EDTADDR,EDTBUFAD  EDT BUFFER ADDR TO DRDMS PARM        MTS01650
          RESET     LOADWAIT       RESET WAIT FOR PROG TO RUN ECB          MTS01660
          LOAD      (MTSDRDMS,LODLIB),DMSPARM,DS=(DS3,DS1),               *MTS01670
                    EVENT=LOADWAIT,ERROR=LOADERR,LOGMSG=NO                 MTS01680
          WAIT      LOADWAIT                                               MTS01690
          IF        (DMSRET,NE,-1),THEN  ERROR OCCURED                     MTS01700
            CALL    MTSETMSG,0,(MSG4)    PRINT ERROR MESSAGE               MTS01710
            PRINTNUM DMSRET,LINE=1,SPACES=60 PRINT ERROR VALUE             MTS01720
            GOTO    ENDERROR       TAKE ABNORMAL EXIT                      MTS01730
          ENDIF                                                            MTS01740
          MOVE      DMSFLAG,0      SET FLAG TO REUSE JUST DEFINED AREA     MTS01750
          GOTO      ENDCASE                                                MTS01760
***********************************************************************  MTS01770
*   SAVE DATA REDUCTION PROCESS                                       *  MTS01780
***********************************************************************  MTS01790
SAV       EQU       *         CONTROL HERE FROM CASE STATEMENT ABOVE       MTS01800
          MOVE      FILBUFAD,BUF3ADR  DATA RED BUFFER ADDRESS - BUF 3      MTS01810
          MOVE      FILECMD,1      SAVE COMMAND FOR MTSDRFIL               MTS01820
          RESET     LOADWAIT       RESET WAIT FOR PROG TO RUN ECB          MTS01830
          LOAD      (MTSDRPAV,LODLIB),PAVPARM,DS=(DS1),                   *MTS01840
                    EVENT=LOADWAIT,ERROR=LOADERR,LOGMSG=NO                 MTS01850
          WAIT      LOADWAIT       WAIT FOR PROG TO RUN ECB                MTS01860
          IF        (PAVRET,EQ,-1),THEN  PANEL DATA VERIFY OK              MTS01870
            RESET   LOADWAIT       RESET WAIT FOR PROG TO RUN ECB          MTS01880
            LOAD    (MTSDRFIL,LODLIB),FILPARM,DS=(DS5),                   *MTS01890
                    EVENT=LOADWAIT,ERROR=LOADERR,LOGMSG=NO                 MTS01900
            WAIT    LOADWAIT       WAIT FOR PROG TO RUN ECB                MTS01910
          ENDIF                                                            MTS01920
          MOVE      DMSFLAG,0      SET FLAT TO REUSE SCROLL AREA           MTS01930
          GOTO      ENDCASE                                                MTS01940
***********************************************************************  MTS01950
*   REPLACE DATA REDUCTION PROCESS                                    *  MTS01960
***********************************************************************  MTS01970
REP       EQU       *         CONTROL HERE FROM CASE STATEMENT ABOVE       MTS01980
          MOVE      FILBUFAD,BUF3ADR  DATA RED BUFFER ADDRESS - BUF 3      MTS01990
          MOVE      FILECMD,2      REPLACE COMMAND FOR MTSDRFIL            MTS02000
          RESET     LOADWAIT       RESET WAIT FOR PROG TO RUN ECB          MTS02010
          LOAD      (MTSDRPAV,LODLIB),PAVPARM,DS=(DS1),                   *MTS02020
                    EVENT=LOADWAIT,ERROR=LOADERR,LOGMSG=NO                 MTS02030
          WAIT      LOADWAIT       WAIT FOR PROG TO RUN ECB                MTS02040
          IF        (PAVRET,EQ,-1),THEN  PANEL DATA VERIFY OK              MTS02050
            RESET   LOADWAIT       RESET WAIT FOR PROG TO RUN ECB          MTS02060
            LOAD    (MTSDRFIL,LODLIB),FILPARM,DS=(DS5),                   *MTS02070
                    EVENT=LOADWAIT,ERROR=LOADERR,LOGMSG=NO                 MTS02080
            WAIT    LOADWAIT       WAIT FOR PROG TO RUN ECB                MTS02090
          ENDIF                                                            MTS02100
          MOVE      DMSFLAG,0      SET FLAG TO REUSE SCROLL AREA           MTS02110
          GOTO      ENDCASE                                                MTS02120
***********************************************************************  MTS02130
*   GET DATA REDUCTION PROCESS                                        *  MTS02140
***********************************************************************  MTS02150
GET       EQU       *         CONTROL HERE FROM CASE STATEMENT ABOVE       MTS02160
          MOVE      FILBUFAD,BUF3ADR  DATA RED BUFFER ADDRESS - BUF 3      MTS02170
          RESET     LOADWAIT       RESET WAIT FOR PROG TO RUN ECB          MTS02180
          LOAD      (MTSDRGET,LODLIB),FILPARM,DS=(DS5),                   *MTS02190
```

```
             EVENT=LOADWAIT,ERROR=LOADERR,LOGMSG=NO             MTS02200
     WAIT    LOADWAIT        WAIT FOR PROG TO RUN ECB           MTS02210
     IF      (FILERET,NE,-1),THEN ERROR DETECTED IN MTSDRGET     MTS02220
       MOVE  DMSFLAG,1 SET FLAG TO BUILD NEW SCROLL AREA         MTS02230
     ELSE                                                        MTS02240
       MOVE  DMSBUFAD,BUF2ADR  WORK BUF ADDR TO DRDMS PARM       MTS02250
       MOVE  EDTADDR,EDTBUFAD  EDT BUFFER ADDR TO DRDMS PARM     MTS02260
       RESET LOADWAIT    RESET WAIT FOR PROG TO RUN ECB          MTS02270
       LOAD  (MTSDRDMR,LODLIB),DMSPARM,DS=(DS3,DS1),            *MTS02280
             EVENT=LOADWAIT,ERROR=LOADERR,LOGMSG=NO              MTS02290
       WAIT  LOADWAIT                                            MTS02300
       IF    (DMSRET,NE,-1),THEN ERROR OCCURED                   MTS02310
         CALL  MTSETMSG,0,(MSG5)    PRINT ERROR MESSAGE          MTS02320
         PRINTNUM DMSRET,LINE=1,SPACES=60 PRINT ERROR VALUE      MTS02330
         GOTO  ENDERROR    TAKE ABNORMAL EXIT                    MTS02340
       ENDIF                                                     MTS02350
       RESET LOADWAIT   RESET WAIT FOR PROG TO RUN ECB           MTS02360
       LOAD  (MTSDRPAR,LODLIB),PAVPARM,DS=(DS1),                *MTS02370
             EVENT=LOADWAIT,ERROR=LOADERR,LOGMSG=NO              MTS02380
       WAIT  LOADWAIT   WAIT FOR PROG TO RUN ECB                 MTS02390
       IF    (PAVRET,EQ,-1),THEN  PANEL DATA VERIFY OK           MTS02400
         MOVE  DMSFLAG,0 SET FLAG TO USE OLD SCROLL AREA         MTS02410
       ELSE                                                      MTS02420
         MOVE  DMSFLAG,1 SET FLAG TO BUILD NEW SCROLL AREA       MTS02430
       ENDIF                                                     MTS02440
     ENDIF                                                       MTS02450
     GOTO     ENDCASE                                            MTS02460
************************************************************** MTS02470
* EXECUTE DATA REDUCTION PROCESS                              * MTS02480
************************************************************** MTS02490
EXEC EQU     *          CONTROL HERE FROM CASE STATEMENT ABOVE MTS02500
     RESET   LOADWAIT    RESET WAIT FOR PROG TO RUN ECB         MTS02510
     LOAD    (MTSDRPAV,LODLIB),PAVPARM,DS=(DS1),               *MTS02520
             EVENT=LOADWAIT,ERROR=LOADERR,LOGMSG=NO             MTS02530
     WAIT    LOADWAIT   WAIT FOR PROG TO RUN ECB                MTS02540
     IF      (PAVRET,EQ,-1),THEN  PANEL DATA VERIFY OK          MTS02550
*      INITIALIZE TEMP DATA RESULT STORAGE AREA TO DW-1'S       MTS02560
       MOVE  STORECMD,1 SET COMMAND TO INIT BUFFER 2            MTS02570
       MOVE  STRBUFAD,BUF2ADR WORK BUFFER ADDR TO MTSDRSTR      MTS02580
       CALL  MTSDRSTR,(STRPARM)  INITIALIZE BUFFER 2            MTS02590
       IF    (STRRET,NE,-1),THEN  ERROR IN MTSDRSTR             MTS02600
         MOVE  MSG1,STRNAME,(8,BYTES) MTSDRSTR TO ERROR MSG     MTS02610
         MOVE  ERRNUM,STRRET  RET CODE TO MESSAGE AREA          MTS02620
         GOTO  RETERR  GO TO ERROR HANDLING                     MTS02630
       ENDIF                                                    MTS02640
*      BUILD PARM LIST FOR MTSDRSCN                             MTS02650
       MOVE  EDTBFADR,EDTBUFAD EDT BUFFER ADDR TO MTSDRSCN      MTS02660
       MOVE  BUF1ADDR,BUF1ADR SCAN BUFFER ADDR TO MTSDRSCN      MTS02670
       MOVE  BUF2ADDR,BUF2ADR WORK BUFFER ADDR TO MTSDRSCN      MTS02680
       MOVE  BUF3ADDR,BUF3ADR DATA RED WORK BUFR TO MTSDRSCN    MTS02690
       MOVE  PRTFGAD,PRTFGADR CANCEL PRINT TEST FLAG-MTSDRSCN   MTS02700
       MOVE  NUMRECA,NUMRECAD # OF RECS IN T.C. TO MTSDRSCN     MTS02710
       MOVE  RECNOAD,RECNOADR REL REC # OF T.C. TO MTSDRSCN     MTS02720
       MOVE  SCNBUG,DRDEBUG TRACE FLAG TO MTSDRSCN PARM         MTS02730
*      SCAN TEST DATA AND PLACE DATA RED. RESULTS INTO DRESULTS MTS02740
       RESET LOADWAIT    RESET WAIT FOR PROG TO RUN ECB         MTS02750
       LOAD  (MTSDRSCN,LODLIB),SCNPARM,DS=(DS2,DS3,DS4),       *MTS02760
             EVENT=LOADWAIT,ERROR=LOADERR,LOGMSG=NO             MTS02770
       WAIT  LOADWAIT   WAIT FOR PROG TO RUN ECB                MTS02780
       IF    (SCANRET,NE,-1),THEN ERROR IN MTSDRSCN             MTS02790
         MOVE MSG1,SCANNAME,(8,BYTES) MTSDRSCN TO ERROR MSG     MTS02800
         MOVE ERRNUM,SCANRET  RET CODE TO MESSAGE AREA          MTS02810
         GOTO RETERR  GO TO ERROR HANDLING                      MTS02820
       ENDIF                                                    MTS02830
     ENDIF                                                      MTS02840
     CALL    RESTORE    RESTORE THE SCREEN                      MTS02850
     MOVE    DMSFLAG,0 SET FLAG TO USE OLD SCROLL AREA          MTS02860
     GOTO    ENDCASE                                            MTS02870
************************************************************** MTS02880
* DISPLAY RESULTS OF DATA REDUCTION                           * MTS02890
************************************************************** MTS02900
DIS  EQU     *          CONTROL HERE FROM CASE STATEMENT ABOVE MTS02910
```

```
              MOVE     DISPRINT,PRTFGADR    ADDRESS OF PRINT FLAG            MTS02920
              MOVE     HEADADDR,RECADDR HEADER REC ADDR TO MTSDRDIS           MTS02930
              RESET    LOADWAIT    RESET WAIT FOR PROG TO RUN ECB            MTS02940
              LOAD     (MTSDRDIS,LODLIB),DISPARM,DS=(DS4),                   *MTS02950
                  EVENT=LOADWAIT,ERROR=LOADERR,LOGMSG=NO                      MTS02960
              WAIT     LOADWAIT    WAIT FOR PROG TO RUN ECB                   MTS02970
              CALL     RESTORE          RESTORE PANEL                         MTS02980
              GOTO     ENDCASE                                                MTS02990
************************************************************************     MTS03000
*  SEND DATA REDUCTION RESULTS TO APL                                    *    MTS03010
************************************************************************     MTS03020
APL           EQU      *                                                      MTS03030
              RESET    LOADWAIT    RESET WAIT FOR PROG TO RUN ECB             MTS03040
              LOAD     (MTSDRAPL,LODLIB),APLPARM,DS=(DS4),                   *MTS03050
                  EVENT=LOADWAIT,ERROR=LOADERR,LOGMSG=NO                      MTS03060
              WAIT     LOADWAIT    WAIT FOR PROG TO RUN ECB                   MTS03070
              IF       (PAVRET,NE,-1),THEN ERROR IN MTSDRAPL                  MTS03080
                 CALL RESTORE              RESTORE THE PANEL                  MTS03090
                 MOVE  MSG1,APLNAME,(8,BYTES) MTSDRAPL TO ERROR MSG            MTS03100
                 MOVE  ERRNUM,PAVRET  RET CODE TO MESSAGE AREA                 MTS03110
                 GOTO  RETERR  GO TO ERROR HANDLING                           MTS03120
              ENDIF                                                           MTS03130
              CALL     RESTORE             RESTORE THE PANEL                  MTS03140
              GOTO     ENDCASE                                                MTS03150
************************************************************************ /C  MTS03160
*  PRINT RESULTS OF DATA REDUCTION                                      * /C  MTS03170
************************************************************************ /C  MTS03180
PRINT         EQU      *    CONTROL HERE FROM CASE STATEMENT ABOVE        /C  MTS03190
              MOVE     PRINTFLG,PRTFGADR  ADDRESS OF PRINT FLAG            /C  MTS03200
              MOVE     HDRRECAD,RECADDR   HEADER REC ADDR TO MTSDRPRT      /C  MTS03210
              RESET    LOADWAIT           RESET WAIT FOR PROG TO RUN ECB   /C  MTS03220
              LOAD     (MTSDRPRT,LODLIB),PRTPARM,DS=(DS4),                *MTS03230
                  EVENT=LOADWAIT,ERROR=LOADERR,LOGMSG=NO                   /C  MTS03240
              WAIT     LOADWAIT    WAIT FOR PROG TO RUN ECB                /C  MTS03250
              CALL     RESTORE        RESTORE PANEL                        /C  MTS03260
              GOTO     ENDCASE                                             /C  MTS03270
************************************************************************ /C  MTS03280
*  ADDRESS COMPARE TABLE OPERATIONS                                     * /C  MTS03290
************************************************************************ /C  MTS03300
ADRTAB        EQU      *    CONTROL HERE FROM CASE STATEMENT ABOVE        /C  MTS03310
              RESET    LOADWAIT    RESET WAIT FOR PROGRAM TO RUN ECB       /C  MTS03320
              LOAD     (MTSDRADR,LODLIB),ADRPARM,EVENT=LOADWAIT,          *MTS03330
                  ERROR=LOADERR,LOGMSG=NO                                  /C  MTS03340
              WAIT     LOADWAIT    WAIT FOR PROG TO RUN ECB                /C  MTS03350
              CALL     RESTORE       RESTORE THE PANEL                    /C  MTS03360
              IF       (ADRRET,NE,-1),THEN    ERROR IN MTSDRADR            /C  MTS03370
                 MOVE  MSG1,ADRNAME,(8,BYTES)  MTSDRADR TO ERROR MSG       /C  MTS03380
                 MOVE  ERRNUM,ADRRET  RET CODE TO MESSAGE AREA             /C  MTS03390
                 GOTO  RETERR         GO TO ERROR HANDLING                 /C  MTS03400
              ENDIF                                                        /C  MTS03410
              GOTO     ENDCASE                                             /C  MTS03420
************************************************************************     MTS03430
*  HELP                                                                  *    MTS03440
************************************************************************     MTS03450
HELP          EQU      *    CONTROL HERE FROM CASE STATEMENT ABOVE             MTS03460
              GOTO     ENDCASE                                                 MTS03470
************************************************************************     MTS03480
*  CASE STATEMENT END                                                    *    MTS03490
************************************************************************     MTS03500
ENDCASE       EQU      *           RETURN POINT FROM CASE SECTIONS             MTS03510
              ENDDO    END OF THIS PANELS USAGE                                MTS03520
              MOVE     #1,RETCODAD POINT TO CALLER RET CODE TEST AREA          MTS03530
              MOVE     (0,#1),-1   SET GOOD RET CODE                           MTS03540
ABNORMAL      EQU      *           ENTRY POINT FOR ABNORMAL EXIT               MTS03550
              PROGSTOP LOGMSG=NO                                               MTS03560
************************************************************************     MTS03570
*  ENTRY POINT FOR ERROR RETURN CODE                                     *    MTS03580
************************************************************************     MTS03590
RETERR        EQU      *                                                      MTS03600
              DEQT                                                             MTS03610
              ENQT     ONEIOCB            ENQUEUE ON DATA REDUCTION PANEL      MTS03620
              CALL     MTSETMSG,0,(MSG1)  DISPLAY ERROR MESSAGE                MTS03630
```

```
            PRINTNUM ERRNUM,LINE=1,SPACES=70                         MTS03640
                 IF    (SCANRET,EQ,4),THEN  TEST FOR EVENT TIMER ERR /C1 MTS03650
                   CALL  MTSETMSG,2,(MSG6)                          /C1 MTS03660
                 ENDIF                                              /C1 MTS03670
                 IF    (SCANRET,EQ,5),THEN  TEST FOR EMPTY TEST CELL /C1 MTS03680
                   CALL  MTSETMSG,2,(MSG7)                          /C1 MTS03690
                 ENDIF                                              /C1 MTS03700
            WAIT     KEY                ALLOW USER TO READ MESSAGE   MTS03710
            MOVE     #1,RETCODAD POINT TO CALLER RET CODE TEST AREA  MTS03720
            MOVE     (0,#1),1   SET BAD RET CODE                     MTS03730
            GOTO     ABNORMAL           TAKE ABNORMAL EXIT            MTS03740
*********************************************************************  MTS03750
*   ENTRY POINT FOR PROGRAM LOAD ERROR                              *  MTS03760
*********************************************************************  MTS03770
LOADERR  EQU     *                                                    MTS03780
         DEQT                                                         MTS03790
         ENQT    ONEIOCB          ENQUEUE ON DATA REDUCTION PANEL     MTS03800
         CALL    MTSETMSG,0,(MSG3)  DISPLAY LOAD ERROR MESSAGE        MTS03810
         PRINTNUM LOADWAIT,LINE=1,SPACES=60  PRINT ERROR VALUE        MTS03820
ENDERROR CALL    MTSETMSG,2,(MSG2)  DISPLAY ENTER TO END PROG         MTS03830
         WAIT    KEY              ALLOW USER TO READ MESSAGE          MTS03840
         MOVE    #1,RETCODAD POINT TO CALLER RET CODE TEST AREA       MTS03850
         MOVE    (0,#1),1    SET BAD RET CODE                         MTS03860
         GOTO    ABNORMAL           TAKE ABNORMAL EXIT                MTS03870
*********************************************************************  MTS03880
*   PANEL RESTORE ROUTINE                                           *  MTS03890
*********************************************************************  MTS03900
         SUBROUT RESTORE                                              MTS03910
         MOVE    OPPANADR,PANADDR    ADDRESS OF PANNEL BUFFER         MTS03920
         RESET   LOADWAIT                                             MTS03930
         LOAD    (MTSETOPN,LODLIB),OPENPARM,LOGMSG=NO,   OPEN SCREEN XMTS03940
              EVENT=LOADWAIT,ERROR=LOADERR                            MTS03950
                                                                      MTS03960
         WAIT    LOADWAIT                                             MTS03970
         CALL    $IMDEFN,(ONEIOCB),PANADDR,0,0 GET PANLIB PANEL       MTS03970
         ENQT    ONEIOCB                                              MTS03980
         TERMCTRL BLANK                                               MTS03990
         CALL    $IMPROT,PANADDR,(FTAB)   BUILD PROTECTED AREA        MTS04000
         CALL    $IMDATA,PANADDR         SETUP TO WRITE IN DATA       MTS04010
         TERMCTRL DISPLAY                                             MTS04020
         RESET   LOADWAIT                                             MTS04030
         LOAD    (MTSDRPAR,LODLIB),PAVPARM,DS=(DS1),                *MTS04040
              EVENT=LOADWAIT,ERROR=LOADERR,LOGMSG=NO                  MTS04050
         WAIT    LOADWAIT    WAIT FOR PROG TO RUN ECB                 MTS04060
         IF      (PAVRET,EQ,-1),THEN  PANEL DATA VERIFY OK            MTS04070
            MOVE    DMSFLAG,0  SET FLAG TO USE OLD SCROLL AREA        MTS04080
         ELSE                                                         MTS04090
            MOVE    DMSFLAG,1  SET FLAG TO BUILD NEW SCROLL AREA      MTS04100
         ENDIF                                                        MTS04110
         RETURN                                                       MTS04120
*********************************************************************  MTS04130
*   DATA CONSTANTS AREA                                             *  MTS04140
*********************************************************************  MTS04150
INDEX    DATA    F'0'     COMMAND NUMBER FROM PANEL, CASE BRANCH VALUE MTS04160
ENDPANEL DATA    F'0'     REPORT PANEL END TEST FLAG 1=END             MTS04170
ERRNUM   DATA    F'0'     RETURN CODE VALUE TO BE PRINTED AS ERROR MSG MTS04180
PAVRET   DATA    F'-1'    RETURN CODE AREA FOR MTSDRPAV                MTS04190
SCANRET  DATA    F'0'     RETURN CODE AREA FOR MTSDRSCN                MTS04200
FILERET  DATA    F'-1'    RETURN CODE AREA FOR MTSDRFIL                MTS04210
DMSRET   DATA    F'0'     RETURN CODE AREA FOR MTSDRDMS                MTS04220
STRRET   DATA    F'0'     RETURN CODE AREA FOR MTSDRSTR                MTS04230
DISRET   DATA    F'0'     RETURN CODE AREA FOR MTSDRDIS                MTS04240
ADRRET   DATA    F'0'     RETURN CODE AREA FOR MTSDRADR             /C MTS04250
DMSIZE   DATA    F'0'     SAVE AREA FOR MTSDRDMS TO SAVE SCROLL AREA SIZE MTS04260
RESRECNO DATA    F'0'     REL REC # INDEX POINTER INTO DRESULTS FOR DRMAN MTS04270
SCRNAME  TEXT    'MTSDRONE,PANLIB' LOCATION OF REPORT OPTION PANEL DATA MTS04280
STRNAME  TEXT    'MTSDRSTR'   NAME TO BE PRINTED IF RETURN CODE ERROR  MTS04290
GETNAME  TEXT    'MTSDRGET'   NAME TO BE PRINTED IF RETURN CODE ERROR  MTS04300
SCANNAME TEXT    'MTSDRSCN'   NAME TO BE PRINTED IF RETURN CODE ERROR  MTS04310
APLNAME  TEXT    'MTSDRAPL'   NAME TO BE PRINTED IF RETURN CODE ERROR  MTS04320
ADRNAME  TEXT    'MTSDRADR'   NAME TO BE PRINTED IF RETURN CODE ERROR /C MTS04330
ONEIOCB  IOCB    SCREEN=STATIC,TOPM=0,BOTM=11  REPORT OPTION PANEL IOCB MTS04340
LOADWAIT ECB     -1           WAIT FOR PROGRAM TO RUN ECB              MTS04350
FTAB     BUFFER  256,BYTES    USE EQUATE TABLE FOR FIELD TABLE OFFSETS MTS04360
```

```
***************************************************************** MTS04370
*    FTAB EQUATES - FIELD TABLE FOR DATA REDUCTION EQUATES      * MTS04380
***************************************************************** MTS04390
CMDLINE   EQU      FTAB+0         LINE NUMBER OF COMMAND INPUT FIELD    MTS04400
CMDSPACE  EQU      FTAB+2         SPACE NUMBER OF COMMAND INPUT FIELD   MTS04410
***************************************************************** MTS04420
*    MESSAGES                                                    * MTS04430
***************************************************************** MTS04440
MSG1      TEXT     'XXXXXXX RETURN CODE ='  RET CODE ERROR MESSAGE      MTS04450
MSG2      TEXT     '"ENTER" TO END PROGRAM'                             MTS04460
MSG3      TEXT     'LOAD ERROR IN MTSDRONE'                             MTS04470
MSG4      TEXT     'MTSDRDMS ERROR CODE ='                              MTS04480
MSG5      TEXT     'MTSDRDMR ERROR CODE ='                              MTS04490
MSG6      TEXT     'EVENT TIMER FILE READ ERR'  MTSDRSCN COMMENT MSG /C1 MTS04500
MSG7      TEXT     'NO DATA IN TEST CELL'       MTSDRSCN COMMENT MSG /C1 MTS04510
BLNKMSG   TEXT     '                        '                           MTS04520
***************************************************************** MTS04530
*    MTSETOPN PARAMETER LIST                                     * MTS04540
***************************************************************** MTS04550
OPENPARM  EQU      *                                                    MTS04560
          DATA     A(SCRNAME)     ADDRESS OF SCREEN NAME                MTS04570
OPPANADR  DATA     F'0'           PANEL BUFFER ADDRESS                  MTS04580
***************************************************************** MTS04590
*    PARAMETER LIST READ IN FROM MTSETDR                         * MTS04600
***************************************************************** MTS04610
BUF1ADR   EQU      $PARM1         ADDRESS OF 2560 BYTE SCAN BUFFER1     MTS04620
BUF2ADR   EQU      $PARM2         ADDRESS OF 2560 BYTE WORK BUFFER2     MTS04630
BUF3ADR   EQU      $PARM3         ADDRESS PROCESS DEFINITION WORK BUFFER3 MTS04640
EDTBUFAD  EQU      $PARM4         ADDRESS OF EVENT DESCRIPTOR DATA BUFFER MTS04650
RECADDR   EQU      $PARM5         ADDR OF OF T.C. HEADER RECORD         MTS04660
NUMRECAD  EQU      $PARM6         ADDR OF NUMBER OF RECORDS IN T.C. DATA MTS04670
RECNOADR  EQU      $PARM7         ADDR OF REL RECORD OF T.C. TO REPORT ON MTS04680
PANADDR   EQU      $PARM8         ADDRESS OF DISPALY PANEL WORK BUFFER  MTS04690
TCBADDR   EQU      $PARM9         ADDRESS OF TCB AREA TO TEST RETURN CODES MTS04700
PRTFGADR  EQU      $PARM10        ADDRESS OF PRT FLAG 0=STOP REPORT,1=PRT ON MTS04710
DRDEBUG   EQU      $PARM11        TRACE FLAG 0=NO TRACE,1=STOP AT ENTRY MTS04720
RETCODAD  EQU      $PARM12        ADDRESS OF RETURN CODE AREA           MTS04730
***************************************************************** MTS04740
*    PARAMETER LIST SENT TO MTSDRSCN                             * MTS04750
***************************************************************** MTS04760
SCNPARM   EQU      *              PARAMETER LIST POINTER                MTS04770
BUF1ADDR  DATA     F'0'           ADDRESS OF 2560 BYTE SCAN BUFFER1     MTS04780
BUF2ADDR  DATA     F'0'           ADDRESS OF 2560 BYTE WORK BUFFER2     MTS04790
BUF3ADDR  DATA     F'0'           ADDRESS OF PROCESS DEFINITION BUFFER3 MTS04800
EDTBFADR  DATA     F'0'           ADDR OF EVENT DESCRIPTOR DATA BUFFER  MTS04810
HDRADDR   DATA     F'0'           ADDRESS OF T.C. HEADER RECORD         MTS04820
NUMRECA   DATA     F'0'           ADDR OF NUMBER OF RECORDS IN T.C. DATA MTS04830
RECNOAD   DATA     F'0'           ADDR OF REL RECORD OF T.C. TO REPORT ON MTS04840
          DATA     A(RESRECNO)    ADR REL REC NO INDEX IN DRESULTS, MTSCTL MTS04850
          DATA     A(ONEIOCB)     ADDR OF SCREEN IOCB                   MTS04860
PRTFGAD   DATA     F'0'           ADDRESS OF PRINT FLAG 0=STOP,1=PRT ON MTS04870
SCNBUG    DATA     F'0'           TRACE FLAG 0=NO TRACE, 1=STOP AT ENTRY MTS04880
          DATA     A(SCANRET)     ADDRESS OF CALLER RETURN CODE AREA    MTS04890
***************************************************************** MTS04900
*    PARAMETER LIST SENT TO MTSDRAPL                             * MTS04910
***************************************************************** MTS04920
APLPARM   EQU      *              START OF PARM LIST                    MTS04930
PABFFADR  DATA     F'0'           ADDRESS OF PANEL BUFFER WORK AREA     MTS04940
APLBUF3   DATA     F'0'           ADDRESS OF PROCESS DEFINITION BUFFER3 MTS04950
APLBUF2   DATA     F'0'           ADDRESS OF 2560 BYTE WORK BUFFER      MTS04960
          DATA     A(DRDEBUG)     ADDRESS OF TRACE FLAG 0=NO TRACE,1=TRACE MTS04970
          DATA     A(PAVRET)      ADDRESS OF RETURN CODE RESULTS        MTS04980
***************************************************************** MTS04990
*    PARAMETER LIST SENT TO MTSDRDMS/MTSDRDMR                    * MTS05000
***************************************************************** MTS05010
DMSPARM   EQU      *              START OF PARM LIST                    MTS05020
PABUFADR  DATA     F'0'           ADDRESS OF PANEL BUFFER WORK AREA     MTS05030
EDTADDR   DATA     F'0'           ADDRESS OF EVENT DESCRIPTOR DATA      MTS05040
DMSBUFAD  DATA     F'0'           ADDRESS OF SCROLL BUFFER WORK AREA    MTS05050
DMSFLAG   DATA     F'1'           1=BUILD NEW SCROLL AREA,0=USE OLD SCROLL MTS05060
          DATA     A(DRDEBUG)     ADDR OF TRACE FLAG 0=NO TRACE,1=TRACE ON MTS05070
          DATA     A(DMSIZE)      AREA FOR DMS TO SAVE OLD SCROLL AREA SIZE MTS05080
          DATA     A(DMSRET)      ADDR TO PLACE RET CODE                MTS05090
```

```
***********************************************************************  MTS05100
*    PARAMETER LIST SENT TO MTSDRFIL  AND MTSDRGET                    *  MTS05110
***********************************************************************  MTS05120
FILPARM  EQU     *              START OF PARM LIST                       MTS05130
FILECMD  DATA    F'0'           SAVE=1, REPLACE=2                        MTS05140
         DATA    A(ONEIOCB)     ADDRESS OF SCREEN IOCB                   MTS05150
FILBUFAD DATA    F'0'           ADDRESS OF PROCESS DEFINITION BUFFER3    MTS05160
         DATA    A(FTAB)        ADDRESS OF SCREEN DATA OFFSETS           MTS05170
ETRTCBAD DATA    F'0'           TCB ADDRESS FOR SYS RET CODES            MTS05180
         DATA    A(DRDEBUG)     ADDRESS OF TRACE FLAG 0=NO TRACE,1=TRACE MTS05190
         DATA    A(FILERET)     ADDRESS TO PLACE RET CODE                MTS05200
***********************************************************************  MTS05210
*    PARAMETER LIST SENT TO MTSDRPAV AND MTSDRPAR                     *  MTS05220
***********************************************************************  MTS05230
PAVPARM  EQU     *              START OF PARM LIST                       MTS05240
         DATA    A(ONEIOCB)     ADDRESS OF SCREEN IOCB                   MTS05250
PAVBUF3  DATA    F'0'           ADDRESS OF PROCESS DEFINITIN BUFFER3     MTS05260
PAVEDTAD DATA    F'0'           ADDRESS OF EVENT DESCRIPTOR TABLE DATA   MTS05270
         DATA    A(FTAB)        ADDRESS OF SCREEN DATA OFFSETS           MTS05280
ETRTCBA  DATA    F'0'           MTSETR TCB ADDRESS FOR SYS RET CODES     MTS05290
         DATA    A(DRDEBUG)     ADDRESS OF TRACE FLAG 0=NO TRACE,1=TRACE MTS05300
HDRADDR2 DATA    F'0'           ADDRESS OF TEST CASE HEADER RECORD   /C  MTS05310
         DATA    A(PAVRET)      ADDRESS FOR RETURN CODE RESULTS          MTS05320
***********************************************************************  MTS05330
*    PARAMETER LIST SENT TO MTSDRDIS                                  *  MTS05340
***********************************************************************  MTS05350
DISPARM  EQU     *              START OF PARM LIST                       MTS05360
         DATA    A(ONEIOCB)     ADDR OF SCREEN IOCB                      MTS05370
         DATA    A(FTAB)        ADDRESS OF SCREEN DATA OFFSETS           MTS05380
DISPRINT DATA    F'0'           ADDRESS OF HALT REPORT PRINT FLAG        MTS05390
HEADADDR DATA    F'0'           ADDRESS OF T.C. HEADER RECORD            MTS05400
         DATA    A(DRDEBUG)     ADDRESS OF TRACE FLAG 0=NO TRACE,1=TRACE MTS05410
         DATA    A(DISRET)      ADDRESS FOR RETURN CODE RESULTS          MTS05420
***********************************************************************  MTS05430
*    PARAMETER LIST SENT TO MTSDRPRT                                  *  MTS05440
***********************************************************************  MTS05450
PRTPARM  EQU     *              START OF PARM LIST                       MTS05460
         DATA    A(ONEIOCB)     ADDR OF SCREEN IOCB                      MTS05470
         DATA    A(FTAB)        ADDRESS OF SCREEN DATA OFFSETS           MTS05480
PRINTFLG DATA    F'0'           ADDRESS OF HALT REPORT PRINT FLAG        MTS05490
HDRRECAD DATA    F'0'           ADDRESS OF T.C. HEADER RECORD            MTS05500
         DATA    A(DRDEBUG)     ADDRESS OF TRACE FLAG 0=NO TRACE,1=TRACE MTS05510
         DATA    A(DISRET)      ADDRESS FOR RETURN CODE RESULTS          MTS05520
***********************************************************************  MTS05530
*    PARAMETER LIST SENT TO MTSDRSTR                                  *  MTS05540
***********************************************************************  MTS05550
STRPARM  EQU     *              START OF PARM LIST                       MTS05560
STORECMD DATA    F'0'           STORE COMMAND 1=INIT BUFFER              MTS05570
         DATA    A(RESRECNO)    ADDR OF DRESULTS REL REC NUMBER          MTS05580
STRBUFAD DATA    F'0'           ADDRESS OF WORK BUFFER2                  MTS05590
         DATA    F'0'           ADDRESS OF DATA STORE AREA      NOT USED MTS05600
         DATA    F'0'           ADDR OF NO DATA ELS TO BE STORED NOT USED MTS05610
         DATA    F'0'           ADDR OF COPY CYCLE COUNTER      NOT USED MTS05620
         DATA    F'0'           ADDR OF TIME VALUE TO BE STORED NOT USED MTS05630
         DATA    F'0'           ADDRESS OF COPY CYCLE ERROR FLAG NOT USED MTS05640
         DATA    A(STRRET)      ADDRESS TO PLACE RETURN CODE             MTS05650
*********************************************************************/C  MTS05660
*    PARAMETER LIST SENT TO MTSDRADR                                */C  MTS05670
*********************************************************************/C  MTS05680
                                                                    /C   MTS05690
ADRPARM  EQU     *                                                  /C   MTS05700
PANBUF   DATA    F'0'           ADDRESS OF PANEL BUFFER WORK AREA   /C   MTS05710
ADRBUF2  DATA    F'0'           ADDRESS OF WORK BUFFER2             /C   MTS05720
ADRBUF3  DATA    F'0'           ADDRESS OF PROCESS DEFINITION BUFFER3 /C MTS05730
         DATA    A(DRDEBUG)     ADDR OF TRACE FLAG 0=NO TRACE,1=TRACE /C MTS05740
HDRADDR1 DATA    F'0'           ADDRESS OF T.C. HEADER RECORD       /C   MTS05750
         DATA    A(ADRRET)      ADDRESS OF RETURN CODE AREA              MTS05760
         ENDPROG                                                         MTS05770
         END
```

```
*************** MTS MODULE PROLOG *******************************  MTS00010
*                                                                  MTS00020
* PROGRAM NAME: MTSDRSCN                                           MTS00030
*                                                                  MTS00040
* LEVEL: 01                                                        MTS00050
*                                                                  MTS00060
* FUNCTION: (1)BUILD A GROUP SELECTION/DESELECTION TABLE AND A PROCESS  MTS00070
*              SECTION/DESELECTION MASK USING THE PROCESS DEFINITION    MTS00080
*              TABLE. (2)BUILD A TABLE OF VALID ADDRESSES (VAT) USED BY MTS00090
*              THE TEST CASE FOR ADDRESS COMPARE PROCESSING. (3)FIND START MTS00100
*              OF TIMING DATA, INDEX THRU THE 8 BYTE EVENT TIMING DATA  MTS00110
*              FIELDS CALLING THE DATA DECODING ROUTINE TO PROCESS EACH MTS00120
*              SELECTED FIELD. A VECTOR OF ACTIVE/DEACTIVE LEVELS WILL BE MTS00130
*              GENERATED AND PASSED TO MTSDRMAN FOR PROCESSING. (NOTE)   MTS00140
*              SPECIAL BITS WILL BE DECODED AS EITHER ACTIVE OR DEACTIVE. MTS00150
*                                                                  MTS00160
* INPUT PARAMETERS:                                                MTS00170
*         1 - ADDRESS OF 2560 BYTE WORK BUFFER1                    MTS00180
*         2 - ADDRESS OF 2560 BYTE WORK BUFFER2                    MTS00190
*         3 - ADDRESS OF PROCESS DEFINITION BUFFER3                MTS00200
*         4 - ADDRESS EVENT DESCRIPTOR TABLE DATA BUFFER           MTS00210
*         5 - ADDRESS OF T.C. HEADER RECORD DATA                   MTS00220
*         6 - ADDRESS OF NUMBER OF RECORDS IN T.C. FILE            MTS00230
*         7 - ADDRESS OF RELATIVE RECORD NUMBER OF T.C. HEADER RECORD MTS00240
*         8 - ADDRESS OF RELATIVE RECORD NO IN DRESULTS,MTSCTL     MTS00250
*         9 - ADDRESS OF SCREEN IOCB                               MTS00260
*        10 - ADDRESS OF HALT REPORT PRINT FLAG                    MTS00270
*        11 - DEBUG TRACE FLAG                                     MTS00280
*        12 - ADDRESS OF RETURN CODE AREA                          MTS00290
*                                                                  MTS00300
* OUTPUT PARAMETERS:                                               MTS00310
*         1 - ADDRESS OF DSCB ADDRESS OF EVENT TIME DATA SET       MTS00320
*         2 - ADDRESS OF READ DATA BUFFER                          MTS00330
*         3 - ADDRESS OF READ RELATIVE REC NO                      MTS00340
*         4 - NO RECORDS TO READ INTO READ BUFFER                  MTS00350
*         5 - ADDRESS OF EVENT DESCRIPTOR TABLE                    MTS00360
*         6 - ADDRESS OF A/D VECTOR OF DMS DATA                    MTS00370
*         7 - ADDRESS OF DMS STATUS VECTOR                         MTS00380
*         8 - DEBUG TRACE FLAG                                     MTS00390
*         9 - ADDRESS OF PIN NO OF CHANGED DMS                     MTS00400
*        10 - ADDRESS OF NEW LEVEL OF CHANGED DMS                  MTS00410
*        11 - TCB FOR DIVIDE REMAINDER VALUE                       MTS00420
*        12 - ADDRESS OF 8 BYTES OF EVENT TIME STAMP DATA          MTS00430
*        13 - ADDRESS OF WORK BUFFER2                              MTS00440
*        14 - ADDRESS OF PROCESS DEFINITION BUFFER3                MTS00450
*        15 - EVENT TIME STAMP DATA FULLWORD VALUE                 MTS00460
*        16 - ADDRESS OF RUNNING TIME OVERFLOW COUNT               MTS00470
*        17 - MTSDRMAN COMMAND FLAG                                MTS00480
*        18 - ADDRESS OF DRESULTS,MTSCTL REL REC NO                MTS00490
*        19 - ADDRESS OF TEST CASE HEADER RECORD                   MTS00500
*        20 - ADDRESS OF SCREEN IOCB                               MTS00510
*        21 - ADDRESS OF ADDRESS COMPARE ADDRESS AND TIME          MTS00520
*        22 - ADDRESS OF VALID ADDRESS TABLE                       MTS00530
*        23 - ADDRESS OF RETURN CODE AREA                          MTS00540
*                                                                  MTS00550
* PROGRAMS LOADED: MTSDRBLD                                        MTS00560
*                                                                  MTS00570
* SUBROUTINES LINKED: MTSGRDEC,MTSETHDR,MTSGRINI,MTSDRMAN,MTSDRADV  MTS00580
*                     MTSDRADC,MTSDRCCY,MTSDRDLY,MTSDRMAN,MTSDRMCH  MTS00590
*                     MTSDRPLS,MTSDRPVC,MTSDRRST,MTSDRSTR,MTSDRSSV  MTS00600
*                     MTSDRPLS,MTSDRTIM,MTSETACT,MTSETBIT,MTSETCHG  MTS00610
*                     MTSETMSG,MTSETYPE                             MTS00620
*                                                                  MTS00630
* INTERNAL SUBROUTINES: MANTEST,PRTEST                             MTS00640
*                                                                  MTS00650
* SUBTASKS ATTACHED: NONE                                          MTS00660
*                                                                  MTS00670
* DATA SETS USED: MTSETHDR - EQUATE AND MASK TABLE OF DATA OFFSETS IN MTS00680
*                 HEADER RECORD                                    MTS00690
*                 DS1 = EVENT TIME DATA SET (ET)                   MTS00700
*                 DS2 = PRODUCT CHARACTERIZATION DATA SET (PC)     MTS00710
*                 DS3 = DRESULTS,MTSCTL                            MTS00720
*                                                                  MTS00730
```

```
* RETURN CODES:    -1 = SUCCESSFUL EXECUTION                              MTS00740
*                   1 = DRESULTS,MTSCTL DISK ACCESS ERROR                 MTS00750
*                   2 = DRESULTS,MTSCTL IS FULL                           MTS00760
*                   3 = DATA REDUCTION PROCESS ERROR                      MTS00770
*                   4 = EVENT TIMER FILE READ ERROR                       MTS00780
*                   5 = NO DATA IN EVENT TIMER TEST CASE                  MTS00790
*                                                                         MTS00800
*                                                                         MTS00810
* ERROR EXITS:   NONE                                                     MTS00820
*                                                                         MTS00830
****************************************************************         MTS00840
         ENTRY    MTSDRSCN                                                MTS00850
MTSDRSCN PROGRAM  START,DS=(??,??,??),PARM=12                             MTS00860
         EXTRN    MTSETRDR,MTSGRINI,MTSDRMAN,MTSGRDEC                     MTS00870
         EXTRN    MTSDRADV                                                MTS00880
ET       EQU      DS1             EVENT TIME DATA DSCB                    MTS00890
         ENTRY    ET              EVENT TIME DATA ENTRY POINT             MTS00900
         ENTRY    ETDEBUG         TRACE VALUE ENTRY POINT 0= NO TRACE     MTS00910
DRESULT  EQU      DS3                                                     MTS00920
         ENTRY    DRESULT         DRESULTS,MTSCTL DSCB FOR MTSDRSTR REF   MTS00930
START    EQU      *               PROGRAM START                           MTS00940
****************************************************************         MTS00950
*   DEBUG TRACE AT ENTRY TO THIS ROUTINE - MOVE FROM START OF PROG  *     MTS00960
****************************************************************         MTS00970
         ENQT                                                             MTS00980
         WAIT     KEY                                                     MTS00990
         IF       (ETDEBUG,NE,0),THEN  DEBUG FLAG IS ON                   MTS01000
           ENQT                                                           MTS01010
           PRINTEXT 'MTSDRSCN' THIS MODULE ENTERED MSG                    MTS01020
           WAIT    KEY                                                    MTS01030
           DEQT                                                           MTS01040
         ENDIF                                                            MTS01050
****************************************************************  *      MTS01060
*   SET UP PARM DATA FOR SUBROUTINE USAGE                                 MTS01070
****************************************************************         MTS01080
         MOVE     #1,RELRECAD    POINT TO REL REC NO OF T.C. HEADER REC   MTS01090
         MOVE     RELRECNO,(0,#1) REL REC NUMBER TO CONSTANT AREA         MTS01100
         MOVE     #1,NUMRECAD    POINT TO NUMBER OF RECORDS IN T.C. DATA  MTS01110
         MOVE     NUMREC,(0,#1)   NUMBER OF RECORDS TO CONSTANT AREA      MTS01120
         MOVE     HDRADR,HDRADDR  T.C. HEADER RECORD DATA TO DRMAN        MTS01130
         MOVE     #1,HDRADDR      T.C. HEADER RECORD POINTER              MTS01140
         IF       ((+PMSIZFLG,#1),EQ,ADMSK,1),THEN 16 BIT ADDRESSES       MTS01150
         ELSE                     24 BIT ADDRESSES                        MTS01160
           MOVE   ADMSK,ADMSK24   SET ADDRESS ISOLATION MASK FOR 24       MTS01170
         ENDIF                                                            MTS01180
         MOVE     RESRECA,RESRECAT DRESULTS REL RECORD # ADDR TO DRMAN    MTS01190
         MOVE     IOCBAD,IOCBADR   PANEL IOCB ADDRESS TO DRMAN PARM       MTS01200
         MOVE     BUF2ADR,BUF2ADDR REDUCTION WORK BUFFER ADDRESS          MTS01210
         MOVE     PROVECAD,BUF3ADDR PROCESS DEFINITION VECTOR TO DRMAN    MTS01220
         MOVE     ADVEDTAD,EDTBUFAD EDT ADDRESS TO MTSDRADV PARM          MTS01230
         MOVE     DECEDTAD,EDTBUFAD EDT ADDRESS TO MTSGRDEC PARM          MTS01240
         MOVE     FRSTEVNT,1      SET FIRST EVENT TIME DATA FLAG          MTS01250
         MOVE     TOTFLOCT,0,DWORD RESET RUNNING TIME OVERFLOW COUNT      MTS01260
****************************************************************         MTS01270
*   BUILD EVENT TIME STAMP SELECTION/DESELECTION PARAMETERS USING THE *   MTS01280
*   PROCESS DEFINATION VECTOR (BUFFER 3).                            *    MTS01290
****************************************************************(RS2)    MTS01300
         MOVE     #1,BUF3ADDR     POINT TO PROCESS DEF. VECTOR      (RS2) MTS01310
         MOVE     VECNO,(+NUMVEC,#1) GET NUMBER OF PROCESS VECTORS  (RS2) MTS01320
         ADD      #1,+PV1         POINT TO FIRST PROCESS VECTOR     (RS2) MTS01330
         DO       VECNO,TIMES     PROCESS EACH PROCESS VECTOR       (RS2) MTS01340
           AND    (0,#1),X'F000',RESULT=TYPESIG ISOLATE SIGNAL SET  (RS2) CMTS01350
           IF     (TYPESIG,EQ,+SIGSET1),OR,(TYPESIG,EQ,+SIGSET2),OR,      MTS01360
                  (TYPESIG,EQ,+SIGSET5) THEN A PIN IS DEFINED       (RS2) MTS01370
             AND  (0,#1),X'03FF',RESULT=PIN ISOLATE PIN NUMBER      (RS2) MTS01380
             SUB  PIN,1           ALLOW FOR ZERO BASE OFFSET        (RS2) MTS01390
             MOVE #2,MODULO       POINT TO DIVIDE REMAINDER AREA    (RS2) MTS01400
             DIVIDE PIN,40,RESULT=RELGRPNO CALCULTE RELITIVE GROUP  (RS2) MTS01410
             MOVE GRPPINNO,(0,#2) GET PIN NUMBER FOR THIS GROUP     (RS2) MTS01420
             DIVIDE GRPPINNO,8,RESULT=BYTECNT OFFSET FROM START OF        MTS01430
*                             GROUP DATA TO MASK                   (RS2) MTS01440
             MOVE PINCNT,(0,#2)   GET THE RELITIVE PIN COUNT        (RS2) MTS01450
****************************************************************         
```

```
*    DETERMINE THE MASK REFLECTING THE RELITIVE PIN COUNT AND UPDATE    *  MTS01460
*    THE PROCESS SELECTION/DESELECTION MASK.                            *  MTS01470
***********************************************************************(RS2) MTS01480
          MOVEA    #2,MASKTBL     POINT TO A TABLE OF PIN MASKS    (RS2)  MTS01490
          ADD      #2,PINCNT      POINT TO MASK CORRESPONDING TO THIS    MTS01500
*                                 PIN OFFSET VALUE                 (RS2)  MTS01510
          MOVE     PINMASK,(0,#2),(1,BYTE) GET APPROPRIATE MASK    (RS2)  MTS01520
          MOVEA    #2,ALLMASK     POINT TO PROCESS SELECT MASK     (RS2)  MTS01530
          MULT     RELGRPNO,5,RESULT=INDEX CALC GROUP INDEX VALUE  (RS2)  MTS01540
          ADD      INDEX,BYTECNT  CALCULATE INDEX TO MASK BYTE     (RS2)  MTS01550
          ADD      #2,INDEX       POINT TO PROCESS SELECTION MASK BYTE   MTS01560
*                                                                  (RS2)  MTS01570
          IOR      (0,#2),PINMASK,(1,BYTE) UPDATE THE PROCESS SELECTION  MTS01580
*                                 MASK TO INCLUDE THIS PIN NUMBER (RS2)  MTS01590
***********************************************************************  MTS01600
*    ADD THE GROUP NUMBER TO THE GROUP SELECTION/DESELECTION TABLE      *  MTS01610
***********************************************************************  MTS01620
          IF       (RELGRPNO,GE,8) THEN GROUP NUMBER IS 11-15      (RS2)  MTS01630
            ADD    RELGRPNO,4     CALCULATE ACTUAL GROUP NUMBER    (RS2)  MTS01640
          ENDIF                   RELGRPNO EQUALS ACTUAL GROUP #   (RS2)  MTS01650
          MOVEA    #2,GRPTBL      POINT TO TEST CASE GROUP TABLE   (RS2)  MTS01660
          MOVE     LOOPCNT,GRPCNT SET LOOP EXIT CONTROL COUNT      (RS2)  MTS01670
          MOVE     SELECT,1       SET GROUP SELECTED FOR TABLE ADD (RS2)  MTS01680
          DO WHILE,(LOOPCNT,GT,0) LOOP THRU ALL TABLE ENTRIES      (RS2)  MTS01690
            IF     ((0,#2),EQ,RELGRPNO,1) THEN DUPLICATE GROUP #   (RS2)  MTS01700
              MOVE SELECT,0       DESELECT GROUP TO BE ADDED       (RS2)  MTS01710
              SUB  LOOPCNT,LOOPCNT SET LOOP COUNT TO END LOOP      (RS2)  MTS01720
            ELSE   GROUP IS NOT A DUPLICATE OF THIS TABLE ENTRY    (RS2)  MTS01730
              ADD  (0,#2),1       POINT TO NEXT TABLE ENTRY        (RS2)  MTS01740
              SUB  LOOPCNT,1      DECREMENT LOOP CONTROL COUNT     (RS2)  MTS01750
            ENDIF END OF DUPLICATE TABLE ENTRY CHECK               (RS2)  MTS01760
          ENDDO END OF TABLE ENTRY LOOP                            (RS2)  MTS01770
          IF (SELECT,EQ,1) THEN GROUP IS TO BE ADDED TO TABLE      (RS2)  MTS01780
            MOVE   (0,#2),RELGRPNO+1,(1,BYTE) ADD GRP # TO TABLE   (RS2)  MTS01790
            ADD    GRPCNT,1       UPDATE GROUP TABLE ENTRY COUNT   (RS2)  MTS01800
          ENDIF                   GROUP TABLE UPDATED              (RS2)  MTS01810
        ENDIF                     PROCESS VECTOR PROCESSED         (RS2)  MTS01820
        ADD        #1,8           POINT TO NEXT PROCESS VECTOR     (RS2)  MTS01830
      ENDDO                       LOOP UNTIL ALL PV'S ARE PROCESSED(RS2)  MTS01840
***********************************************************************  MTS01850
*    READ T.C. RECORDS INTO BUFFER 1 TO BE WORKED ON                    *  MTS01860
***********************************************************************  MTS01870
      DO         WHILE,(NUMREC,NE,0) PROCESS WHILE RECORDS LEFT           MTS01880
        IF       (NUMREC,GE,10),THEN READ TEN REOCRDS INTO WORK BUF       MTS01890
          MOVE   RECREAD,10     NUMBER OF RECORDS TO PROCESS IN BUF       MTS01900
          SUB    NUMREC,10      ADJUST # OF RECORDS LEFT IN FILE          MTS01910
        ELSE     READ IN AS MANY RECORDS AS ARE LEFT                      MTS01920
          MOVE   RECREAD,NUMREC NUMBER OF RECORDS LEFT TO PROCESS         MTS01930
          SUB    NUMREC,NUMREC  SET LOOP TEST VALUE TO STOP               MTS01940
        ENDIF                                                             MTS01950
        MOVE     RDRBUF,BUF1ADDR    BASE REG TO BUFFER ADDRESS            MTS01960
        IF       (RDRRET,EQ,1),THEN  DASD IO ERROR                        MTS01970
          GOTO   IOERROR                                                  MTS01980
        ENDIF                                                             MTS01990
        CALL     MTSETRDR,(RDRPARM) READ EVENT TIME DATA TO BUFFER        MTS02000
***********************************************************************  MTS02010
*    SCAN TEST CASE RECORDS, BUILD THE VALID ADDRESS TABLE (VAT) USING  *  MTS02020
*    THE TEST CASE PRODUCT PROCESSOR ATTENTION ADDRESS RECORD(S), PRINT *  MTS02030
*    ALL OPERATOR TEXT RECORDS AND SETUP RECORDS AS THEY OCCUR, CALL    *  MTS02040
*    MTSGRDEC TO DECODE ANY EVENT TIMING STAMP DATA.                    *  MTS02050
***********************************************************************  MTS02060
        MOVE     #1,BUF1ADDR    POINT TO START OF DATA READ INTO BUF      MTS02070
        MOVE     RECOFSET,0     RESET RECORD POINTED AT POINTER           MTS02080
        DO       WHILE,(RECREAD,NE,0) PROCESS ALL DATA IN BUFFER 1        MTS02090
          MOVE   #2,#1          SET ENTRY INDEX REGISTER TO RECORD START  MTS02100
          MOVE   ENTRY,0        RESET ENTRY INTO RECORD POINTER           MTS02110
          AND    (+HDRCTRL,#1),+RECTYPE,RESULT=WORKWORD RECORD TYPE       MTS02120
          SHIFTR WORKWORD,8     MAKE RECORDTYPE AN INTEGER                MTS02130
          IF (WORKWORD,EQ,0),OR,(WORKWORD,EQ,1) THEN RECORD IS            MTS02140
*            PROLOG OR DESCRIPTOR TABLE, SKIP THIS RECORD.      (RS1)    MTS02150
          ELSE DETERMINE TYPE OF DATA TO BE PROCESSED.          (RS1)    MTS02160
***********************************************************************  MTS02170
```

```
*  IF THIS IS A PRODUCT PROCESSOR ATTENTION ADDRESS RECORD, THEN     * MTS02180
*  COMPARE EACH ADDRESS IN THE RECORD WITH THE ADDRESSES SAVED IN    * MTS02190
*  THE VALID ADDRESS TABLE (VAT), IF THE ADDRESS IS NOT IN THE VAT   * MTS02200
*  ADD IT, IF THE ADDRESS HAS BEEN PREVIOUSLY STORED IN THE TABLE    * MTS02210
*  SKIP IT. NOTE: (1) IF THE NUMBER OF ADDRESSES EXCEEDS 128 THE     * MTS02220
*  TABLE OVERFLOW BIT OF THE VAT STATUS BYTE (BIT 7 OF VATSTAT) WILL * MTS02230
*  BE TURNED ON. (2) THE LOGICAL END OF THE VAT WILL ALLWAYS BE A    * MTS02240
*  DOUBLE WORD OF HEX 'FFFFFFFF'                                     * MTS02250
***********************************************************(RS1)      MTS02260
            IF (WORKWORD,EQ,2)      THEN RECORD IS PRODUCT PROCESSOR   MTS02270
*                        ATTENTION ADDRESS TABLE DATA.          (RS1)  MTS02280
              MOVE VATREGSV,#1,2     SAVE THE REGISTERS          (RS1) MTS02290
              MOVE ENTRYNO,(0,#1)    GET THE NUMBER OF ADDRESSES (RS1) MTS02300
              AND  ENTRYNO,X'00FF'   ENTRIES IN THIS RECORD      (RS1) MTS02310
              DO   ENTRYNO,TIMES     PROCESS EACH ADDRESS ENTRY  (RS1) MTS02320
                CALL PRTEST          WILL NOT RETURN IF REPORT HAS     MTS02330
*                                    BEEN CANCELED.             (RS1) MTS02340
                ADD  #2,4      LOCATE FIRST/NEXT ADDRESS ENTRY   (RS1) MTS02350
                IF   (VATCNT,EQ,128),THEN THE VALID ADDRESS TABLE      MTS02360
*                                    IS FULL, SKIP RECORD        (RS1) MTS02370
                  MOVE VATSTAT,X'0100' SET VAT OVERFLOW SWITCH  (RS1)   MTS02380
**************************************************************        MTS02390
*  COMPARE THE PRODUCT PROCESSOR ATTN ADDR ADDRESSES WITH THE VAT    * MTS02400
*  ADDRESSES AND TAKE APPROPRIATE ACTION.                            * MTS02410
***********************************************************(RS1)      MTS02420
                ELSE   CONTINUE TO PROCESS ATTN ADDRESS ENTRY(RS1)     MTS02430
                  MOVE VATSCNSW,X'00' CLEAR VAT SCAN LOOP SW    (RS1)  MTS02440
                  MOVE #1,ADDRTBL@ LOCATE FIRST ENTRY IN VAT    (RS1)  MTS02450
                  MOVE PAADDR,(0,#2),(4,BYTE) GET PRODUCT ADDR  (RS1)  MTS02460
                  AND  PAADDR,X'007F' MAKE ADDR A 32 BIT ADDR   (RS1)  MTS02470
                  DO WHILE,(VATSCNSW,EQ,X'00') CHECK TO SEE IF THE     MTS02480
*                                   ATTN ADDR IS IN THE VAT.    (RS1) MTS02490
                    IF ((0,#1),EQ,VATNULL,4),OR,((0,#1),EQ,VATEOT,4)   MTS02500
*                        THEN THE CURRENT VAT ENTRY IS NULL (RS1)     MTS02510
                      MOVE (0,#1),PAADDR,(4,BYTE) ADD THE ADDRESS      MTS02520
*                        TO THE VALID ADDRESS TABLE           (RS1)    MTS02530
                      ADD  VATCNT,1 UPDATE THE COUNT OF ENTRIES        MTS02540
*                        IN THE VALID ADDRESS TABLE           (RS1)    MTS02550
                      MOVE VATSCNSW,X'FF' SET PROCESS COMPLETE FOR     MTS02560
*                        THIS ADDRESS (ADDRESS ADDED)         (RS1)    MTS02570
                    ELSE CHECK FOR DUPLICATE ADDRESS          (RS1)    MTS02580
                      IF ((0,#1),EQ,PAADDR,4),THEN ADDRESS IS IN       MTS02590
*                        THE VALID ADDRESS TABLE              (RS1)    MTS02600
                        MOVE VATSCNSW,X'0F' PROCESS COMPLETE FOR       MTS02610
*                        THIS ADDRESS (DUPLICATE ADDRESS)     (RS1)    MTS02620
                      ELSE CONTINUE TO CHECK THE TABLE        (RS1)    MTS02630
                        ADD #1,4 LOCATE THE NEXT VAT RECORD   (RS1)    MTS02640
                      ENDIF END OF DUPLICATE ADDRESS CHECK    (RS1)    MTS02650
                    ENDIF END OF NULL VAT ENTRY CHECK         (RS1)    MTS02660
                  ENDDO END OF VAT SCAN LOOP                  (RS1)    MTS02670
                  CALL PRTEST WILL NOT RETURN IF REPORT CANCLED(RS1)   MTS02680
                ENDIF END OF FULL VAT CHECK                   (RS1)    MTS02690
              ENDDO ALL ADDRESSES HAVE BEEN PROCESSED FOR THIS         MTS02700
*                        PRODUCT PROCESSOR ATTN ADDR RECORD   (RS1)    MTS02710
**************************************************************        MTS02720
*  FIND THE LOGICAL END OF THE VAT AND ADD THE DOUBLE WORD OF FOX'S  * MTS02730
***********************************************************(RS1)      MTS02740
              IF (VATSCNSW,EQ,X'FF'),THEN THE LAST ADDRESS ADDED IS    MTS02750
*                        THE LAST ADDRESS IN THE VAT.         (RS1)    MTS02760
                ADD  #1,4 LOCATE TO THE LOGICAL END OF THE VAT (RS1)   MTS02770
              ELSE                   FIND THE LOGICAL END OF FILE FOR  MTS02780
*                        THE VALID ADDRESS TABLE INDICATOR    (RS1)    MTS02790
                DO UNTIL,(VATSCNSW,EQ,X'FF') SCAN THE VAT FOR A NULL   MTS02800
*                        ENRTY.                               (RS1)    MTS02810
                  ADD  #1,4 LOCATE THE NEXT ENTRY IN THE VAT   (RS1)   MTS02820
                  IF ((0,#1),EQ,VATNULL,4),OR,((0,#1),EQ,VATEOT,4)     MTS02830
*                        THEN THIS IS THE LOGICAL END OF TABLE (RS1)   MTS02840
                    MOVE VATSCNSW,X'FF' SET LOGICAL END FOUND          MTS02850
                  ENDIF END OF NULL ENTRY CHECK               (RS1)    MTS02860
                ENDDO END OF VAT LOGICAL TABLE END SCAN LOOP  (RS1)    MTS02870
                MOVE (0,#1),VATEOT,4   MOVE IN THE LOGICAL END OF      MTS02880
*                        THE VALID ADDRESS TABLE INDICATOR    (RS1)    MTS02890
```

```
            ENDIF END OF LAST VAT ADDRESS CHECK              (RS1)  MTS02900
            MOVE   #1,VATREGSV,2   SAVE THE REGISTERS        (RS1)  MTS02910
*****************************************************************  MTS02920
*          FIND AND PROCESS EVENT TIME STAMP DATA RECORD(S)      *  MTS02930
*****************************************************************(RS1)  MTS02940
          ELSE TEST RECORD TO BE EITHER SETUP COMMENT OR TIME DATA MTS02950
            IF   (WORKWORD,EQ,3),OR,(WORKWORD,EQ,4),THEN SKIP      MTS02960
            ELSE    RECORD MUST BE TIMING DATA OR END OF FILE      MTS02970
              IF    (WORKWORD,EQ,5),THEN PROCESS EVENT TIME DATA   MTS02980
                IF    (FRSTEVNT,EQ,1),THEN SAVE OVERFLOW COUNT     MTS02990
*                     FROM START OF TEST CASE DATA                 MTS03000
                  MOVE  TOTFLOCT,(2,#2),DWORD  OVERFLO CNT TO CNTR MTS03010
                  MOVE  FRSTEVNT,0   RESET FIRST EVENT TIME FLAG   MTS03020
                ENDIF                                              MTS03030
                MOVE ENTRYNO,(0,#1)   1ST WORD OF RECORD TO PARM   MTS03040
                AND  ENTRYNO,X'00FF'  # OF DATA ENTRIES IN RECORD  MTS03050
                DO ENTRYNO,TIMES    PROCESS EACH ENTRY IN RECORD   MTS03060
                  CALL   PRTEST    REPORT CANCELLED ?              MTS03070
                  ADD    #2,8      POINT TO FIRST/NEXT ENTRY       MTS03080
                  MOVE   DATATYPE,(0,#2)  EVENT DATA TYPE TO WORK  MTS03090
                  AND    DATATYPE,X'C000'  ISLATE DATA TYPE        MTS03100
                  SHIFTR DATATYPE,14       DATA TYPE NOW INTEGER   MTS03110
                  IF     (DATATYPE,EQ,0),THEN DATA IS DMS EVENT    MTS03120
                    MOVE   EVENDATA,(0,#2),(8,BYTES) DATA TO WORK  MTS03130
                    MOVE   DATATIME,(6,#2)  ETS TIME VALUE TO DRMAN MTS03140
                    IF     (INITSTAT,EQ,0)  DO INITIAL DMS STATUS  MTS03150
                      IF    (FIRSTINI,EQ,1),THEN SAVE 1ST DMS TIME MTS03160
*                           FOR THE FIRST INITIAL DMS.             MTS03170
                        MOVE INITIME,(6,#2)   TIME FOR DRMAN PARM  MTS03180
                        MOVE FIRSTINI,0  SET INITIAL TIME SAVED    MTS03190
                      ENDIF   END OF INITIAL STATUS TIME SAVE      MTS03200
                      CALL MTSGRINI,(INIPARM) BUILD INIT STATUS    MTS03210
*****************************************************************  MTS03220
*  IF INITIAL STATUS OF DMS SIGNALS IS COMPLETED THEN LOAD MTSDRBLD *  MTS03230
*  TO BUILD THE ACTIVE/DEACTIVE VECTOR FOR ALL DMS. THEN CALL MTSDRMAN* MTS03240
*  TO INFORM TEST CASE STARTED AND TO PROCESS INITIAL DATA.      *  MTS03250
*****************************************************************  MTS03260
                      IF    (RETCODE3,EQ,1),THEN INITIAL STAT DONE MTS03270
                        MOVE  INITSTAT,1   FLAG INIT STATUS DONE   MTS03280
                        MOVE  BLDEDTAD,EDTBUFAD EDT ADR TO DRBLD   MTS03290
                        MOVE  BLDBUG,ETDEBUG TRACE FLAG TO DRBLD   MTS03300
                        RESET LOADWAIT RESET WAIT ECB              MTS03310
                        LOAD   (MTSDRBLD,LODLIB),BLDPARM,         *MTS03320
           EVENT=LOADWAIT,ERROR=LOADERR,LOGMSG=NO BUILD A/D VECTOR MTS03330
                        WAIT   LOADWAIT WAIT FOR PROGRAM TO RUN   MTS03340
                        MOVE   MANFLAG,4  SET TEST CASE START FLAG MTS03350
                        MOVE   DATATIME,INITIME  INIT ETS TIME    MTS03360
                        CALL   MTSDRMAN,(MANPARM) PROCES INIT DATA MTS03370
                        CALL   MANTEST     TEST RETURN CODE       MTS03380
                        MOVE   DATATIME,(6,#2) RESTORE CURRENT ETS MTS03390
                        MOVE   STATMASK,DMSDATA,(30,WORD) SET INIT MTS03400
*                              DMS STATUS IN STATUS TEST MASK(RS2) MTS03410
                      ENDIF END OF INIT STATUS RETURN CODE TEST   MTS03420
                    ENDIF    END OF INITIAL STATUS GENERATION     MTS03430
*****************************************************************  MTS03440
* IF INITIAL STATUS OF DMS SIGNALS IS COMPLETED AND THE A/D VECTOR * MTS03450
* HAS BEEN BUILT, THEN PROCESS THIS SET OF ETS DATA.             *  MTS03460
*****************************************************************  MTS03470
                    IF  (INITSTAT,EQ,1),THEN SELECT/DESELECT EVENT MTS03480
*                        DATA                              (RS2)   MTS03490
                      MOVE   SAVE,#1,2 SAVE TE REGISTERS   (RS2)   MTS03500
                      MOVEA  #1,GRPTBL POINT TO VALID GRP TBL(RS2) MTS03510
                      AND    (0,#2),X'0F00',RESULT=RELGRPNO        MTS03520
*                            ISOLATE GROUP NUMBER          (RS2)   MTS03530
                      MOVE   SELECT,0 CLEAR SELECT INDICATOR (RS2) MTS03540
                      DO     GRPCNT,TIMES LOOP THRU GROUP TBL(RS2) MTS03550
                        IF    (SELECT,EQ,0),AND,                  XMTS03560
           ((0,#1),EQ,RELGRPNO,BYTE) THEN PROCESS THIS EVENT TIME  MTS03570
*                             DATA ENTRY                   (RS2)   MTS03580
                          MOVE SELECT,1 SELECT THIS GROUP  (RS2)   MTS03590
                        ELSE   CHECK NEXT ENTRY            (RS2)   MTS03600
                          ADD  #1,1 ADDR OF NXT GRP TBL ENTRY(RS2) MTS03610
```

```
              ENDIF   END OF GROUP TABLE ENTRY CHECK(RS2)   MTS03620
            ENDDO     LOOP THRU VALID GROUP TABLE     (RS2) MTS03630
            MOVE      #1,SAVE,2 RESTORE REGISTERS     (RS2) MTS03640
            IF        (SELECT,EQ,1) THEN PROCESS DATA (RS2) MTS03650
*             MOVE    CHGCODE,1 SET LOOP UNTIL CHNG FOUND   MTS03660
                      LOOP UNTIL ALL TIME STAMP DATA IS DECODED MTS03670
              DO      WHILE,(CHGCODE,EQ,1) UNTIL NO CHANGE  MTS03680
                CALL  MTSGRDEC,(DECPARM) DECODE ETS DATA    MTS03690
*                     DO NOT PROCESS IF NO CHANGE FOUND     MTS03700
                IF    (CHGCODE,EQ,1),THEN UPDATE ADVECTOR   MTS03710
                  CALL MTSDRADV,(ADVPARM) UPDATE ADVEC      MTS03720
                ENDIF  END OF CHGCODE=1 TEST                MTS03730
              ENDDO   END OF DO UNTIL NO CHANGES            MTS03740
              MOVE    MANFLAG,0    SET ETS DATA FLAG        MTS03750
              CALL    MTSDRMAN,(MANPARM) PROCESS ETS DATA   MTS03760
              CALL    MANTEST     TEST RETURN CODE          MTS03770
            ENDIF     END OF SELECT EQUAL 1           (RS2) MTS03780
          ENDIF       END OF INITIAL STATUS = 1 TEST        MTS03790
          ELSE        TEST FOR ADDRESS COMPARE DATA TYPE = 1 MTS03800
            IF        (DATATYPE,EQ,1),THEN ADDRESS COMPARE DATA MTS03810
              MOVE    PAADDR,(0,#2),(4,BYTES) ETS DATA      MTS03820
              AND     PAADDR,ADMSK MAKE ADDR 32 BITS        MTS03830
              MOVE    ACTIME,(6,#2) GET ADDR CMPR TIME      MTS03840
              MOVE    MANFLAG,2  SET ADDR COMPARE FLAG      MTS03850
              CALL    MTSDRMAN,(MANPARM) ADDR COMPARE       MTS03860
              CALL    MANTEST     TEST RETURN CODE          MTS03870
            ELSE      TEST FOR TIMING DATA OVERFLOW         MTS03880
              IF      (DATATYPE,EQ,2),THEN TIMER OVERFLOW   MTS03890
                ADD   TOTFLOCT,1,PREC=D INCRMENT RUNING CNT MTS03900
              ELSE    DATA OVERUN                           MTS03910
                MOVE  MANFLAG,1      SET DATA OVERUN FLAG   MTS03920
                CALL  MTSDRMAN,(MANPARM) FLAG OVERUN        MTS03930
                CALL  MANTEST     TEST RETURN CODE          MTS03940
              ENDIF                                         MTS03950
            ENDIF                                           MTS03960
          ENDIF                                             MTS03970
          ADD    ENTRY,1  INDEX ENTRY # BEING WORKED ON     MTS03980
        ENDDO    ALL ENTRIES IN RECORD HAVE BEEN PROCESSED  MTS03990
        ELSE     END OF FILE INDICATOR    LOOP SHOULD STOP  MTS04000
          IF     (INITSTAT,EQ,0) THEN NO TEST CASE DATA(RS4) MTS04010
            MOVE NODATA,1    SET NO DATA THIS TEST CASE (RS4) MTS04020
          ELSE   NORMAL EOF PROCESSING (CALL MTSDRMAN)  (RS4) MTS04030
            MOVE MANFLAG,3 SET EOF FLAG FOR MTSDRMAN         MTS04040
            CALL MTSDRMAN,(MANPARM) TELL MTSDRMAN EOF        MTS04050
            CALL MANTEST     TEST RETURN CODE               MTS04060
          ENDIF  END NO DATA TEST CASE DATA FOUND CHECK(RS4) MTS04070
        ENDIF    END OF EVENT TIMING DATA TEST              MTS04080
      ENDIF      END OF SETUP OR COMMENT TEST               MTS04090
    ENDIF        END OF PRODUCT PROCESSOR ATTN ADDR TEST (RS1) MTS04100
  ENDIF          END OF PROLOG OR DESCRIPTOR TABLE TEST  (RS1) MTS04110
      ADD        #1,256 POINT TO NEXT RECORD IN BUFFER     MTS04120
      ADD        RECOFSET,1 INDEX REC OFFSET INTO BUFFER PARM MTS04130
      SUB        RECREAD,1  # OF PROCESSED RECORDS IN BUF 1 MTS04140
    ENDDO        ALL RECORDS IN BUFFER HAVE NOW BEEN PROCESSED MTS04150
    ADD          RELRECNO,10 SET POINTER TO NEXT SET OF RECORDS MTS04160
  ENDDO          ALL RECORDS IN FILE HAVE BEEN PROCESSED    MTS04170
STOPEXIT EQU     *  ENTRY POINT FOR REPORT PRINT CANCELATION MTS04180
  MOVE           #1,RETCODAD    POINT TO CALLERS RETURN CODE AREA MTS04190
  IF             (NODATA,EQ,1)  THEN NO DATA FOUND FOR THIS T.C.(RS4) MTS04200
    MOVE         (0,#1),5       NO DATA RETURN CODE TO CALLER (RS4) MTS04210
  ELSE                          NORMAL END RETURN CODE      (RS4) MTS04220
    MOVE         (0,#1),-1      SEND GOOD RETURN CODE TO CALLER MTS04230
  ENDIF  END OF NO DATA IN TEST CASE CHECK             (RS4) MTS04240
ABNORMAL EQU     *              ENTRY POINT FOR ABNORMAL EXIT MTS04250
  PROGSTOP LOGMSG=NO                                         MTS04260
***********************************************************  MTS04270
* RETURN CODE TEST FROM MTSDRMAN                           * MTS04280
***********************************************************  MTS04290
                                                              MTS04300
  SUBROUT MANTEST                                             MTS04310
  IF      (MANRET,NE,-1),THEN   I/O ERROR OCCURRED
    MOVE  #1,RETCODAD    POINT TO CALLERS RETURN CODE AREA   MTS04320
    MOVE  (0,#1),MANRET  SEND BAD RETURN CODE TO CALLER      MTS04330
    GOTO  ABNORMAL       TAKE ABNORMAL ERROR EXIT            MTS04340
```

```
                ENDIF                                                            MTS04350
                RETURN                                                           MTS04360
*****************************************************************************   MTS04370
*   ENTRY POINT FOR MTSDRBLD LOAD ERROR                                      *   MTS04380
*****************************************************************************   MTS04390
LOADERR  EQU         *                                                           MTS04400
         MOVE        #1,RETCODAD        POINT TO CALLERS RETURN CODE AREA        MTS04410
         MOVE        (0,#1),LOADWAIT    SEND BAD RETURN CODE TO CALLER           MTS04420
         GOTO        ABNORMAL           TAKE ABNORMAL EXIT                       MTS04430
*****************************************************************************   MTS04440
*   ENTRY POINT FOR READ ERROR INTO EVENT TIMER FILE                         *   MTS04450
*****************************************************************************   MTS04460
IOERROR  EQU         *                                                           MTS04470
         MOVE        #1,RETCODAD        POINT TO CALLERS RET CODE ADDR           MTS04480
         MOVE        (0,#1),4           SET I/O ERROR RETURN CODE (RS3)          MTS04490
         GOTO        ABNORMAL           TAKE ABNORMAL EXIT                       MTS04500
*****************************************************************************   MTS04510
*   TEST TO SEE IF USER HAS REQUESTED REPORT STOP PRINT                      *   MTS04520
*   PRINTING WILL BE STOPPED IF FLAG = 0, 1 = PRINT ON                       *   MTS04530
*   IF STOP IS REQUESTED AN ABNORMAL ROUTINE EXIT WILL BE TAKEN              *   MTS04540
*****************************************************************************   MTS04550
         SUBROUT     PRTEST                                                      MTS04560
         MOVE        SAVEREG1,#1        SAVE INDEX REGISTER                      MTS04570
         MOVE        #1,PRTFGADR        POINT TO CALLER PRINT TEST FLAG AREA     MTS04580
         IF          ((0,#1),NE,1),THEN USER HAS REQUESTED PRINT STOP            MTS04590
           MOVE      (0,#1),1           TURN PRINT FLAG ON TO REPORT TO RUN AGAIN MTS04600
           MOVE      #1,SAVEREG1        RESTORE INDEX REGISTER                   MTS04610
           GOTO      STOPEXIT           EXIT THIS ROUTINE                        MTS04620
         ENDIF                                                                   MTS04630
         MOVE        #1,SAVEREG1        RESTORE INDEX REGISTER                   MTS04640
         RETURN                                                                  MTS04650
*****************************************************************************   MTS04660
*   PARAMETER LIST SENT TO THIS ROUTINE BY CALLER                            *   MTS04670
*****************************************************************************   MTS04680
BUF1ADDR EQU         $PARM1    ADDRESS OF 2560 BYTE WORK BUFFER1                 MTS04690
BUF2ADDR EQU         $PARM2    ADDRESS OF 2560 BYTE WORK BUFFER2                 MTS04700
BUF3ADDR EQU         $PARM3    ADDRESS PROCESS DEFINITION BUFFER3                MTS04710
EDTBUFAD EQU         $PARM4    ADDRESS OF EVENT DESCRIPTOR DATA BUFFER           MTS04720
HDRADDR  EQU         $PARM5    ADDRESS OF T.C. HEADER RECORD ADDRESS             MTS04730
NUMRECAD EQU         $PARM6    ADDRESS OF NUMBER OF RECORDS IN T.C. FILE         MTS04740
RELRECAD EQU         $PARM7    ADDR OF RELATIVE RECORD NUMBER OF THIS T.C.       MTS04750
RESRECAD EQU         $PARM8    ADDR OF REL REC NO INDEX IN DRESULTS,MTSCTL       MTS04760
IOCBADR  EQU         $PARM9    ADDR OF SCREEN IOCB                               MTS04770
PRTFGADR EQU         $PARM10   ADDR OF HALT REPORT PRINT FLAG 1=RPT,0=STOP       MTS04780
ETDEBUG  EQU         $PARM11   DEBUG TRACE FLAG 0 = NO TRACE                     MTS04790
RETCODAD EQU         $PARM12   ADDRESS OF CALLER RETURN CODE AREA                MTS04800
*****************************************************************************   MTS04810
*   DATA CONSTANTS AREA                                                      *   MTS04820
*****************************************************************************   MTS04830
DATATYPE DATA        F'0'      TYPE OF EVENT TIME DATA, EVENT,OVERFLOW,ETC.      MTS04840
INITSTAT DATA        F'0'      SET TO 1 AFTER DMS INITIAL STATUS PROCESSED       MTS04850
EVENDATA DATA        4F'0'     AREA TO CONTAIN 8 BYTES OF TIMING DATA            MTS04860
WORKWORD DATA        F'0'      USED TO DETERMINE RECORD TYPE                     MTS04870
RELRECNO DATA        F'0'      REL REC NUM OF T.C. HEADER RECORD                 MTS04880
PINNO    DATA        F'0'      PIN NUMBER OF CHANGED DMS                         MTS04890
RECOFSET DATA        F'0'      REC NUMBER IN BUFFER INDEX VALUE                  MTS04900
ENTRY    DATA        F'0'      DATA ENTRY IN RECORD INDEX VALUE                  MTS04910
ENTRYNO  DATA        F'0'      # OF ENTRIES IN RECORD VALUE                      MTS04920
NUMREC   DATA        F'0'      NUMBER OF RECORDS IN T.C. FILE                    MTS04930
SAVEREG1 DATA        F'0'      TEMPORARY SAVE AREA FOR INDEX REG 1                MTS04940
RDRRET   DATA        F'0'      RETURN CODE FROM MTSETRDR                         MTS04950
RETCODE3 DATA        F'0'      RETURN CODE AREA FOR MTSGRINI, 1=INIT DONE        MTS04960
MANRET   DATA        F'0'      RETURN CODE AREA FOR MTSDRMAN,-1=GOOD,1=ERR       MTS04970
CHGCODE  DATA        F'0'      MTSGRDEC WILL SET = 1 IF DMS CHANGED,0 IF NOT     MTS04980
FRSTEVNT DATA        F'0'      FIRST EVENT TIME DATA OCCURRANCE FLAG             MTS04990
FIRSTINI DATA        F'1'      FIRST ETS FLAG TO SAVE FULL WORD TIME VALUE       MTS05000
CHANGPIN DATA        F'0'      DMS PIN NUMBER THAT HAS CHANGED STATUS            MTS05010
CURLEVEL DATA        F'0'      CURRENT LEVEL OF CHANGED DMS PIN                  MTS05020
INITIME  DATA        F'0'      FW TIME OF FIRST ETS DATA USED FOR INIT STAT      MTS05030
LOADWAIT ECB         -1        WAIT FOR PROGRAM TO RUN ECB                       MTS05040
TOTFLOCT DATA        D'0'      RUNNING TIME OVERFLOW COUNTER                     MTS05050
ADVECTOR DATA        30F'0'    ACTIVE/DEACTIVE DMS VECTOR FOR DRMAN DECODE       MTS05060
DMSDATA  DATA        30F'0'    INITIAL DMS STATUS VECTOR FOR 12 GROUPS           MTS05070
```

```
*                       AT TEST CASE TIME 0, TO BE UPDATED EVERY    MTS05080
*                       DMS CHANGE                                  MTS05090
MSG1     TEXT     'INVALID MTSDRSCN COMMAND'                        MTS05100
SYSLOGA  IOCB     $SYSLOGA                                          MTS05110
MTSDRVAT EQU      *         DATA REDUCTION TEST CASE VALID ADDR TABLE MTS05120
VATCNT   DATA     F'0'      COUNT OF VALID ADDRESSES FOR THIS TEST CASE MTS05130
VATSTAT  DATA     H'0'      BITS 0-6 RESERVED; BIT 7 ON = TABLE OVERFLOW MTS05140
         DATA     H'0'      RESERVED                                MTS05150
ADDRTBL  DATA     256F'0'   SPACE FOR 128 VALID ADDRESS ENTRIES     MTS05160
VATEOT   DATA     4X'FF'    VALID ADDRESS TABLE DELIMITER           MTS05170
VATNULL  DATA     4X'00'    VALID ADDRESS TABLE NULL ENTRY          MTS05180
VATSCNSW DATA     X'00'     EXCAPE SWITCH FOR VAT SCAN LOOPS        MTS05190
ADDRTBL@ DATA     A(ADDRTBL) ADDRESS LOCATION OF 1ST VAT ENTRY      MTS05200
VECNO    DATA     F'0'      # OF VECTORS IN PROCESS DEF. VECTOR (BUF3) MTS05210
TYPESIG  DATA     F'0'      VECTOR SIGNAL SET TYPE                  MTS05220
SIGSET1  EQU      X'1000'   TEST MASK FOR VECTOR SIGNAL SET TYPE 1  MTS05230
SIGSET2  EQU      X'2000'   TEST MASK FOR VECTOR SIGNAL SET TYPE 2  MTS05240
SIGSET5  EQU      X'5000'   TEST MASK FOR VECTOR SIGNAL SET TYPE 5  MTS05250
PAADDR   DATA     D'0'      32 BIT PRODUCT PROCESSOR ATTENTION ADDRESS MTS05260
ACTIME   DATA     F'0'      ADDRESS COMPARE EVENT TIME              MTS05270
ADMSK    DATA     X'0000'   MASK USED TO ISOLATE 16 OR 32 BIT ADDRESS MTS05280
ADMSK24  DATA     X'00FF'   32 BIT ADDRESS MASK                     MTS05290
PIN      DATA     F'0'      DSM PIN NUMBER OF THE PROCESS VECTOR    MTS05300
RELGRPNO DATA     F'0'      RELITIVE GROUP NUMBER (USED TO CALC OFFSET) MTS05310
GRPPINNO DATA     F'0'      RELITIVE PIN NUMBER OF THE GROUP        MTS05320
BYTECNT  DATA     F'0'      BYTE OFFSET FROM THE START OF THE GROUP MTS05330
PINCNT   DATA     F'0'      BIT OFFSET FROM BYTE ADDRESSED BY BYTECNT MTS05340
INDEX    DATA     F'0'      USED TO INDEX INTO TABLES AND MASKS     MTS05350
SELECT   DATA     F'0'      SELECTION/DESELECTION INDICATOR         MTS05360
SAVE     DATA     2F'0'     TEMPORARY SAVE AREA FOR REGISTER 1 AND 2 MTS05370
VATREGSV DATA     2F'0'     TEMPORARY SAVE AREA FOR REGISTER 1 AND 2 MTS05380
MASKTBL  EQU      *         A TABLE OF MASKS USED TO BUILD THE PROCESS MTS05390
*                           SELECTION/DESELECTIN MASK.              MTS05400
BIT0     DATA     X'80'     MASK FOR PINCNT = 0                     MTS05410
BIT1     DATA     X'40'     MASK FOR PINCNT = 1                     MTS05420
BIT2     DATA     X'20'     MASK FOR PINCNT = 2                     MTS05430
BIT3     DATA     X'10'     MASK FOR PINCNT = 3                     MTS05440
BIT4     DATA     X'08'     MASK FOR PINCNT = 4                     MTS05450
BIT5     DATA     X'04'     MASK FOR PINCNT = 5                     MTS05460
BIT6     DATA     X'02'     MASK FOR PINCNT = 6                     MTS05470
BIT7     DATA     X'01'     MASK FOR PINCNT = 7                     MTS05480
PINMASK  DATA     F'0'      SELECTED PIN MASK USED TO BUILD THE PROCESS MTS05490
MASKWRD1 DATA     X'0000'                                           MTS05500
MASKWRD2 DATA     X'0000'                                           MTS05510
MASKWRD3 DATA     X'00FF'                                           MTS05520
ETSDWRD1 DATA     X'0000'                                           MTS05530
ETSDWRD2 DATA     X'0000'                                           MTS05540
ETSDWRD3 DATA     X'0000'                                           MTS05550
*                           SELECTION/DESELECTIN MASK.              MTS05560
ALLMASK  DATA     60F'0'    PROCESS SELECTION/DESELECTION MASK      MTS05570
STATMASK DATA     60F'0'    PROCESS SELECTION/DESELECTION MASK      MTS05580
NULLSTAT DATA     5F'0'     NO CHANGE TEST MASK USED DURRING PIN SELECT MTS05590
GRPTBL   DATA     6F'0'     TABLE OF VALID GROUPS FOR THIS TEST CASE MTS05600
*                           TAKEN FROM BUFFER 3 (12 BYTE ENTRIES MAX) MTS05610
GRPCNT   DATA     F'0'      NUMBER OF ENTRIES IN THE GROUP TABLE    MTS05620
LOOPCNT  DATA     F'0'      LOOP CONTROL NUMBER                     MTS05630
NODATA   DATA     F'0'      0 NORMAL STATUS;                        MTS05640
*                           1 NO DATA FOUND IN EVENT TIME TEST CASE MTS05650
*************************************************************** MTS05660
*    PARAMETER LIST SENT TO MTSETRDR                           * MTS05670
*************************************************************** MTS05680
RDRPARM  EQU      *         PARAMETER LIST POINTER                  MTS05690
         DATA     A(ET)     DSCB ADDRESS OF EVENT TIME DATA SET     MTS05700
RDRBUF   DATA     F'0'      ADDRESS OF BUFFER TO PLACE DATA READ IN MTS05710
         DATA     A(RELRECNO) ADDR OF READ START RELATIVE RECORD NUMBER MTS05720
RECREAD  DATA     F'0'      NUMBER OF RECORDS TO READ INTO BUFFER   MTS05730
         DATA     A(RDRRET) ADDRESS OF RETURN CODE AREA             MTS05740
***************************************************************MTS05750
* PARAMETER LIST FOR MTSDRBLD - BUILD A/D VECTOR PARM LIST     *MTS05760
***************************************************************MTS05770
BLDPARM  EQU      *         START OF PARM LIST                      MTS05780
BLDEDTAD DATA     F'0'      ADDRESS OF EVENT DESCRIPTOR TABLE DATA  MTS05790
```

```
             DATA       A(ADVECTOR)  ADDRESS A/D VECTOR OF DMS DATA         MTS05800
             DATA       A(DMSDATA)   ADDRESS OF DMS STATUS VECTOR           MTS05810
BLDBUG       DATA       F'0'         TRACE FLAG,1=STOP AT ENTRY,0=NO TRACE  MTS05820
***************************************************************************MTS05830
* PARAMETER LIST FOR MTSDRADV - UPDATE A/D VECTOR PARM LIST                *MTS05840
***************************************************************************MTS05850
ADVPARM      EQU        *            START OF PARM LIST                     MTS05860
ADVEDTAD     DATA       F'0'         ADDRESS OF EVENT DESCRIPTOR TABLE DATA MTS05870
             DATA       A(ADVECTOR)  ADDR A/D VECTOR OF DMS DATA            MTS05880
             DATA       A(CHANGPIN)  ADDR OF PIN NUMBER OF CHANGED DMS      MTS05890
             DATA       A(CURLEVEL)  ADDR OF NEW LEVEL OF CHANGED DMS       MTS05900
             DATA       A(MTSDRSCN)  TCB ADDR FOR DIVIDE REMAINDER VALUE    MTS05910
***************************************************************************MTS05920
* PARAMETER LIST FOR MTSGRINI - BUILD INITIAL STATUS OF ALL DMS            *MTS05930
***************************************************************************MTS05940
INIPARM      EQU        *            START OF PARM LIST                     MTS05950
             DATA       A(EVENDATA)  ADDRESS OF 8 BYTES OF TIME STAMP DATA  MTS05960
             DATA       A(DMSDATA)   ADDRESS OF DMS STATUS VECTOR           MTS05970
             DATA       A(RETCODE3)  0=INIT NOT COMPLETE, 1 = INIT COMPLETE MTS05980
***************************************************************************MTS05990
* PARAMETER LIST FOR DMS EVENT TIME STAMP DECODE ROUTINE - MTSGRDEC        *MTS06000
***************************************************************************MTS06010
DECPARM      EQU        *            START OF PARM LIST                     MTS06020
             DATA       A(DMSDATA)   ADDRESS OF DMS STATUS VECTOR           MTS06030
             DATA       A(EVENDATA)  ADDRESS OF 8 BYTES OF EVENT TIMING DATA MTS06040
DECEDTAD     DATA       F'0'         EVENT DESCRIPTOR TABLE BUFFER ADDRESS  MTS06050
             DATA       A(CHANGPIN)  TO RECEIVE PIN NUMBER OF CHANGED DMS   MTS06060
             DATA       A(CURLEVEL)  NEW LEVEL OF CHANGED DMS               MTS06070
             DATA       A(CHGCODE)   SET = 1 IF DMS CHANGED,0 IF NO CHANGE  MTS06080
***************************************************************************MTS06090
*  PARAMETER LIST FOR MTSDRMAN                                             *MTS06100
***************************************************************************MTS06110
MANPARM      EQU        *            START OF PARM LIST                     MTS06120
             DATA       A(ADVECTOR)  ADDRESS OF DMS A/D LEVEL VECTOR        MTS06130
BUF2ADR      DATA       F'0'         ADDRESS OF 2560 BYTE WORK BUFFER2      MTS06140
PROVECAD     DATA       F'0'         ADDRESS OF PROCESS DEFINITION BUFFER3  MTS06150
DATATIME     DATA       F'0'         EVENT TIME STAMP FULL WORD TIME VALUE  MTS06160
             DATA       A(TOTFLOCT)  RUNNING TIME OVERFLOW COUNT ADDRESS    MTS06170
MANFLAG      DATA       F'0'         MTSDRMAN COMMAND FLAG (0=ETS DATA,1=DATA MTS06180
*                                    OVERRUN,2=ADDR COMPARE,3=TEST CASE END, MTS06190
*                                    4=TEST CASE START)                     MTS06200
RESRECA      DATA       F'0'         ADDRESS OF DRESULTS,MTSCTL REL REC NO  MTS06210
HDRADR       DATA       F'0'         TEST CASE HEADER RECORD DATA ADDRESS   MTS06220
IOCBAD       DATA       F'0'         ADDRESS OF SCREEN IOCB                 MTS06230
MODULO       DATA       A(MTSDRSCN)  TCB ADDRESS FOR DIVIDE REMAINDER       MTS06240
             DATA       A(PAADDR)    ADDRESS & TIME OF ADDR CMPR DATA       MTS06250
             DATA       A(MTSDRVAT)  ADDRESS OF THE VALID ADDRESS TABLE     MTS06260
             DATA       A(MANRET)    ADDRESS OF MTSDRMAN RETURN CODE        MTS06270
***************************************************************************  MTS06280
* LAST CHANGE DATA CONSTANT (USED FOR LEVEL CONTROL & CHECKING             *  MTS06290
***************************************************************************  MTS06300
LASTCHNG     DATA       C'         ' DATE OF LAST REVISION TO MTSDRSCN (RS4)  MTS06310
             COPY       MTSETHDR     HEADER RECORD EQUATE/MASK TABLE          MTS06320
             COPY       MTSDREQU     DATA REDUCTION EQUATES                   MTS06330
             ENDPROG                                                          MTS06340
             END                                                              MTS06350
*************** MTS MODULE PROLOG ****************************************** MTS00010
*                                                                             MTS00020
* SUBROUTINE NAME: MTSDRMAN                                                   MTS00030
*                                                                             MTS00040
* LEVEL: 01                                                                   MTS00050
*                                                                             MTS00060
* FUNCTION: MANAGE PROCESS VECTORS AND REDUCED DATA VECTORS                   MTS00070
*                                                                             MTS00080
* INPUT PARAMETERS:                                                           MTS00090
* 1.   ADDRESS OF CURRENT DMS STATUS VECTOR                                   MTS00100
* 2.   ADDRESS OF WORK BUFFER - BUFFER2                                       MTS00110
* 3.   ADDRESS OF PROCESS DEFINITION BUFFER - BUFFER3                         MTS00120
* 4.   ETS TIME VALUE                                                         MTS00130
* 5.   ADDRESS OF RUNNING TIME OVERFLOW COUNT                                 MTS00140
* 6.   DATA FLAG (0=ETS DATA, 1=DATA OVERRUN, 2=ADDRESS COMPARE,              MTS00150
*      3=END OF TEST CASE, 4=TEST CASE START                                  MTS00160
* 7.   ADDRESS OF DISK RECORD NO.                                             MTS00170
```

```
*  8.  ADDRESS OF TEST CASE HEADER RECORD                              MTS00180
*  9.  ADDRESS OF SCREEN IOCB                                          MTS00190
* 10.  ADDRESS OF TASK CONTROL BLOCK                                   MTS00200
* 11.  ADDRESS OF CURRENT ADDRESS COMPARE AND TIME                     MTS00210
* 12.  ADDRESS OF VALID ADDRESS TABLE                                  MTS00220
* 13.  ADDRESS OF RETURN CODE AREA                                     MTS00230
*                                                                      MTS00240
* OUTPUT PARAMETERS:                                                   MTS00250
*  1.  ADDRESS OF CURRENT DMS STATUS VECTOR                            MTS00260
*  2.  ADDRESS OF WORK BUFFER - BUFFER2                                MTS00270
*  3.  ADDRESS OF PROCESS DEFINITION BUFFER - BUFFER3                  MTS00280
*  4.  ETS TIME VALUE                                                  MTS00290
*  5.  ADDRESS OF RUNNING TIME OVERFLOW COUNT                          MTS00300
*  6.  ADDRESS OF DISK RECORD NO.                                      MTS00310
*  7.  ADDRESS TASK CONTROL BLOCK                                      MTS00320
*  8.  AREA FOR DATA TO BE STORED                                      MTS00330
*  9.  NUMBER OF STORE ELEMENTS                                        MTS00340
* 10.  ADDRESS OF COPY CYCLE COUNTER                                   MTS00350
* 11.  ADDRESS OF RESULT TIME TO BE STORED                             MTS00360
* 12.  ADDRESS OF PROCESS VECTOR INDEX                                 MTS00370
* 13.  ADDRESS OF TEST CASE TIME BASE                                  MTS00380
* 14.  ADDRESS OF RESULT TIME STORE FLAG                               MTS00390
* 15.  ADDRESS OF INFINITE LOOP FLAG                                   MTS00400
* 16.  STORE COMMAND FLAG (1=INIT BUFFER, 2=PROCESS TIME, 3=TEST CASE  MTS00410
*        START, 4=END OF TEST CASE)                                    MTS00420
* 17.  ADDRESS OF CURRENT ADDRESS COMPARE                              MTS00430
* 18.  ADDRESS OF CURRENT ADDRESS COMPARE TIME                         MTS00440
* 19.  ADDRESS OF TEST CASE HEADER RECORD                              MTS00450
* 20.  ADDRESS OF VALID ADDRESS TABLE                                  MTS00460
* 21.  ADDRESS OF ERROR FLAG FOR ADDRESS COMPARE                       MTS00470
* 22.  ADDRESS OF PROCESS INDEX                                        MTS00480
* 23.  ADDRESS OF COPY CYCLE COUNTER                                   MTS00490
* 24.  ADDRESS OF RESULT TIME                                          MTS00500
* 25.  PROCESS TYPE FLAG                                               MTS00510
* 26.  ADDRESS OF RETURN CODE AREA                                     MTS00520
*                                                                      MTS00530
* PROGRAMS LOADED: NONE                                                MTS00540
*                                                                      MTS00550
* SUBROUTINES CALLED: MTSDRSTR, MTSDRPVC                               MTS00560
*                                                                      MTS00570
* INTERNAL SUBROUTINES: TIMBAS,PRNTMSG                                 MTS00580
*                                                                      MTS00590
* SUBTASKS ATTACHED: NONE                                              MTS00600
*                                                                      MTS00610
* DATA SETS USED: NONE                                                 MTS00620
*                                                                      MTS00630
* RETURN CODES: -1=NO PROBLEMS, 1=DRESULTS,MTSCTL I/O ERROR            MTS00640
*                2=END OF DRESULTS,MTSCTL, 3=PROCESSING ERROR          MTS00650
*                                                                      MTS00660
* ERROR EXITS:  NONE                                                   MTS00670
*                                                                      MTS00680
**********************************************************************MTS00690
         ENTRY   MTSDRMAN                                              MTS00700
         SUBROUT MTSDRMAN,PARMADDR                                     MTS00710
         MOVE    SAVEREGS,#1,2     SAVE CONTENTS OF REG #1 & #2        MTS00720
**********************************************************************MTS00730
* SET UP INPUT PARM LIST AND GET INPUT PARMS                         * MTS00740
**********************************************************************MTS00750
         MOVE    #1,PARMADDR       GET INPUT PARMS FROM MTSDRSCN       MTS00760
         MOVE    INPARMS,(0,#1),13 SET UP INPUT PARM LIST           /C MTS00770
         MOVE    DMSTAT,DMSTATAD   MOVE CURRENT DMS STAT VECTOR ADR    MTS00780
         MOVE    RSLTBUF,RSLBUFAD  MOVE REDUCED DATA BUFFER2 ADDR      MTS00790
         MOVE    PRVCBUF,PRVBUFAD  MOVE PROCESS DEF BUFFER3 ADDRESS    MTS00800
         MOVE    OVFLCNT,OVFLCTAD  MOVE RUNNING TIME OVFLOW CT ADDR    MTS00810
         MOVE    DISKREC,DSKRECAD  MOVE DISK RECORD NO. ADDRESS        MTS00820
         MOVE    TCBAREA,TCBAD     MOVE TASK CONTROL BLOCK ADDRESS     MTS00830
         MOVE    VALIDADR,ADRTABAD MOVE VALID ADDRESS TABLE         /C MTS00840
         MOVE    TCHDR,TCHDRAD     MOVE TEST CASE HEADER REC ADR    /C MTS00850
**********************************************************************MTS00860
* SET UP DATA FLAG CASE STATEMENT                                    * MTS00870
**********************************************************************MTS00880
         MOVE    RETCODE2,-1       SET RETURN CODE FOR NO PROBLEMS  /C MTS00890
         MOVE    INDEX,DTAFLG      GET DATA FLAG                       MTS00900
```

```
              ADD       INDEX,1              ADJUST FOR ERROR EXIT AT 0        MTS00910
              GOTO      (ENDCASE,ETDTA,OVRUN,ADRCMP,TCEND,TCSTRT),INDEX        MTS00920
ETDTA         EQU       *                    CASE1, EVENT TIMER DATA           MTS00930
              MOVE      PROTYPFL,1           SET PROCESS TYPE FLAG          /C MTS00940
              CALL      MTSDRPVC,(PVCPARM)   GO PROCESS EVENT TIME DATA        MTS00950
              IF        (INFLOOP,EQ,1),THEN  TEST FOR INFINITE LOOP            MTS00960
                 MOVE      PRNTFLG,3         SET PRINT FLAG                    MTS00970
                 CALL      PRNTMSG           GO PRINT WARNING                  MTS00980
                 MOVE      RETCODE2,3        SET RET CODE FOR PROCESSING ERR   MTS00990
              ENDIF                                                            MTS01000
              GOTO      ENDCASE                                                MTS01010
OVRUN         EQU       *                    CASE2, DATA OVERRUN               MTS01020
              MOVE      PRNTFLG,2            SET PRINT FLAG                    MTS01030
              CALL      PRNTMSG              GO PRINT WARNING MESSAGE          MTS01040
              MOVE      RETCODE2,3           SET RET CODE FOR PROCESSING ERR   MTS01050
              GOTO      ENDCASE                                                MTS01060
ADRCMP        EQU       *                    CASE3, ADDRESS COMPARE            MTS01070
              MOVE      #1,ADDRCPAD          GET CURRENT ADDR COMPARE & TIME /C MTS01080
              MOVE      ADDRCOMP,#1          SET ADDR COMPARE FOR MTSDRPVC  /C MTS01090
              ADD       #1,4                 GET CURRENT ADDR COMP TIME     /C MTS01100
              MOVE      ADDRTIME,#1          SET ADDR COMP TIME FOR MTSDRPVC /C MTS01110
              MOVE      PROTYPFL,3           SET PROCESS TYPE FLAG          /C MTS01120
              CALL      MTSDRPVC,(PVCPARM)                                  /C MTS01130
              IF        (ADRERRFL,NE,0),THEN CHECK ADDRESS ERROR FLAG       /C MTS01140
                 AND       ADRERRFL,1,,RESULT=PROCERR                       /C MTS01150
                 IF        (PROCERR,EQ,1),THEN                              /C MTS01160
                    MOVE      PRNTFLG,4      SEND INVALID ADDRESS MSG       /C MTS01170
                    CALL      PRNTMSG                                       /C MTS01180
                    MOVE      RETCODE2,3                                    /C MTS01190
                 ELSE                                                       /C MTS01200
                    AND       ADRERRFL,2,,RESULT=PROCERR                    /C MTS01210
                    IF        (PROCERR,EQ,2),THEN                           /C MTS01220
                       MOVE      PRNTFLG,5   SEND VALID ADDR TABLE OVFL MSG /C MTS01230
                       CALL      PRNTMSG                                    /C MTS01240
                    ENDIF                                                   /C MTS01250
                 ENDIF                                                      /C MTS01260
                 MOVE      ADRERRFL,0        CLEAR ADDRESS ERROR FLAG       /C MTS01270
              ENDIF                                                         /C MTS01280
              GOTO      ENDCASE                                                MTS01290
TCEND         EQU       *                    CASE4, TEST CASE END              MTS01300
              MOVE      STRFLG,4             SET STORE COMMAND                 MTS01310
              CALL      MTSDRSTR,(STRPARM)   GO STORE BUFFER TO DISK           MTS01320
              GOTO      ENDCASE                                                MTS01330
TCSTRT        EQU       *                    CASE4, TEST CASE START            MTS01340
              MOVE      PROCINDX,1           INIT PROCESS VECTOR INDEX         MTS01350
              MOVEA     #1,HDRAREA           GET HEADER STORAGE AREA           MTS01360
              MOVE      #2,PRVCBUF           GET PROCESS DEFINITION BUFFER     MTS01370
              MOVE      (+HDRPNAME,#1),(+DRPRONAM,#2),4  GET PROCESS NAME      MTS01380
              MOVE      (+HDRDATE,#1),(+DRPRODAT,#2),4   GET PROCESS DATE      MTS01390
              MOVE      (+HDRTIME,#1),(+DRPROTIM,#2),4   GET PROCESS TIME      MTS01400
              MOVE      (+HDRSTATS,#1),0,DWORD   CLEAR RESULT STATUS WORD      MTS01410
              MOVE      (+HDRNUMBR,#1),0,DWORD   CLEAR VECTOR NUMBER ELEMENTS  MTS01420
              MOVE      (+HDRDIPTR,#1),0,DWORD   CLEAR DISK RECORD POINTER     MTS01430
              CALL      TIMBAS               GET USER TIME BASE                MTS01440
              MOVE      STRFLG,3             SET STORE COMMAND                 MTS01450
              MOVEA     STRAREA,HDRAREA      SET STORE AREA TO HEADER          MTS01460
              MOVE      STRELS,11            SET NUMBER STORE DOUBLEWORDS      MTS01470
              CALL      MTSDRSTR,(STRPARM)   STORE PROCESS VECTOR HEADER       MTS01480
              IF        (RETCODE2,NE,-1),THEN  TEST FOR BAD RETURN CODE        MTS01490
                 GOTO      ENDCASE                                             MTS01500
              ENDIF                                                            MTS01510
              MOVE      STRAREA,TCHDRAD      SET STORE AREA TO TEST CASE HEADER MTS01520
              MOVE      STRELS,20            SET NUMBER STORE DOUBLEWORDS      MTS01530
              CALL      MTSDRSTR,(STRPARM)   STORE TEST CASE HEADER DATA       MTS01540
              GOTO      ENDCASE                                                MTS01550
ENDCASE       EQU       *                                                      MTS01560
              IF        (CPYCYCER,EQ,1),THEN  TEST FOR COPY CYCLE ERROR        MTS01570
                 MOVE      PRNTFLG,1         SET PRINT FLAG                    MTS01580
                 CALL      PRNTMSG           GO PRINT WARNING                  MTS01590
                 MOVE      CPYCYCER,0        RESET COPY CYCLE ERROR FLAG       MTS01600
              ENDIF                                                            MTS01610
              IF        (TIMSTR,EQ,1),THEN   TEST FOR RESULT TIME              MTS01620
```

```
            MOVE      STRFLG,2            SET STORE COMMAND              MTS01630
            CALL      MTSDRSTR,(STRPARM)  STORE CURRENT RESULT TIME      MTS01640
            MOVE      TIMSTR,0            RESET RESULT TIME STORE FLAG   MTS01650
         ENDIF                                                           MTS01660
         IF        (PROCINDX,EQ,17),THEN  TEST FOR END OF PROCESSES      MTS01670
            MOVE      PROCINDX,1          RESET PROCESS STREAM           MTS01680
                                                                         MTS01690
         ENDIF                                                           MTS01700
         MOVE      #1,RETCODE1            SEND RETURN CODE TO CALLER     MTS01700
         MOVE      (0,#1),RETCODE2                                       MTS01710
         MOVE      #1,SAVEREGS,2          RESTORE CONTENTS OF REG #1 & #2 MTS01720
         RETURN                                                          MTS01730
**************************************************************           MTS01740
* SUBROUTINE TO SET UP TIME BASE IN PROCESS VECTOR HEADER    *           MTS01750
**************************************************************           MTS01760
                                                                         MTS01770
         SUBROUT   TIMBAS                                                MTS01780
         MOVE      #1,TCHDRAD      POINT TO T.C. HEADER RECORD DATA      MTS01780
         MOVE      WORKTIME,(+RESOLUTE,#1)  TIME RESOLUTION TO WORK WORD MTS01790
         SHIFTL    WORKTIME,4      TIME RES NOW=1XXX/2XXX/4XXX/8XXX  /C1 MTS01800
         AND       WORKTIME,X'F000' NOW=1000/2000/4000/8000          /C1 MTS01810
         MOVE      TCTIMBAS,WORKTIME                                     MTS01820
         SHIFTR    WORKTIME,12     TIME RESOLUTION NOW = 1/2/4/8         MTS01830
         IF        (WORKTIME,EQ,+MIC1),THEN 1 MICROSECOND PRECISION      MTS01840
            MOVEA     #1,HDRAREA   GET TIME BASE ADDRESS                 MTS01850
            ADD       #1,4                                               MTS01860
            MOVE      (+HDRTBASE,#1),C'01'       STORE 1 MICROSECOND     MTS01870
            ADD       #1,2                                               MTS01880
            MOVE      (+HDRTBASE,#1),C'US'                               MTS01890
         ELSE    TEST FOR 10 MICROSECOND PRECISION                       MTS01900
            IF    (WORKTIME,EQ,+MIC10),THEN 10 USEC PRECISION            MTS01910
               MOVEA  #1,HDRAREA   GET TIME BASE ADDRESS                 MTS01920
               ADD    #1,4                                               MTS01930
               MOVE   (+HDRTBASE,#1),C'10'       STORE 10 MICROSECS      MTS01940
                                                                         MTS01950
               ADD    #1,2                                               MTS01960
               MOVE   (+HDRTBASE,#1),C'US'                               MTS01970
            ELSE   TEST FOR 100 USEC PRECISION                           MTS01980
               IF (WORKTIME,EQ,+MIC100),THEN 100 USEC PRECISION          MTS01990
                  MOVEA   #1,HDRAREA   GET TIME BASE ADDRESS             MTS02000
                  ADD     #1,2                                           MTS02010
                  MOVE    (+HDRTBASE,#1),ONEHUN,DWORD  STORE 100         MTS02020
*                                                   MICROSECONDS         MTS02030
                  ADD     #1,4                                           MTS02040
                  MOVE    (+HDRTBASE,#1),C'US'                           MTS02050
               ELSE DEFAULT TO 1 MILLISECOND PRECISION                   MTS02060
                  MOVEA   #1,HDRAREA   GET TIME BASE ADDRESS             MTS02070
                  ADD     #1,4                                           MTS02080
                  MOVE    (+HDRTBASE,#1),C'01'       STORE 1 MILLISEC    MTS02090
                  ADD     #1,2                                           MTS02100
                  MOVE    (+HDRTBASE,#1),C'MS'                           MTS02110
               ENDIF                                                     MTS02120
            ENDIF                                                        MTS02130
         ENDIF                                                           MTS02140
         RETURN                                                          MTS02150
**************************************************************           MTS02160
* SUBROUTINE TO PRINT MESSAGES TO TERMINAL SCREEN            *           MTS02170
**************************************************************           MTS02180
         SUBROUT   PRNTMSG                                               MTS02190
         MOVE      IOCB,IOCBAD     GET EXISTING SCREEN                   MTS02200
         ENQT      *-*,P1=IOCB                                           MTS02210
         ERASE     MODE=SCREEN,TYPE=ALL,LINE=0   ERASE IT                MTS02220
         ENQT      SCREEN          GET NEW SCREEN                        MTS02230
         GOTO      (SUBEND,ERR1,ERR2,ERR3,ERR4,ERR5),PRNTFLG         /C  MTS02240
ERR1     EQU       *                                                     MTS02250
         PRINTEXT  WARN1           PRINT WARNING MESSAGE 1               MTS02260
         TERMCTRL  DISPLAY                                               MTS02270
         GOTO      SUBEND                                                MTS02280
ERR2     EQU       *                                                     MTS02290
         PRINTEXT  WARN2           PRINT WARNING MESSAGE 2               MTS02300
         PRINTEXT  GENMSG                                                MTS02310
         TERMCTRL  DISPLAY                                               MTS02320
         WAIT      KEY                                                   MTS02330
         GOTO      SUBEND                                                MTS02340
ERR3     EQU       *                                                     MTS02350
         PRINTEXT  WARN3           PRINT WARNING MESSAGE 3               MTS02350
```

```
          PRINTEXT  GENMSG                                              MTS02360
          TERMCTRL  DISPLAY                                             MTS02370
          WAIT      KEY                                                 MTS02380
          GOTO      SUBEND                                              MTS02390
ERR4      EQU       *                                              /C   MTS02400
          PRINTEXT  WARN4     PRINT WARNING MESSAGE 4               /C   MTS02410
          PRINTEXT  GENMSG                                          /C   MTS02420
          TERMCTRL  DISPLAY                                         /C   MTS02430
          WAIT      KEY                                             /C   MTS02440
          GOTO      SUBEND                                          /C   MTS02450
ERR5      EQU       *                                               /C   MTS02460
          PRINTEXT  WARN5     PRINT WARNING MESSAGE 5               /C   MTS02470
          TERMCTRL  DISPLAY                                         /C   MTS02480
          GOTO      SUBEND                                          /C   MTS02490
SUBEND    EQU       *                                                    MTS02500
          MOVE      PRNTFLG,0  CLEAR PRINT FLAG                          MTS02510
          RETURN                                                         MTS02520
***************************************************************         MTS02530
*    EXTRN LIST                                                *         MTS02540
***************************************************************         MTS02550
          EXTRN     MTSDRPVC,MTSDRSTR                                    MTS02560
***************************************************************         MTS02570
*    PARAMETER LIST SENT TO THIS ROUTINE BY MTSDRSCN           *         MTS02580
***************************************************************         MTS02590
INPARMS   EQU       *          PARAMETER LIST POINTER                    MTS02600
DMSTATAD  DATA      F'0'       ADDRESS OF CURRENT DMS STATUS VECTOR      MTS02610
RSLBUFAD  DATA      F'0'       ADDRESS OF REDUCED DATA BUFFER            MTS02620
PRVBUFAD  DATA      F'0'       ADDRESS OF PROCESS DEFINITION BUFFER      MTS02630
ETSDTA    DATA      F'0'       ETS TIME VALUE                            MTS02640
OVFLCTAD  DATA      F'0'       ADDRESS OF RUNNING TIME OVERFLOW CT       MTS02650
DTAFLG    DATA      F'0'       DATA FLAG                                 MTS02660
DSKRECAD  DATA      F'0'       ADDRESS OF DISK RECORD NO.                MTS02670
TCHDRAD   DATA      F'0'       ADDRESS OF TEST CASE HEADER RECORD        MTS02680
IOCBAD    DATA      F'0'       ADDRESS OF SCREEN IOCB                    MTS02690
TCBAD     DATA      F'0'       ADDRESS OF TASK CONTROL BLOCK             MTS02700
ADDRCPAD  DATA      F'0'       ADDR OF CURRENT ADDR COMPARE & TIME  /C   MTS02710
ADRTABAD  DATA      F'0'       ADDRESS OF VALID ADDRESS TABLE       /C   MTS02720
RETCODE1  DATA      F'0'       ADDRESS OF RETURN CODE AREA FOR SCN       MTS02730
***************************************************************         MTS02740
*    DATA CONSTANTS AREA                                       *         MTS02750
***************************************************************         MTS02760
SAVEREGS  DATA      2F'0'          REGISTER #1 & #2 SAVE AREA            MTS02770
HDRAREA   DATA      22F'0'         RESULT VECTOR HEADER AREA             MTS02780
ONEHUN    DATA      C'0100'        EQUATE FOR 100 MICROSECONDS           MTS02790
WORKTIME  DATA      F'0'           WORK WORD FOR TIME BASE DATA          MTS02800
INDEX     DATA      F'0'           INDEX FOR DATA FLAG CASE BRANCHES     MTS02810
INFLOOP   DATA      F'0'           INFINITE LOOP FLAG                    MTS02820
PROCINDX  DATA      F'0'           PROCESS VECTOR INDEX                  MTS02830
TCTIMBAS  DATA      F'0'           TEST CASE TIME BASE                   MTS02840
CCYCTR    DATA      F'0'           COPY CYCLE COUNTER                    MTS02850
RSLTIM    DATA      D'0'           RESULT TIME                           MTS02860
TIMSTR    DATA      F'0'           RESULT TIME STORE FLAG                MTS02870
CPYCYCER  DATA      F'0'           COPY CYCLE ERROR FLAG                 MTS02880
SCREEN    IOCB      SCREEN=ROLL    SCREEN FOR THIS PROGRAM               MTS02890
PRNTFLG   DATA      F'0'           PRINT FLAG                            MTS02900
ADDRCP    DATA      D'0'           CURRENT ADDRESS COMPARE               MTS02910
ADRERRFL  DATA      F'0'           ADDRESS ERROR FLAG FOR ADDR COMPARE /C MTS02920
PROCERR   DATA      F'0'           ADDRESS COMPARE ERROR CODE          /C MTS02930
RETCODE2  DATA      F'0'           RETURN CODE AREA FOR SUBROUTINES      MTS02940
***************************************************************         MTS02950
*    MESSAGE CONSTANTS                                         *         MTS02960
***************************************************************         MTS02970
WARN1     TEXT      'COPY CYCLE DEFINITION ERROR@'                       MTS02980
WARN2     TEXT      'EVENT TIME DATA OVERRUN@'                           MTS02990
WARN3     TEXT      'INFINITE LOOP IN PROCESSING@'                       MTS03000
WARN4     TEXT      'INVALID ADDRESS FOR THIS TEST CASE@'           /C   MTS03010
WARN5     TEXT      'VALID ADDRESS TABLE OVERFLOW@'                 /C   MTS03020
GENMSG    TEXT      'PRESS ENTER TO CONTINUE'                            MTS03030
***************************************************************         MTS03040
*    EQUATE TABLES                                             *         MTS03050
***************************************************************         MTS03060
          COPY      MTSDREQU       GET BUFFER3 EQUATES                   MTS03070
          COPY      MTSETHDR       GET EQUATES FOR TEST CASE HEADER      MTS03080
```

```
****************************************************************** MTS03090
*                                                                 * MTS03100
* PARAMETER LIST FOR MTSDRPVC                                       MTS03110
****************************************************************** MTS03120
PVCPARM   EQU    *                                                  MTS03120
DMSTAT    DATA   F'0'           ADDRESS OF CURRENT DMS STATUS VECTOR MTS03130
PRVCBUF   DATA   F'0'           ADDRESS OF PROCESS DEFINITION BUFFER3 MTS03140
          DATA   A(ETSDTA)      ADDRESS OF ETS TIME VALUE            MTS03150
OVFLCNT   DATA   F'0'           ADDRESS OF RUNNING TIME OVERFLOW CT  MTS03160
TCBAREA   DATA   F'0'           ADDRESS OF TASK CONTROL BLOCK        MTS03170
          DATA   A(PROCINDX)    ADDRESS OF PROCESS INDEX             MTS03180
          DATA   A(CCYCTR)      ADDRESS OF COPY CYCLE COUNTER        MTS03190
          DATA   A(RSLTIM)      ADDRESS OF RESULT TIME               MTS03200
          DATA   A(TCTIMBAS)    ADDRESS OF TEST CASE TIME BASE       MTS03210
          DATA   A(TIMSTR)      ADDRESS OF RESULT TIME STORE FLAG    MTS03220
          DATA   A(INFLOOP)     ADDRESS OF INFINITE LOOP FLAG        MTS03230
          DATA   A(ADRERRFL)    ADDR OF ERROR FLAG FOR ADDR COMPARE /C MTS03240
ADDRCOMP  DATA   F'0'           ADDRESS OF CURRENT ADDRESS COMPARE  /C MTS03250
ADDRTIME  DATA   F'0'           ADDR OF CURRENT ADDR COMPARE TIME   /C MTS03260
VALIDADR  DATA   F'0'           ADDRESS OF VALID ADDRESS TABLE      /C MTS03270
TCHDR     DATA   F'0'           ADDRESS OF TEST CASE HEADER RECORD  /C MTS03280
PROTYPFL  DATA   F'0'           PROCESS TYPE FLAG (1=ETS DATA,      /C MTS03290
*                               3=ADDRESS COMPARE DATA)             /C MTS03300
          DATA   A(RETCODE2)    ADDRESS OF RETURN CODE AREA FOR MAN    MTS03310
****************************************************************** MTS03320
* PARAMETER LIST FOR MTSDRSTR                                     * MTS03330
****************************************************************** MTS03340
STRPARM   EQU    *                                                  MTS03350
STRFLG    DATA   F'0'           STORE COMMAND FLAG (1=INIT BUFFER,   MTS03360
*                               2=PROCESS TIME, 3=TEST CASE START,   MTS03370
*                               4=END OF TEST CASE)                  MTS03380
DISKREC   DATA   F'0'           ADDR OF DRESULTS,MTSCTL REL REC NO   MTS03390
RSLTBUF   DATA   F'0'           ADDRESS OF REDUCED DATA BUFFER2      MTS03400
STRAREA   DATA   F'0'           AREA FOR DATA TO BE STORED           MTS03410
STRELS    DATA   F'0'           NUMBER OF STORE ELEMENTS             MTS03420
          DATA   A(CCYCTR)      ADDRESS OF COPY CYCLE COUNTER        MTS03430
          DATA   A(RSLTIM)      ADDRESS OF RESULT TIME TO BE STORED  MTS03440
          DATA   A(CPYCYCER)    ADDRESS OF COPY CYCLE ERROR FLAG     MTS03450
          DATA   A(RETCODE2)    ADDRESS OF RETURN CODE AREA FOR MAN  MTS03460
          END                                                        MTS03470
*************** MTS MODULE PROLOG ********************************* MTS00010
*                                                                   MTS00020
* SUBROUTINE NAME: MTSDRSTR                                          MTS00030
*                                                                   MTS00040
* LEVEL: 01                                                          MTS00050
*                                                                   MTS00060
* FUNCTION: MANAGE REDUCED DATA RESULT VECTOR BUFFER2,               MTS00070
*           STORE TO DRESULTS,MTSCTL ON DISK                         MTS00080
*                                                                   MTS00090
* INPUT PARAMETERS:                                                  MTS00100
* 1.  STORE COMMAND FLAG (1=INIT BUFFER, 2=PROCESS TIME,              MTS00110
*        3=TEST CASE START, 4=END OF TEST CASE)                      MTS00120
* 2.  ADDRESS OF DRESULTS,MTSCTL RECORD NO.                           MTS00130
* 3.  ADDRESS OF REDUCED DATA BUFFER2                                 MTS00140
* 4.  AREA FOR DATA TO BE STORED                                      MTS00150
* 5.  NUMBER OF STORE ELEMENTS                                        MTS00160
* 6.  ADDRESS OF COPY CYCLE COUNTER                                   MTS00170
* 7.  ADDRESS OF RESULT TIME TO BE STORED                             MTS00180
* 8.  ADDRESS OF COPY CYCLE ERROR FLAG                                MTS00190
* 9.  ADDRESS OF RETURN CODE AREA                                     MTS00200
*                                                                   MTS00210
* OUTPUT PARAMETERS: NONE                                            MTS00220
*                                                                   MTS00230
* PROGRAMS LOADED: NONE                                              MTS00240
*                                                                   MTS00250
* SUBROUTINES CALLED: MTSRDPDS                                       MTS00260
*                                                                   MTS00270
* INTERNAL SUBROUTINES: STRDISK,HDRUPDTE,ERREXIT                     MTS00280
* SUBTASKS ATTACHED: NONE                                            MTS00290
*                                                                   MTS00300
* DATA SETS USED: DRESULTS,MTSCTL                                    MTS00310
*                                                                   MTS00320
* RETURN CODES:  -1=NO PROBLEMS, 1=DISK I/O ERROR,                   MTS00330
```

```
*             2=END OF DRESULTS,MTSCTL                                      MTS00340
*                                                                           MTS00350
* ERROR EXITS:   EXECUTION HALTED IF RETURN CODE = 1 OR 2                   MTS00360
*                                                                           MTS00370
* REASON:  ORIGINAL VERSION                                                 MTS00380
*                                                                           MTS00390
*****************************************************************          MTS00400
        ENTRY    MTSDRSTR                                                   MTS00410
        SUBROUT  MTSDRSTR,PARMADDR                                          MTS00420
        MOVE     SAVEREGS,#1,2      SAVE CONTENTS OF REG #1 & #2            MTS00430
*****************************************************************          MTS00440
* SET UP INPUT PARM LIST AND GET INPUT PARMS                       *        MTS00450
*****************************************************************          MTS00460
        MOVE     #1,PARMADDR        GET INPUT PARMS                         MTS00470
        MOVE     INPARMS,(0,#1),9                                           MTS00480
        MOVE     #1,CCYCTRAD        GET COPY CYCLE COUNTER                  MTS00490
        MOVE     CCYCTR,(0,#1)                                              MTS00500
        MOVE     #1,RSLTIMAD        GET RESULT TIME TO BE STORED            MTS00510
        MOVE     RSLTIM,(0,#1),DWORD                                        MTS00520
*****************************************************************          MTS00530
* SET UP STORE COMMAND CASE STATEMENT                              *        MTS00540
*****************************************************************          MTS00550
        MOVE     #1,RETCODE2        SET RETURN CODE FOR NO PROBLEMS         MTS00560
        MOVE     (0,#1),-1                                                  MTS00570
        MOVE     INDEX,STRFLG       GET STORE COMMAND                       MTS00580
        GOTO     (ENDCASE,INITBUF,RSLTIME,TSTSTRT,TSTEND),INDEX             MTS00590
INITBUF EQU      *                  CASE 1, INIT BUFFER2                    MTS00600
        MOVE     #1,RSLTBUF         GET BUFFER2                             MTS00610
        MOVE     (0,#1),-1,1280     SET BUFFER2 ELEMENTS                    MTS00620
        MOVE     #1,DSKRECAD        INIT DISK RECORD NO. POINTER            MTS00630
        MOVE     (0,#1),0                                                   MTS00640
        MOVE     BUFOFSET,0         INIT BUFFER2 OFFSET                     MTS00650
        GOTO     ENDCASE                                                    MTS00660
RSLTIME EQU      *                  CASE 2, STORE RESULT TIME               MTS00670
        ADD      VECELS,1           INCREMENT VECTOR ELEMENTS COUNTER       MTS00680
        IF       (CCYCTR,NE,0),THEN TEST COPY CYCLE COUNTER                 MTS00690
* CALCULATE COPY CYCLE COUNTER & VECTOR ELEMENTS COUNTER DIFFERENCE *       MTS00700
        IF       (CCYCTR,NE,VECELS),THEN                                    MTS00710
           SUB   CCYCTR,VECELS,RESULT=WRKOFSET                              MTS00720
           MOVE  VECELS,CCYCTR      UPDATE VECTOR ELEMENTS COUNTER          MTS00730
           IF    (WRKOFSET,GT,0),THEN   IF COPY CYCLE GREATER               MTS00740
             MULT WRKOFSET,4                                                MTS00750
             ADD  BUFOFSET,WRKOFSET UPDATE BUFFER2 OFFSET                   MTS00760
           ELSE                                                             MTS00770
             MOVE #1,CPYCYCER       SET COPY CYCLE ERROR FLAG               MTS00780
             MOVE (0,#1),1          IF COPY CYCLE SMALLER                   MTS00790
             GOTO ENDCASE           RETURN WITHOUT NEW RESULT TIME          MTS00800
           ENDIF                                                            MTS00810
        ENDIF                                                               MTS00820
        ENDIF                                                               MTS00830
* STORE RESULT TIME, UPDATE COUNTERS *                                      MTS00840
        MOVE     #1,RSLTBUF         GET BUFFER2                             MTS00850
        ADD      #1,BUFOFSET        POINT AT CURRENT ELEMENT                MTS00860
        MOVE     (0,#1),RSLTIM,DWORD  STORE CURRENT RESULT TIME             MTS00870
        ADD      STATWRD,1          INCREMENT GOOD ELEMENTS COUNTER         MTS00880
        ADD      BUFOFSET,4         INCREMENT BUFFER2 OFFSET                MTS00890
        IF       (BUFOFSET,EQ,2560),THEN  TEST FOR BUFFER2 FULL             MTS00900
          IF     (HDRFLG,EQ,0),THEN                                         MTS00910
            MOVE HDRFLG,1           SET HEADER FLAG                         MTS00920
            MOVE HDRLOC,DISKREC     SET HEADER RECORD LOCATOR               MTS00930
          ENDIF                                                             MTS00940
          MOVE   TIMES,10           SET DISK STORE LOOP COUNTER             MTS00950
          CALL   STRDISK            GO STORE BUFFER2 TO DISK                MTS00960
          MOVE   #1,RSLTBUF         REINIT BUFFER2                          MTS00970
          MOVE   (0,#1),-1,1280                                             MTS00980
          MOVE   BUFOFSET,0         REINIT BUFFER2 OFFSET                   MTS00990
        ENDIF                                                               MTS01000
        GOTO     ENDCASE                                                    MTS01010
TSTSTRT EQU      *                  CASE 3, TEST CASE START                 MTS01020
        MOVE     #1,DSKRECAD        GET DISK RECORD NO. POINTER             MTS01030
        MOVE     DISKREC,(0,#1)                                             MTS01040
        MOVE     CMD,1              SET FOR OPEN PDS                        MTS01050
```

```
              CALL    MTSRDPDS,(DRESULT),(CMD),(MEMNAM),0,0        MTS01060
                                                                   MTS01070
              IF      (CMD,NE,-1),THEN                             MTS01080
                 CALL    ERREXIT       GO TO ERR PROCESS IF BAD RETURN CODE  MTS01090
                 RETURN                                            MTS01100
              ENDIF
              MOVE    STRINDX,0        CLEAR STORE INDEX           MTS01110
                                                                   MTS01120
              MOVE    DCTR,0           CLEAR DOUBLEWORD COUNTER    MTS01130
              DO      UNTIL,(DCTR,EQ,STRELS)                       MTS01140
                 MOVE    #1,RSLTBUF    GET BUFFER2                 MTS01150
                 ADD     #1,BUFOFSET
                 MOVE    #2,STRAREA    SET UP TO STORE RESULT VECTOR HEADER  MTS01160
                 ADD     #2,STRINDX                                MTS01170
                 MOVE    (0,#1),(0,#2),DWORD                       MTS01180
                 ADD     DCTR,1                                    MTS01190
                 ADD     STRINDX,4                                 MTS01200
                 ADD     BUFOFSET,4                                MTS01210
                                                                   MTS01220
              ENDDO                                                MTS01230
              GOTO    ENDCASE                                      MTS01240
TSTEND        EQU     *                CASE 4, TEST CASE END
              IF      (HDRFLG,EQ,0),THEN                           MTS01250
                 MOVE    HDRFLG,1      SET HEADER FLAG             MTS01260
                 MOVE    HDRLOC,DISKREC  SET HEADER RECORD LOCATOR MTS01270
                                                                   MTS01280
              ENDIF
              MOVE    TIMES,10         SET DISK STORE LOOP COUNTER MTS01290
              CALL    STRDISK          GO STORE TEST CASE TO DISK  MTS01300
              MOVE    #1,DSKRECAD      SAVE DISK RECORD NO.        MTS01310
                                                                   MTS01320
              MOVE    (0,#1),DISKREC
              CALL    HDRUPDTE         GO UPDATE HEADER            MTS01330
              MOVE    HDRFLG,0         CLEAR HEADER FLAG           MTS01340
              MOVE    #1,RSLTBUF       GET BUFFER2                 MTS01350
              MOVE    (0,#1),0,1280    ZERO BUFFER2 ELEMENTS       MTS01360
              MOVE    BUFOFSET,0       INIT BUFFER2 OFFSET         MTS01370
              MOVE    TIMES,1          SET DISK STORE LOOP COUNTER MTS01380
              CALL    STRDISK          GO WRITE ZERO RECORD ON DISK MTS01390
              IF      (STRFLG,EQ,2),THEN  TEST IF ERROR HAS OCCURRED MTS01400
                 RETURN                                            MTS01410
                                                                   MTS01420
              ENDIF
              MOVE    #1,RSLTBUF       REINIT BUFFER2              MTS01430
              MOVE    (0,#1),-1,1280                               MTS01440
              MOVE    BUFOFSET,0       REINIT BUFFER2 OFFSET       MTS01450
              GOTO    ENDCASE                                      MTS01460
ENDCASE       EQU     *                CASE STATEMENT END LABEL    MTS01470
              MOVE    #1,SAVEREGS,2    RESTORE CONTENTS OF REG #1 & #2  MTS01480
                                                                   MTS01490
              RETURN
************************************************************** MTS01500
* SUBROUTINE TO STORE BUFFER2 TO DISK                        * MTS01510
************************************************************** MTS01520
              SUBROUT STRDISK                                      MTS01530
              MOVE    BUFFER,RSLTBUF                               MTS01540
              DO      TIMES                                        MTS01550
                                                                   MTS01560
                 MOVE    CMD,7
                 CALL    MTSRDPDS,(DRESULT),(CMD),(MEMNAM),BUFFER,(DISKREC)  MTS01570
                 IF      (CMD,NE,-1),THEN                          MTS01580
                    CALL    ERREXIT   GO TO ERR PROCESS IF BAD RETURN CODE  MTS01590
                    RETURN                                         MTS01600
                                                                   MTS01610
                 ENDIF
                 ADD     DISKREC,1                                 MTS01620
                 ADD     BUFFER,256                                MTS01630
                                                                   MTS01640
              ENDDO                                                MTS01650
              RETURN
************************************************************** MTS01660
* SUBROUTINE TO UPDATE RESULT VECTOR HEADER AT TEST CASE END * MTS01670
************************************************************** MTS01680
              SUBROUT HDRUPDTE                                     MTS01690
              MOVE    CMD,8            GET HEADER FROM DISK FOR UPDATES  MTS01700
              CALL    MTSRDPDS,(DRESULT),(CMD),(MEMNAM),RSLTBUF,(HDRLOC)  MTS01710
                                                                   MTS01720
              IF      (CMD,NE,-1),THEN                             MTS01730
                 CALL    ERREXIT       GO TO ERR PROCESS IF BAD RETURN CODE  MTS01740
                 RETURN                                            MTS01750
              ENDIF
              MOVE    #1,RSLTBUF       POINT AT HEADER             MTS01760
              ADD     #1,2             ADJUST FOR DOUBLEWORD       MTS01770
```

```
           MOVE      (HDRSTATS,#1),STATWRD    STORE RESULT STATUS WORD          MTS01780
           MOVE      (HDRNUMBR,#1),VECELS     STORE NO. VECTOR ELEMENTS         MTS01790
           MOVE      (HDRDIPTR,#1),DISKREC    STORE NEXT RECORD POINTER         MTS01800
           MOVE      CMD,7                    GO STORE HEADER BACK TO DISK      MTS01810
           CALL      MTSRDPDS,(DRESULT),(CMD),(MEMNAM),RSLTBUF,(HDRLOC)         MTS01820
           IF        (CMD,NE,-1),THEN                                           MTS01830
              CALL   ERREXIT      GO TO ERR PROCESS IF BAD RETURN CODE          MTS01840
              RETURN                                                            MTS01850
           ENDIF                                                                MTS01860
           RETURN                                                               MTS01870
**********************************************************************         MTS01880
* SUBROUTINE TO HANDLE DISK ACCESS, DATA ERRORS                       *         MTS01890
**********************************************************************         MTS01900
           SUBROUT   ERREXIT                                                    MTS01910
           MOVE      #1,RETCODE2     GET RETURN CODE FOR MTSDRMAN               MTS01920
           IF        (CMD,EQ,3),THEN                                            MTS01930
              MOVE   (0,#1),2        SET RETURN CODE FOR DISK FULL              MTS01940
           ELSE                                                                 MTS01950
              MOVE   (0,#1),1        SET RETURN CODE FOR I/O ERROR              MTS01960
           ENDIF                                                                MTS01970
           RETURN                                                               MTS01980
**********************************************************************         MTS01990
*    EXTRN LIST                                                       *         MTS02000
**********************************************************************         MTS02010
           EXTRN     MTSRDPDS                                                   MTS02020
           EXTRN     DRESULT                                                    MTS02030
**********************************************************************         MTS02040
*    PARAMETER LIST SENT TO THIS ROUTINE BY CALLER                    *         MTS02050
**********************************************************************         MTS02060
INPARMS    EQU       *                PARAMETER LIST POINTER                    MTS02070
STRFLG     DATA      F'0'             STORE COMMAND FLAG                        MTS02080
DSKRECAD   DATA      F'0'             ADDRESS OF DRESULTS,MTSCTL REC. NO.       MTS02090
RSLTBUF    DATA      F'0'             ADDRESS OF REDUCED DATA BUFFER2           MTS02100
STRAREA    DATA      F'0'             AREA FOR DATA TO BE STORED                MTS02110
STRELS     DATA      F'0'             NUMBER OF STORE WORDS                     MTS02120
CCYCTRAD   DATA      F'0'             ADDRESS OF COPY CYCLE COUNTER             MTS02130
RSLTIMAD   DATA      F'0'             ADDRESS OF RESULT TIME TO BE STORED       MTS02140
CPYCYCER   DATA      F'0'             ADDRESS OF COPY CYCLE ERROR FLAG          MTS02150
RETCODE2   DATA      F'0'             ADDRESS OF RETURN CODE AREA FOR MAN       MTS02160
**********************************************************************         MTS02170
*    DATA CONSTANTS AREA                                              *         MTS02180
**********************************************************************         MTS02190
SAVEREGS   DATA      2F'0'            REGISTER #1 & #2 SAVE AREA                MTS02200
BUFOFSET   DATA      F'0'             BUFFER2 OFFSET                            MTS02210
CCYCTR     DATA      F'0'             COPY CYCLE COUNTER                        MTS02220
RSLTIM     DATA      D'0'             RESULT TIME TO BE STORED                  MTS02230
DISKREC    DATA      F'0'             DISK RECORD NO.                           MTS02240
STATWRD    DATA      F'0'             RESULT STATUS WORD                        MTS02250
VECELS     DATA      F'0'             VECTOR ELEMENTS COUNTER                   MTS02260
HDRLOC     DATA      F'0'             DISK RECORD LOCATOR FOR HEADER            MTS02270
HDRFLG     DATA      F'0'             HEADER FLAG                               MTS02280
WRKOFSET   DATA      F'0'             WORK AREA FOR BUFFER2 OFFSET              MTS02290
STRINDX    DATA      F'0'             STORE INDEX                               MTS02300
DCTR       DATA      F'0'             DOUBLEWORD COUNTER                        MTS02310
INDEX      DATA      F'0'             INDEX FOR STORE COMMAND CASE BRANCHES     MTS02320
TIMES      DATA      F'0'             DISK STORE LOOP COUNTER                   MTS02330
**********************************************************************         MTS02340
*    CONSTANTS FOR MTSRDPDS ROUTINE                                   *         MTS02350
**********************************************************************         MTS02360
MEMNAM     DATA      C'RESULT1 '      DISK MEMBER NAME                          MTS02370
CMD        DATA      F'0'             COMMAND FLAG FOR MTSDRPDS ROUTINE         MTS02380
*                                     (1=OPEN, 2=ALLOC, 3=ALLOC MAX,            MTS02390
*                                     7=WRITE, 8=READ)                          MTS02400
BUFFER     DATA      F'0'             BUFFER ADDRESS FOR MTSRDPDS               MTS02410
**********************************************************************         MTS02420
*    EQUATE TABLES                                                    *         MTS02430
**********************************************************************         MTS02440
           COPY      MTSDREQU         GET BUFFER2 EQUATES                       MTS02450
           END                                                                  MTS02460
```

```
*************** MTS MODULE PROLOG *********************************  MTS00010
*                                                                     MTS00020
* SUBROUTINE NAME: MTSDRPVC                                           MTS00030
*                                                                     MTS00040
* LEVEL: 01                                                           MTS00050
*                                                                     MTS00060
* FUNCTION:   EXECUTE PROCESS VECTORS                                 MTS00070
*                                                                     MTS00080
* INPUT PARAMETERS:                                                   MTS00090
*  1.   ADDRESS OF CURRENT DMS STATUS VECTOR                          MTS00100
*  2.   ADDRESS OF PROCESS DEFINITION BUFFER3                         MTS00110
*  3.   ADDRESS OF ETS TIME VALUE                                     MTS00120
*  4.   ADDRESS OF RUNNING TIME OVERFLOW COUNT                        MTS00130
*  5.   ADDRESS OF TASK CONTROL BLOCK                                 MTS00140
*  6.   ADDRESS OF PROCESS VECTOR INDEX                               MTS00150
*  7.   ADDRESS OF COPY CYCLE COUNTER                                 MTS00160
*  8.   ADDRESS OF RESULT TIME                                        MTS00170
*  9.   ADDRESS OF TEST CASE TIME BASE                                MTS00180
* 10.   ADDRESS OF RESULT TIME STORE FLAG                             MTS00190
* 11.   ADDRESS OF INFINITE LOOP FLAG                                 MTS00200
* 12.   ADDRESS OF ERROR FLAG FOR ADDRESS COMPARE                     MTS00210
* 13.   ADDRESS OF CURRENT ADDRESS COMPARE                            MTS00220
* 14.   ADDRESS OF CURRENT ADDRESS COMPARE TIME                       MTS00230
* 15.   ADDRESS OF TEST CASE HEADER RECORD                            MTS00240
* 16.   ADDRESS OF VALID ADDRESS TABLE                                MTS00250
* 17.   PROCESS TYPE FLAG                                             MTS00260
* 18.   ADDRESS OF RETURN CODE AREA                                   MTS00270
*                                                                     MTS00280
* OUTPUT PARAMETERS:                                                  MTS00290
*  1.   ADDRESS OF CURRENT DMS STATUS VECTOR                          MTS00300
*  2.   ADDRESS OF PROCESS DEFINITION BUFFER3                         MTS00310
*  3.   ADDRESS OF ETS TIME VALUE                                     MTS00320
*  4.   ADDRESS OF RUNNING TIME OVERFLOW COUNT                        MTS00330
*  5.   ADDRESS OF TASK CONTROL BLOCK                                 MTS00340
*  6.   ADDRESS OF TIME DELAY PROCESS VECTOR                          MTS00350
*  7.   ADDRESS OF MULTIPLE TRANSITION PROCESS VECTOR                 MTS00360
*  8.   ADDRESS OF ADDRESS COMPARE PROCESS VECTOR                     MTS00370
*  9.   ADDRESS OF PROCESS VECTOR TO BE MATCHED                       MTS00380
* 10.   ADDRESS OF NOT PROCESS VECTOR FLAG                            MTS00390
* 11.   ADDRESS OF PROCESS VECTOR INDEX                               MTS00400
* 12.   ADDRESS OF COPY CYCLE COUNTER                                 MTS00410
* 13.   ADDRESS OF RESULT TIME                                        MTS00420
* 14.   ADDRESS OF TEST CASE TIME BASE                                MTS00430
* 15.   ADDRESS OF DELAY COUNTER                                      MTS00440
* 16.   ADDRESS OF MULTIPLE TRANSITION COUNTER                        MTS00450
* 17.   ADDRESS OF DELAY FLAG                                         MTS00460
* 18.   ADDRESS OF TIME FLAG                                          MTS00470
* 19.   ADDRESS OF MULTIPLE TRANSITION FLAG                           MTS00480
* 20.   ADDRESS OF CURRENT ADDRESS COMPARE                            MTS00490
* 21.   ADDRESS OF CURRENT ADDRESS COMPARE PROCESS VECTOR             MTS00500
* 22.   ADDRESS OF CURRENT ADDRESS COMPARE TIME                       MTS00510
* 23.   ADDRESS OF TEST CASE HEADER RECORD                            MTS00520
* 24.   ADDRESS OF VALID ADDRESS TABLE                                MTS00530
* 25.   ADDRESS OF ERROR FLAG FOR ADDRESS COMPARE                     MTS00540
* 26.   ADDRESS OF ADDRESS COMPARE TABLE FLAG                         MTS00550
* 27.   ADDRESS OF RETURN CODE AREA                                   MTS00560
*                                                                     MTS00570
* PROGRAMS LOADED: NONE                                               MTS00580
*                                                                     MTS00590
* SUBROUTINES CALLED: MTSDRSSV,MTSDRDLY,MTSDRPLS,MTSDRADC,MTSDRRST,   MTS00600
*                     MTSDRCCY                                        MTS00610
*                                                                     MTS00620
* SUBTASKS ATTACHED: NONE                                             MTS00630
*                                                                     MTS00640
* DATA SETS USED: NONE                                                MTS00650
*                                                                     MTS00660
* RETURN CODES:  -1=END OF PROCESS STREAM, 1=I/O ERROR, 2=END OF      MTS00670
*                DRESULTS,MTSCTL, 3=INFINITE LOOP IN PROCESSING       MTS00680
*                                                                     MTS00690
* ERROR EXITS:  NONE                                                  MTS00700
*                                                                     MTS00710
*********************************************************************  MTS00720
```

```
            ENTRY     MTSDRPVC                                               MTS00730
            SUBROUT   MTSDRPVC,PARMADDR                                      MTS00740
            MOVE      SAVEREGS,#1,2     SAVE CONTENTS OF REG #1 & #2         MTS00750
*********************************************************************       MTS00760
* SET UP INPUT PARM LIST AND GET INPUT PARMS                        *       MTS00770
*********************************************************************       MTS00780
            MOVE      #1,PARMADDR       GET INPUT PARMS FROM MTSDRMAN        MTS00790
            MOVE      INPARMS,(0,#1),18                                   /C MTS00800
            MOVE      DMSTAT1,DMSTATAD  MOVE CURRENT DMS STAT VECTOR ADR     MTS00810
            MOVE      DMSTAT2,DMSTATAD                                       MTS00820
            MOVE      DMSTAT3,DMSTATAD                                       MTS00830
            MOVE      DMSTAT4,DMSTATAD                                       MTS00840
            MOVE      PRVCBUF,PRVBUFAD  MOVE PROCESS DEF BUFFER3 ADDRESS     MTS00850
            MOVE      PRVCBUF1,PRVBUFAD                                      MTS00860
            MOVE      PRVCBUF2,PRVBUFAD                                      MTS00870
            MOVE      PRVCBUF3,PRVBUFAD                                      MTS00880
            MOVE      PRVCBUF4,PRVBUFAD                                   /C MTS00890
            MOVE      ETSDTA1,ETSDTAD   MOVE ETS TIME VALUE ADDRESS          MTS00900
            MOVE      ETSDTA2,ETSDTAD                                        MTS00910
            MOVE      OVFLCNT1,OVFLCTAD MOVE RUNNING TIME OVFLOW CT ADDR     MTS00920
            MOVE      OVFLCNT2,OVFLCTAD                                      MTS00930
            MOVE      OVFLCNT3,OVFLCTAD                                      MTS00940
            MOVE      TCBAREA1,TCBAD    MOVE TASK CONTROL BLOCK ADDRESS      MTS00950
            MOVE      TCBAREA2,TCBAD                                         MTS00960
            MOVE      TCBAREA3,TCBAD                                         MTS00970
            MOVE      TCBAREA4,TCBAD                                         MTS00980
            MOVE      #1,TIMSTRAD       GET RESULT TIME STORE FLAG           MTS00990
            MOVE      TIMSTR,(0,#1)                                          MTS01000
            MOVE      #1,INFLPAD        GET INFINITE LOOP FLAG               MTS01010
            MOVE      INFLOOP,(0,#1)                                         MTS01020
            MOVE      #1,PRCINDAD       GET PROCESS VECTOR INDEX             MTS01030
            MOVE      PROCINDX,(0,#1)                                        MTS01040
            MOVE      #1,RSLTIMAD       GET RESULT TIME                      MTS01050
            MOVE      RSLTIM,(0,#1),DWORD                                    MTS01060
            MOVE      CCYCTR,CCYCTRAD   MOVE COPY CYCLE COUNTER ADDRESS      MTS01070
            MOVE      ADRERRFL,ERRFLGAD MOVE ADDRESS COMPARE ERROR FLAG   /C MTS01080
            MOVE      ADDRCOMP,ADDRCPAD MOVE CURRENT ADDRESS COMPARE      /C MTS01090
            MOVE      ADDRTIME,ADRTIMAD MOVE CURRENT ADDR COMPARE TIME    /C MTS01100
            MOVE      VALIDADR,ADRTABAD MOVE VALID ADDRESS TABLE          /C MTS01110
            MOVE      TCTIMBAS,TCTMBSAD MOVE TEST CASE TIME BASE ADDR        MTS01120
            MOVE      TCHDR,TCHDRAD     MOVE TEST CASE HEADER REC ADR     /C MTS01130
*********************************************************************       MTS01140
* CHECK FOR RESET AND COPY CYCLE SIGNALS                            *       MTS01150
*********************************************************************       MTS01160
            CALL      MTSDRRST,(RSTPARM) GO CHECK FOR RESET SIGNAL           MTS01170
            CALL      MTSDRCCY,(CCYPARM) GO CHECK FOR COPY CYCLE SIGNAL      MTS01180
*********************************************************************       MTS01190
* EXECUTE PROCESS VECTOR STREAM                                     *       MTS01200
*********************************************************************       MTS01210
            MOVE      #1,RETCODE2       SET RETURN CODE FOR NO PROBLEMS      MTS01220
            MOVE      (0,#1),-1                                              MTS01230
            MOVE      PRCVECAD,PRVCBUF  GET PROCESS DEFINITION BUFFER        MTS01240
            ADD       PRCVECAD,+PVLOOP  POINT AT LOOP PROCESSNG WORD         MTS01250
            MOVE      #1,PRCVECAD       GET LOOP PROCESSING WORD             MTS01260
            IF        ((0,#1),EQ,1),THEN CHECK FOR LOOP WORD SET             MTS01270
              MOVE      LOOPFL,1        SET LOOP MODE FLAG                   MTS01280
            ENDIF                                                            MTS01290
            DO        UNTIL,(RETCODE3,EQ,0),OR,(PROCINDX,EQ,17)              MTS01300
              MOVE    PRCVECAD,PRVCBUF  GET PROCESS DEFINITION BUFFER        MTS01310
              ADD     PRCVECAD,+PROVEC  POINT TO PROCESS VECTORS             MTS01320
              MOVE    WORKINDX,PROCINDX GET CURRENT VECTOR                   MTS01330
              SUB     WORKINDX,1                                             MTS01340
              MULT    WORKINDX,8                                             MTS01350
              ADD     PRCVECAD,WORKINDX                                      MTS01360
              MOVE    #1,PRCVECAD       GET CURRENT VECTOR TYPE              MTS01370
              MOVE    TYPE,(0,#1)                                            MTS01380
              AND     TYPE,X'F000'                                           MTS01390
              SHIFTR  TYPE,12                                                MTS01400
              IF      (TYPE,NE,0),THEN  CHECK FOR END OF STREAM              MTS01410
                MOVE    INDEX,TYPE      SET UP INDEX FOR CASE BRANCHES       MTS01420
                SUB     INDEX,1                                              MTS01430
*      TEST FOR MATCH BETWEEN CURRENT PROCESS VECTOR TYPE      *          /C MTS01440
```

```
*          AND CURRENT TIME CALL TYPE                        *         /C MTS01450
              IF        (TYPE,EQ,4),OR,(TYPE,EQ,6),THEN   ADDR COMP?   /C MTS01460
                 IF        (PROTYPFL,EQ,1),THEN   YES,THEN ETS CALL?   /C MTS01470
                    MOVE      RETCODE3,0           YES,THEN NO MATCH,  /C MTS01480
                    MOVE      INDEX,6              GO GET ANOTHER CALL /C MTS01490
                 ENDIF                                                 /C MTS01500
              ELSE                                  THEN ETS           /C MTS01510
                 IF        (PROTYPFL,EQ,3),THEN   ADDR COMP CALL?      /C MTS01520
                    MOVE      RETCODE3,0           YES,THEN NO MATCH,  /C MTS01530
                    MOVE      INDEX,6              GO GET ANOTHER CALL /C MTS01540
                 ENDIF                                                 /C MTS01550
              ENDIF                                                    /C MTS01560
*       TEST FOR ADDRESS COMPARE TABLE TYPE AND ADDRESS       *        /C MTS01570
*       COMPARE TABLE. IF ADDRESS COMPARE TABLE ADDRESS       *        /C MTS01580
*       HAS BEEN FOUND, GO GET ANOTHER CALL BEFORE LOOKING    *        /C MTS01590
*       FOR THE NEXT ADDRESS                                  *        /C MTS01600
              IF        (INDEX,EQ,5),THEN   TEST FOR ADDRESS COMPARE   /C MTS01610
*                                           TABLE TYPE                 /C MTS01620
                 IF        (TBLFLG,EQ,1),THEN   TEST FOR ADDRESS       /C MTS01630
*                                               COMPARE TABLE FLAG     /C MTS01640
                    MOVE      RETCODE3,0    SET RET CODE FOR NO MATCH AND /C MTS01650
                    MOVE      INDEX,6       SET CASE INDEX TO QUIT (GO /C MTS01660
*                                           BACK TO GET NEW TIME CALL) /C MTS01670
                    MOVE      TBLFLG,0      CLEAR ADDR COMPARE TABLE FLG /C MTS01680
                 ENDIF                                                 /C MTS01690
              ENDIF                                                    /C MTS01700
*         GO PROCESS CURRENT PROCESS VECTOR FOR CURRENT CALL    *      /C MTS01710
              GOTO      (SIGVEC,NOTVEC,TIMDEL,ADRCMP,MULTRNS,       /C *MTS01720
                  ADRCMP,ENDLOOP),INDEX                             /C  MTS01730
SIGVEC        EQU       *            CASE 1                             MTS01740
              CALL      MTSDRSSV,(SSVPARM) GO PROCESS SIGNAL SET VEC    MTS01750
              GOTO      ENDCASE                                         MTS01760
NOTVEC        EQU       *            CASE 2                             MTS01770
              MOVE      NOTFLG,1                                        MTS01780
              CALL      MTSDRSSV,(SSVPARM) GO PROCESS NOT SIGNAL SET VEC MTS01790
              GOTO      ENDCASE                                         MTS01800
TIMDEL        EQU       *            CASE 3                             MTS01810
              MOVE      DLYVECAD,PRCVECAD  GET TIME DELAY PROCESS VEC   MTS01820
              CALL      MTSDRDLY,(DLYPARM)  PROCESS DELAY TIME          MTS01830
              GOTO      ENDCASE                                         MTS01840
ADRCMP        EQU       *            CASE 4                             MTS01850
              MOVE      ADRVECAD,PRCVECAD  GET ADDR COMPARE PROC VEC /C MTS01860
              CALL      MTSDRADC,(ADCPARM) GO PROCESS ADDR COMPARE   /C MTS01870
              MOVE      #1,ADRERRFL                                  /C MTS01880
              AND       (0,#1),1,RESULT=PROCERR                      /C MTS01890
              IF        (PROCERR,EQ,1),THEN  TEST ADDR MIS-MATCH ERR /C MTS01900
                 MOVE      RETCODE3,0   SET RET CODE TO QUIT PROCESSING /C MTS01910
              ENDIF                                                  /C MTS01920
              GOTO      ENDCASE                                      /C MTS01930
MULTRNS       EQU       *            CASE 5                             MTS01940
              MOVE      MULVECAD,PRCVECAD GET MULT TRANS PROCESS VEC    MTS01950
              CALL      MTSDRPLS,(PLSPARM)  PROCESS MULTIPLE PULSES     MTS01960
              GOTO      ENDCASE                                         MTS01970
ENDCASE       EQU       *                                               MTS01980
              IF        (RETCODE3,EQ,-1),THEN  TEST FOR END OF PROCESS  MTS01990
                 ADD       PROCINDX,1   INCR PROCESS VECTOR INDEX       MTS02000
                 IF        (PROCINDX,EQ,17),THEN  TEST FOR END OF STREAM MTS02010
                    MOVE      TIMSTR,1      SET RESULT TIME STORE FLAG  MTS02020
                    MOVE      TBLFLG,0      CLEAR ADDR COMPARE TABLE FLAG MTS02030
                    IF        (LOOPFL,EQ,1),THEN   TEST FOR LOOP PROCESS MTS02040
                       IF        (RSLTIM,EQ,ZERO,DWORD),THEN  TEST FOR  MTS02050
*                                                  INFINITE LOOP        MTS02060
                          MOVE      INFLOOP,1     SET INFINITE LOOP FLAG MTS02070
                       ELSE                                              MTS02080
                          MOVE      PROCINDX,1    LOOP TO START OF STREAM MTS02090
                       ENDIF                                             MTS02100
                    ENDIF                                                MTS02110
                 ENDIF                                                   MTS02120
              ENDIF                                                      MTS02130
              ELSE                                                       MTS02140
                 MOVE      TIMSTR,1      SET RESULT TIME STORE FLAG      MTS02150
                 MOVE      TBLFLG,0      CLEAR ADDR COMPARE TABLE FLAG   MTS02160
```

```
            IF      (LOOPFL,EQ,1),THEN   TEST FOR LOOP PROCESSING      MTS02170
*              IF      (RSLTIM,EQ,ZERO,DWORD),THEN       TEST FOR      MTS02180
                                                    INFINITE LOOP      MTS02190
                 MOVE     INFLOOP,1           SET INFINITE LOOP FLAG   MTS02200
                 MOVE     PROCINDX,17         GO TO END OF STREAM      MTS02210
               ELSE                                                    MTS02220
                 MOVE     PROCINDX,1          LOOP TO START OF STREAM  MTS02230
               ENDIF                                                   MTS02240
             ELSE                                                      MTS02250
               MOVE     PROCINDX,17         GO TO END OF STREAM        MTS02260
             ENDIF                                                     MTS02270
           ENDIF                                                       MTS02280
ENDLOOP   EQU        *                                                 MTS02290
          ENDDO                                                        MTS02300
*****************************************************************     MTS02310
*  UPDATE INPUT PARMS                                            *     MTS02320
*****************************************************************     MTS02330
          MOVE       #1,TIMSTRAD       RETURN RESULT TIME STORE FLAG   MTS02340
          MOVE       (0,#1),TIMSTR                                     MTS02350
          MOVE       #1,INFLPAD        RETURN INFINITE LOOP FLAG       MTS02360
          MOVE       (0,#1),INFLOOP                                    MTS02370
          MOVE       #1,PRCINDAD       RETURN PROCESS VECTOR INDEX     MTS02380
          MOVE       (0,#1),PROCINDX                                   MTS02390
          MOVE       #1,RSLTIMAD       RETURN RESULT TIME              MTS02400
          MOVE       (0,#1),RSLTIM,DWORD                               MTS02410
          MOVE       CCYCTR,CCYCTRAD   MOVE COPY CYCLE COUNTER ADDRESS MTS02420
          MOVE       #1,SAVEREGS,2     RESTORE CONTENTS OF REG #1 & #2 MTS02430
          RETURN                                                       MTS02440
*****************************************************************     MTS02450
*   EXTRN LIST                                                   *     MTS02460
*****************************************************************     MTS02470
          EXTRN    MTSDRRST,MTSDRCCY,MTSDRSSV,MTSDRDLY,MTSDRPLS         MTS02480
          EXTRN    MTSDRADC                                      /C    MTS02490
*****************************************************************     MTS02500
*   PARAMETER LIST SENT TO THIS ROUTINE BY CALLER                *     MTS02510
*****************************************************************     MTS02520
INPARMS  EQU        *            PARAMETER LIST POINTER                MTS02530
DMSTATAD DATA       F'0'         ADDRESS OF CURRENT DMS STATUS VECTOR  MTS02540
PRVBUFAD DATA       F'0'         ADDRESS OF PROCESS DEFINITION BUFFER3 MTS02550
ETSDTAD  DATA       F'0'         ADDRESS OF ETS TIME VALUE             MTS02560
OVFLCTAD DATA       F'0'         ADDRESS OF RUNNING TIME OVERFLOW CT   MTS02570
TCBAD    DATA       F'0'         ADDRESS OF TASK CONTROL BLOCK         MTS02580
PRCINDAD DATA       F'0'         ADDRESS OF PROCESS VECTOR INDEX       MTS02590
CCYCTRAD DATA       F'0'         ADDRESS OF COPY CYCLE COUNTER         MTS02600
RSLTIMAD DATA       F'0'         ADDRESS OF RESULT TIME                MTS02610
TCTMBSAD DATA       F'0'         ADDRESS OF TEST CASE TIME BASE        MTS02620
TIMSTRAD DATA       F'0'         ADDRESS OF RESULT TIME STORE FLAG     MTS02630
INFLPAD  DATA       F'0'         ADDRESS OF INFINITE LOOP FLAG         MTS02640
ERRFLGAD DATA       F'0'         ADDRESS OF ERROR FLAG FOR ADDR COMPARE /C MTS02650
ADDRCPAD DATA       F'0'         ADDRESS OF CURRENT ADDRESS COMPARE    /C MTS02660
ADRTIMAD DATA       F'0'         ADDRESS OF CURRENT ADDR COMPARE TIME  /C MTS02670
ADRTABAD DATA       F'0'         ADDRESS OF VALID ADDRESS TABLE        /C MTS02680
TCHDRAD  DATA       F'0'         ADDRESS OF TEST CASE HEADER RECORD    /C MTS02690
PROTYPFL DATA       F'0'         PROCESS TYPE FLAG                     /C MTS02700
RETCODE2 DATA       F'0'         ADDRESS OF RETURN CODE AREA FOR MAN   MTS02710
*****************************************************************     MTS02720
*    DATA CONSTANTS AREA                                         *     MTS02730
*****************************************************************     MTS02740
SAVEREGS DATA       2F'0'        REGISTER #1 & #2 SAVE AREA            MTS02750
PRVCBUF  DATA       F'0'         ADDRESS OF PROCESS DEFINITION BUFFER3 MTS02760
TYPE     DATA       F'0'         PROCESS VECTOR TYPE                   MTS02770
INDEX    DATA       F'0'         INDEX FOR CASE BRANCHES               MTS02780
WORKINDX DATA       F'0'         INDEX TO CURRENT PROCESS VECTOR       MTS02790
TIMSTR   DATA       F'0'         RESULT TIME STORE FLAG                MTS02800
NOTFLG   DATA       F'0'         NOT PROCESS VECTOR FLAG               MTS02810
PROCINDX DATA       F'0'         PROCESS VECTOR INDEX                  MTS02820
RSLTIM   DATA       D'0'         RESULT TIME                           MTS02830
LOOPFL   DATA       F'0'         LOOP PROCESSING FLAG                  MTS02840
INFLOOP  DATA       F'0'         INFINITE LOOP FLAG                    MTS02850
DLYCTR   DATA       F'0'         DELAY COUNTER                         MTS02860
MTNSCTR  DATA       F'0'         MULTIPLE TRANSITION COUNTER           MTS02870
DLYFLG   DATA       F'0'         DELAY FLAG                            MTS02880
```

```
TIMFLG    DATA      F'0'            TIME FLAG                              MTS02890
MULFLG    DATA      F'0'            MULTIPLE TRANSITION FLAG               MTS02900
TBLFLG    DATA      F'0'            ADDRESS COMPARE TABLE FLAG             MTS02910
PROCERR   DATA      F'0'            ADDRESS COMPARE ERROR CODE             MTS02920
ZERO      DATA      D'0'            DOUBLEWORD ZERO                        MTS02930
RETCODE3  DATA      F'0'            RETURN CODE AREA FOR SUBROUTINES       MTS02940
***********************************************************************   MTS02950
* EQUATE TABLES                                                        *   MTS02960
***********************************************************************   MTS02970
          COPY      MTSDREQU        GET BUFFER3 EQUATES                    MTS02980
***********************************************************************   MTS02990
* PARAMETER LIST FOR MTSDRSSV                                          *   MTS03000
***********************************************************************   MTS03010
SSVPARM   EQU       *                                                      MTS03020
PRVCBUF1  DATA      F'0'            ADDRESS OF PROCESS DEFINITION BUFFER3  MTS03030
DMSTAT1   DATA      F'0'            ADDRESS OF CURRENT DMS STATUS VECTOR   MTS03040
TCBAREA1  DATA      F'0'            ADDRESS OF TASK CONTROL BLOCK          MTS03050
PRCVECAD  DATA      F'0'            ADDRESS OF CURRENT PROCESS VECTOR      MTS03060
ETSDTA1   DATA      F'0'            ADDRESS OF ETS TIME VALUE              MTS03070
OVFLCNT1  DATA      F'0'            ADDRESS OF RUNNING TIME OVERFLOW CT    MTS03080
          DATA      A(NOTFLG)       ADDRESS OF NOT PROCESS VECTOR FLAG     MTS03090
          DATA      A(PROCINDX)     ADDRESS OF PROCESS VECTOR INDEX        MTS03100
          DATA      A(TIMFLG)       ADDRESS OF TIME FLAG                   MTS03110
          DATA      A(RSLTIM)       ADDRESS OF RESULT TIME                 MTS03120
          DATA      A(RETCODE3)     ADDRESS OF RETURN CODE FOR PVC         MTS03130
***********************************************************************   MTS03140
* PARAMETER LIST FOR MTSDRDLY                                          *   MTS03150
***********************************************************************   MTS03160
DLYPARM   EQU       *                                                      MTS03170
DLYVECAD  DATA      F'0'            ADDRESS OF TIME DELAY PROCESS VECTOR   MTS03180
ETSDTA2   DATA      F'0'            ADDRESS OF ETS TIME VALUE              MTS03190
OVFLCNT2  DATA      F'0'            ADDRESS OF RUNNING TIME OVERFLOW CT    MTS03200
TCTIMBAS  DATA      F'0'            ADDRESS OF TEST CASE TIME BASE         MTS03210
          DATA      A(DLYCTR)       ADDRESS OF DELAY COUNTER               MTS03220
          DATA      A(DLYFLG)       ADDRESS OF DELAY FLAG                  MTS03230
          DATA      A(RETCODE3)     ADDRESS OF RETURN CODE AREA FOR PVC    MTS03240
***********************************************************************   MTS03250
* PARAMETER LIST FOR MTSDRPLS                                          *   MTS03260
***********************************************************************   MTS03270
PLSPARM   EQU       *                                                      MTS03280
DMSTAT2   DATA      F'0'            ADDRESS OF CURRENT DMS STATUS VECTOR   MTS03290
TCBAREA2  DATA      F'0'            ADDRESS OF TASK CONTROL BLOCK          MTS03300
MULVECAD  DATA      F'0'            ADDRESS OF MULT TRANS PROCESS VECTOR   MTS03310
          DATA      A(MTNSCTR)      ADDRESS OF MULTIPLE TRANSITION CTR     MTS03320
          DATA      A(MULFLG)       ADDRESS OF MULTIPLE TRANSITION FLAG    MTS03330
          DATA      A(RETCODE3)     ADDRESS OF RETURN CODE AREA FOR PVC    MTS03340
***********************************************************************   MTS03350
* PARAMETER LIST FOR MTSDRRST                                          *   MTS03360
***********************************************************************   MTS03370
RSTPARM   EQU       *                                                      MTS03380
PRVCBUF2  DATA      F'0'            ADDRESS OF PROCESS DEFINITION BUFFER3  MTS03390
DMSTAT3   DATA      F'0'            ADDRESS OF CURRENT DMS STATUS VECTOR   MTS03400
TCBAREA3  DATA      F'0'            ADDRESS OF TASK CONTROL BLOCK          MTS03410
          DATA      A(PROCINDX)     ADDRESS OF PROCESS VECTOR INDEX        MTS03420
          DATA      A(DLYCTR)       ADDRESS OF DELAY COUNTER               MTS03430
          DATA      A(MTNSCTR)      ADDRESS OF MULTIPLE TRANSITION CTR     MTS03440
          DATA      A(DLYFLG)       ADDRESS OF DELAY FLAG                  MTS03450
          DATA      A(TIMFLG)       ADDRESS OF TIME FLAG                   MTS03460
          DATA      A(MULFLG)       ADDRESS OF MULTIPLE TRANSITION FLAG    MTS03470
***********************************************************************   MTS03480
* PARAMETER LIST FOR MTSDRCCY                                          *   MTS03490
***********************************************************************   MTS03500
CCYPARM   EQU       *                                                      MTS03510
PRVCBUF3  DATA      F'0'            ADDRESS OF PROCESS DEFINITION BUFFER3  MTS03520
DMSTAT4   DATA      F'0'            ADDRESS OF CURRENT DMS STATUS VECTOR   MTS03530
TCBAREA4  DATA      F'0'            ADDRESS OF TASK CONTROL BLOCK          MTS03540
CCYCTR    DATA      F'0'            ADDRESS OF COPY CYCLE COUNTER          MTS03550
*********************************************************************** /C MTS03560
* PARAMETER LIST FOR MTSDRADC                                          * /C MTS03570
*********************************************************************** /C MTS03580
ADCPARM   EQU       *                                                      MTS03590
PRVCBUF4  DATA      F'0'            ADDRESS OF PROCESS DEFINITION BUFFER3 /C MTS03600
```

```
ADRVECAD DATA     F'0'        ADDRESS OF ADDRESS COMPARE PROCESS VEC   /C  MTS03610
ADDRCOMP DATA     F'0'        ADDRESS OF CURRENT ADDRESS COMPARE       /C  MTS03620
ADDRTIME DATA     F'0'        ADDRESS OF CURRENT ADDR COMPARE TIME     /C  MTS03630
OVFLCNT3 DATA     F'0'        ADDRESS OF RUNNING TIME OVERFLOW CT      /C  MTS03640
         DATA     A(PROCINDX) ADDR OF PROCESS VECTOR INDEX             /C  MTS03650
         DATA     A(RSLTIM)   ADDR OF RESULT TIME                      /C  MTS03660
         DATA     A(TIMFLG)   ADDR OF TIME FLAG                        /C  MTS03670
VALIDADR DATA     F'0'        ADDRESS OF VALID ADDRESS TABLE           /C  MTS03680
ADRERRFL DATA     F'0'        ADDRESS OF ERROR FLAG FOR ADDR COMPARE   /C  MTS03690
         DATA     A(TBLFLG)   ADDRESS OF ADDRESS COMPARE TABLE FLAG    /C  MTS03700
TCHDR    DATA     F'0'        ADDRESS OF TEST CASE HEADER RECORD       /C  MTS03710
         DATA     A(RETCODE3) ADDRESS OF RETURN CODE FOR PVC           /C  MTS03720
         END                                                               MTS03730
*************** MTS MODULE PROLOG ******************************************   MTS00010
*                                                                               MTS00020
* SUBROUTINE NAME: MTSDRRST                                                     MTS00030
*                                                                               MTS00040
* LEVEL: 01                                                                     MTS00050
*                                                                               MTS00060
* FUNCTION:  PROCESS RESET SIGNAL                                               MTS00070
*                                                                               MTS00080
* INPUT PARAMETERS:  NONE                                                       MTS00090
* 1. ADDRESS OF PROCESS DEFINITION BUFFER - BUFFER3                             MTS00100
* 2. ADDRESS OF CURRENT DMS STATUS VECTOR                                       MTS00110
* 3. ADDRESS OF TASK CONTROL BLOCK                                              MTS00120
* 4. ADDRESS OF PROCESS VECTOR INDEX                                            MTS00130
* 5. ADDRESS OF DELAY COUNTER                                                   MTS00140
* 6. ADDRESS OF MULTIPLE TRANSITION COUNTER                                     MTS00150
* 7. ADDRESS OF DELAY FLAG                                                      MTS00160
* 8. ADDRESS OF TIME FLAG                                                       MTS00170
* 9. ADDRESS OF MULTIPLE TRANSITION FLAG                                        MTS00180
*                                                                               MTS00190
* OUTPUT PARAMETERS:                                                            MTS00200
* 1. ADDRESS OF PROCESS VECTOR TO BE MATCHED                                    MTS00210
* 2. ADDRESS OF CURRENT DMS STATUS VECTOR                                       MTS00220
* 3. ADDRESS OF TAS CONTROL BLOCK                                               MTS00230
* 4. ADDRESS OF RETURN CODE AREA                                                MTS00240
*                                                                               MTS00250
* PROGRAMS LOADED: NONE                                                         MTS00260
*                                                                               MTS00270
* PROGRAMS CALLED: MTSDRMCH                                                     MTS00280
*                                                                               MTS00290
* SUBTASKS ATTACHED: NONE                                                       MTS00300
*                                                                               MTS00310
* DATA SETS USED: NONE                                                          MTS00320
*                                                                               MTS00330
* RETURN CODES:  NONE                                                           MTS00340
*                                                                               MTS00350
* ERROR EXITS:  NONE                                                            MTS00360
*                                                                               MTS00370
* REASON:  ORIGINAL VERSION                                                     MTS00380
*                                                                               MTS00390
********************************************************************           MTS00400
         ENTRY    MTSDRRST                                                      MTS00410
         SUBROUT  MTSDRRST,PARMADDR                                             MTS00420
         MOVE     SAVEREGS,#1,2     SAVE CONTENTS OF REG #1 & #2                MTS00430
********************************************************************           MTS00440
* SET UP INPUT PARM LIST AND GET INPUT PARMS                        *           MTS00450
********************************************************************           MTS00460
         MOVE     #1,PARMADDR       GET INPUT PARMS FROM MTSDRPVC               MTS00470
         MOVE     INPARMS,(0,#1),9                                              MTS00480
         MOVE     DMSTAT,DMSTATAD   MOVE CURRENT DMS STAT VECTOR ADR            MTS00490
         MOVE     PRVCBUF,PRVBUFAD  MOVE PROCESS DEF BUFFER3 ADDRESS            MTS00500
         MOVE     TCBAREA,TCBAD     MOVE TASK CONTROL BLOCK ADDRESS             MTS00510
********************************************************************           MTS00520
* PROCESS RESET VECTOR                                              *           MTS00530
********************************************************************           MTS00540
         MOVE     RESVECAD,PRVCBUF  GET PROCESS DEFINITION BUFFER3              MTS00550
         ADD      RESVECAD,+PVRESET POINT TO RESET VECTOR NUMBER                MTS00560
         MOVE     #1,RESVECAD       GET RESET VECTOR NUMBER                     MTS00570
         MOVE     RESVEC,(0,#1)                                                 MTS00580
         IF       (RESVEC,NE,0),THEN                                            MTS00590
```

```
        MOVE    RESVECAD,PRVCBUF    GET PROCESS DEFINITION BUFFER    MTS00600
        ADD     RESVECAD,+PROVEC    POINT TO PROCESS VECTORS         MTS00610
        MOVE    WORKINDX,RESVEC     GET RESET VECTOR                 MTS00620
        SUB     WORKINDX,1                                           MTS00630
        MULT    WORKINDX,8                                           MTS00640
        ADD     RESVECAD,WORKINDX                                    MTS00650
        CALL    MTSDRMCH,(MCHPARM)  GO CHECK FOR VECTOR MATCH        MTS00660
        IF      (RETCODE4,EQ,-1),THEN                                MTS00670
           IF   (RESFLG,EQ,0),THEN   TEST RESET VECTOR FLAG          MTS00680
              MOVE    RESFLG,1       SET RESET VECTOR FLAG           MTS00690
              MOVE    #1,PRCINDAD    RESET PROCESS VECTOR INDEX      MTS00700
              MOVE    (0,#1),1                                       MTS00710
              MOVE    #1,DLYCTRAD    CLEAR DELAY COUNTER             MTS00720
              MOVE    (0,#1),0                                       MTS00730
              MOVE    #1,MTNSCTAD    CLEAR MULTIPLE TRANSITION CTR   MTS00740
              MOVE    (0,#1),0                                       MTS00750
              MOVE    #1,DLYFLGAD    CLEAR DELAY FLAG                MTS00760
              MOVE    (0,#1),0                                       MTS00770
              MOVE    #1,TIMFLGAD    CLEAR TIME FLAG                 MTS00780
              MOVE    (0,#1),0                                       MTS00790
              MOVE    #1,MULFLGAD    CLEAR MULTIPLE TRANSITION FLAG  MTS00800
              MOVE    (0,#1),0                                       MTS00810
           ENDIF                                                     MTS00820
           ELSE                                                      MTS00830
           IF   (RESFLG,EQ,1),THEN   TEST RESET VECTOR FLAG          MTS00840
              MOVE    RESFLG,0       CLEAR RESET VECTOR FLAG         MTS00850
           ENDIF                                                     MTS00860
        ENDIF                                                        MTS00870
        ENDIF                                                        MTS00880
        MOVE    #1,SAVEREGS,2   RESTORE CONTENTS OF REG #1 & #2      MTS00890
        RETURN                                                       MTS00900
***************************************************************     MTS00910
*   EXTRN LIST                                              *        MTS00920
***************************************************************     MTS00930
        EXTRN   MTSDRMCH                                             MTS00940
***************************************************************     MTS00950
* PARAMETER LIST SENT TO THIS ROUTINE BY CALLER             *        MTS00960
***************************************************************     MTS00970
INPARMS  EQU     *       PARAMETER LIST POINTER                      MTS00980
PRVBUFAD DATA    F'0'    ADDRESS OF PROCESS DEFINITION BUFFER3       MTS00990
DMSTATAD DATA    F'0'    ADDRESS OF CURRENT DMS STATUS VECTOR        MTS01000
TCBAD    DATA    F'0'    ADDRESS OF TASK CONTROL BLOCK               MTS01010
PRCINDAD DATA    F'0'    ADDRESS OF PROCESS VECTOR INDEX             MTS01020
DLYCTRAD DATA    F'0'    ADDRESS OF DELAY COUNTER                    MTS01030
MTNSCTAD DATA    F'0'    ADDRESS OF MULTIPLE TRANSITION COUNTER      MTS01040
DLYFLGAD DATA    F'0'    ADDRESS OF DELAY FLAG                       MTS01050
TIMFLGAD DATA    F'0'    ADDRESS OF TIME FLAG                        MTS01060
MULFLGAD DATA    F'0'    ADDRESS OF MULTIPLE TRANSITION FLAG         MTS01070
***************************************************************     MTS01080
* DATA CONSTANTS AREA                                       *        MTS01090
***************************************************************     MTS01100
SAVEREGS DATA    2F'0'          REGISTER #1 & #2 SAVE AREA           MTS01110
PRVCBUF  DATA    F'0'           ADDRESS OF PROCESS DEFINITION BUFFER3 MTS01120
RESVEC   DATA    F'0'           RESET VECTOR                         MTS01130
WORKINDX DATA    F'0'           INDEX TO RESET PROCESS VECTOR        MTS01140
RESFLG   DATA    F'0'           RESET VECTOR FLAG                    MTS01150
RETCODE4 DATA    F'0'           RETURN CODE AREA FOR SUBROUTINES     MTS01160
***************************************************************     MTS01170
* EQUATE TABLES                                             *        MTS01180
***************************************************************     MTS01190
        COPY    MTSDREQU        GET BUFFER3 EQUATES                  MTS01200
***************************************************************     MTS01210
* PARAMETER LIST FOR MTSDRMCH                               *        MTS01220
***************************************************************     MTS01230
MCHPARM  EQU     *                                                   MTS01240
DMSTAT   DATA    F'0'       ADDRESS OF CURRENT DMS STATUS VECTOR     MTS01250
TCBAREA  DATA    F'0'       ADDRESS OF TASK CONTROL BLOCK            MTS01260
RESVECAD DATA    F'0'       ADDRESS OF PROCESS VECTOR TO BE MATCHED  MTS01270
         DATA    A(RETCODE4) ADDRESS OF RETURN CODE AREA FOR RST     MTS01280
        END                                                          MTS01290
```

```
*************** MTS MODULE PROLOG *******************************      MTS00010
*                                                                      MTS00020
* SUBROUTINE NAME: MTSDRCCY                                             MTS00030
*                                                                      MTS00040
* LEVEL: 01                                                             MTS00050
*                                                                      MTS00060
* FUNCTION:  PROCESS COPY CYCLE SIGNAL SET                              MTS00070
*                                                                      MTS00080
* INPUT PARAMETERS:                                                     MTS00090
* 1. ADDRESS OF PROCESS DEFINITIN BUFFER - BUFFER3                      MTS00100
* 2. ADDRESS OF CURRENT DMS STATUS VECTOR                               MTS00110
* 3. ADDRESS OF TASK CONTROL BLOCK                                      MTS00120
* 4. ADDRESS OF COPY CYCLE COUNTER                                      MTS00130
*                                                                      MTS00140
* OUTPUT PARAMETERS:                                                    MTS00150
* 1. ADDRESS OF PROCESS VECTOR TO BE MATCHED                            MTS00160
* 2. ADDRESS OF CURRENT DMS STATUS VECTOR                               MTS00170
* 3. ADDRESS OF TASK CONTROL BLOCK                                      MTS00180
* 4. ADDRESS OF RETURN CODE AREA                                        MTS00190
*                                                                      MTS00200
* PROGRAMS LOADED: NONE                                                 MTS00210
*                                                                      MTS00220
* SUBROUTINES CALLED: MTSDRMCH                                          MTS00230
*                                                                      MTS00240
* SUBTASKS ATTACHED: NONE                                               MTS00250
*                                                                      MTS00260
* DATA SETS USED: NONE                                                  MTS00270
*                                                                      MTS00280
* RETURN CODES:  NONE                                                   MTS00290
*                                                                      MTS00300
* ERROR EXITS:  NONE                                                    MTS00310
*                                                                      MTS00320
* REASON:  ORIGINAL VERSION                                             MTS00330
*                                                                      MTS00340
************************************************************           MTS00350
        ENTRY    MTSDRCCY                                               MTS00360
        SUBROUT  MTSDRCCY,PARMADDR                                      MTS00370
        MOVE     SAVEREGS,#1,2      SAVE CONTENTS OF REG #1 & #2        MTS00380
************************************************************           MTS00390
* SET UP INPUT PARM LIST AND GET INPUT PARMS                 *          MTS00400
************************************************************           MTS00410
        MOVE     #1,PARMADDR        GET INPUT PARMS FROM MTSDRPVC       MTS00420
        MOVE     INPARMS,(0,#1),4                                       MTS00430
        MOVE     DMSTAT,DMSTATAD    MOVE CURRENT DMS STAT VECTOR ADR    MTS00440
        MOVE     PRVCBUF,PRVBUFAD   MOVE PROCESS DEF BUFFER3 ADDRESS    MTS00450
        MOVE     TCBAREA,TCBAD      MOVE TASK CONTROL BLOCK ADDRESS     MTS00460
        MOVE     #1,CCYCTRAD        GET COPY CYCLE COUNTER              MTS00470
        MOVE     CCYCTR,(0,#1)                                          MTS00480
************************************************************           MTS00490
* PROCESS COPY CYCLE SIGNAL                                  *          MTS00500
************************************************************           MTS00510
        MOVE     CCYVECAD,PRVCBUF   GET PROCESS DEFINITION BUFFER3      MTS00520
        ADD      CCYVECAD,+PVCOPCY  POINT TO COPY CYCLE VECTOR NUMBER   MTS00530
        MOVE     #1,CCYVECAD        GET COPY CYCLE VECTOR NUMBER        MTS00540
        MOVE     CCYVEC,(0,#1)                                          MTS00550
        IF       (CCYVEC,NE,0),THEN                                     MTS00560
           MOVE     CCYVECAD,PRVCBUF   GET PROCESS DEFINITION BUFFER    MTS00570
           ADD      CCYVECAD,+PROVEC   POINT TO PROCESS VECTORS         MTS00580
           MOVE     WORKINDX,CCYVEC    GET COPY CYCLE VECTOR            MTS00590
           SUB      WORKINDX,1                                          MTS00600
           MULT     WORKINDX,8                                          MTS00610
           ADD      CCYVECAD,WORKINDX                                   MTS00620
           CALL     MTSDRMCH,(MCHPARM)  GO CHECK FOR VECTOR MATCH       MTS00630
           IF       (RETCODE4,EQ,-1),THEN                               MTS00640
              IF       (CCYFLG,EQ,0),THEN  TEST COPY CYCLE VEC FLAG     MTS00650
                 ADD      CCYCTR,1           INCREMENT COPY CYCLE CTR   MTS00660
                 MOVE     CCYFLG,1           SET COPY CYCLE VEC FLAG    MTS00670
              ENDIF                                                     MTS00680
           ELSE                                                         MTS00690
              IF       (CCYFLG,EQ,1),THEN  TEST COPY CYCLE VEC FLAG     MTS00700
                 MOVE     CCYFLG,0           RESET COPY CYCLE VEC FLG   MTS00710
              ENDIF                                                     MTS00720
```

```
                ENDIF                                                          MTS00730
                ENDIF                                                          MTS00740
*******************************************************************           MTS00750
* UPDATE INPUT PARMS                                              *            MTS00760
*******************************************************************           MTS00770
        MOVE    #1,CCYCTRAD        RETURN COPY CYCLE COUNTER                   MTS00780
        MOVE    (0,#1),CCYCTR                                                  MTS00790
        MOVE    #1,SAVEREGS,2      RESTORE CONTENTS OF REG #1 & #2             MTS00800
        RETURN                                                                 MTS00810
*******************************************************************           MTS00820
*   EXTRN LIST                                                    *            MTS00830
*******************************************************************           MTS00840
        EXTRN   MTSDRMCH                                                       MTS00850
*******************************************************************           MTS00860
* PARAMETER LIST SENT TO THIS ROUTINE BY CALLER                   *            MTS00870
*******************************************************************           MTS00880
INPARMS EQU     *                  PARAMETER LIST POINTER                     MTS00890
PRVBUFAD DATA   F'0'               ADDRESS OF PROCESS DEFINITION BUFFER3       MTS00900
DMSTATAD DATA   F'0'               ADDRESS OF CURRENT DMS STATUS VECTOR        MTS00910
TCBAD   DATA    F'0'               ADDRESS OF TASK CONTROL BLOCK               MTS00920
CCYCTRAD DATA   F'0'               ADDRESS OF COPY CYCLE COUNTER               MTS00930
*******************************************************************           MTS00940
*   DATA CONSTANTS AREA                                           *            MTS00950
*******************************************************************           MTS00960
SAVEREGS DATA   2F'0'              REGISTER #1 & #2 SAVE AREA                  MTS00970
PRVCBUF DATA    F'0'               ADDRESS OF PROCESS DEFINITION BUFFER3       MTS00980
CCYVEC  DATA    F'0'               COPY CYCLE VECTOR                           MTS00990
WORKINDY DATA   F'0'               INDEX TO COPY CYCLE PROCESS VECTOR          MTS01000
CCYFLG  DATA    F'0'               COPY CYCLE VECTOR FLAG                      MTS01010
CCYCTR  DATA    F'0'               COPY CYCLE COUNTER                          MTS01020
RETCODE4 DATA   F'0'               RETURN CODE AREA FOR SUBROUTINES            MTS01030
*******************************************************************           MTS01040
*                                                                 *            MTS01050
* EQUATE TABLES                                                                MTS01060
*******************************************************************           MTS01070
        COPY    MTSDREQU           GET BUFFER3 EQUATES                         MTS01080
*******************************************************************           MTS01090
* PARAMETER LIST FOR MTSDRMCH                                     *            MTS01100
*******************************************************************           MTS01110
MCHPARM EQU     *                                                              MTS01120
DMSTAT  DATA    F'0'               ADDRESS OF CURRENT DMS STATUS VECTOR        MTS01130
TCBAREA DATA    F'0'               ADDRESS OF TASK CONTROL BLOCK               MTS01140
CCYVECAD DATA   F'0'               ADDRESS OF PROCESS VECTOR TO BE MATCHED     MTS01150
        DATA    A(RETCODE4)        ADDRESS OF RETURN CODE AREA                 MTS01160
        END
*************** MTS MODULE PROLOG *********************************           MTS00010
*                                                                              MTS00020
* SUBROUTINE NAME: MTSDRSSV                                                    MTS00030
*                                                                              MTS00040
* LEVEL: 01                                                                    MTS00050
*                                                                              MTS00060
* FUNCTION: PROCESS BASIC SIGNAL SET AND NOT SIGNAL SETS                       MTS00070
*                                                                              MTS00080
* INPUT PARAMETERS:                                                            MTS00090
* 1.   ADDRESS OF PROCESS DEFINITION BUFFER3                                   MTS00100
* 2.   ADDRESS OF CURRENT DMS STATUS VECTOR                                    MTS00110
* 3.   ADDRESS OF TASK CONTROL BLOCK                                           MTS00120
* 4.   ADDRESS OF CURRENT PROCESS VECTOR                                       MTS00130
* 5.   ADDRESS OF ETS TIME VALUE                                               MTS00140
* 6.   ADDRESS OF RUNNING TIME OVERFLOW COUNT                                  MTS00150
* 7.   ADDRESS OF NOT PROCESS VECTOR FLAG                                      MTS00160
* 8.   ADDRESS OF PROCESS VECTOR INDEX                                         MTS00170
* 9.   ADDRESS OF RESULT TIME                                                  MTS00180
*10.   ADDRESS OF TIME FLAG                                                    MTS00190
*11.   ADDRESS OF RETURN CODE AREA                                             MTS00200
*                                                                              MTS00210
* OUTPUT PARAMETERS:                                                           MTS00220
* 1.   ADDRESS OF CURRENT DMS STATUS VECTOR                                    MTS00230
* 2.   ADDRESS OF TASK CONTROL BLOCK                                           MTS00240
* 3.   ADDRESS OF CURRENT PROCESS VECTOR                                       MTS00250
* 4.   ADDRESS OF PROCESS DEFINITION BUFFER3                                   MTS00260
* 5.   ADDRESS OF ETS TIME VALUE                                               MTS00270
* 6.   ADDRESS OF RUNNING TIME OVERFLOW COUNT                                  MTS00280
```

```
* 7.  ADDRESS OF PROCESS VECTOR INDEX                                           MTS00290
* 8.  ADDRESS OF RESULT TIME                                                    MTS00300
* 9.  ADDRESS OF TIME FLAG                                                      MTS00310
*10.  ADDRESS OF RETURN CODE AREA                                               MTS00320
*                                                                               MTS00330
* PROGRAMS LOADED: NONE                                                         MTS00340
*                                                                               MTS00350
* SUBROUTINES CALLED: MTSDRMCH, MTSDRTIM                                        MTS00360
*                                                                               MTS00370
* SUBTASKS ATTACHED: NONE                                                       MTS00380
*                                                                               MTS00390
* DATA SETS USED: NONE                                                          MTS00400
*                                                                               MTS00410
* RETURN CODES:  -1=NO PROBLEMS, 0=NO MATCH                                     MTS00420
*                                                                               MTS00430
* ERROR EXITS: NONE                                                             MTS00440
*                                                                               MTS00450
***********************************************************************        MTS00460
          ENTRY    MTSDRSSV                                                     MTS00470
          SUBROUT  MTSDRSSV,PARMADDR                                            MTS00480
          MOVE     SAVEREGS,#1,2      SAVE CONTENTS OF REG #1 & #2              MTS00490
***********************************************************************        MTS00500
* SET UP INPUT PARM LIST AND GET INPUT PARMS                           *        MTS00510
***********************************************************************        MTS00520
          MOVE     #1,PARMADDR        GET INPUT PARMS FROM MTSDRPVC             MTS00530
          MOVE     INPARMS,(0,#1),11                                            MTS00540
          MOVE     PRVCBUF,PRVBUFAD   MOVE PROCESS DEF BUFFER3 ADDRESS          MTS00550
          MOVE     DMSTAT,DMSTATAD    MOVE CURRENT DMS STAT VECTOR ADR          MTS00560
          MOVE     TCBAREA,TCBAD      MOVE TASK CONTROL BLOCK ADDRESS           MTS00570
          MOVE     ETSDTA,ETSDTAD     MOVE ETS TIME VALUE ADDRESS               MTS00580
          MOVE     OVFLCNT,OVFLCTAD   MOVE RUNNIG TIME OVFLOW CT ADDR           MTS00590
          MOVE     PROCINDX,PRCINDAD  MOVE PROCESS VECTOR INDEX ADDR            MTS00600
          MOVE     RSLTIM,RSLTIMAD    MOVE RESULT TIME ADDRESS                  MTS00610
          MOVE     TIMFLG,TIMFLGAD    MOVE TIME FLAG ADDRESS                    MTS00620
          MOVE     #1,NOTFLGAD        GET NOT PROCESS VECTOR FLAG               MTS00630
          MOVE     NOTFLG,(0,#1)                                                MTS00640
***********************************************************************        MTS00650
* PROCESS SIGNAL SET AND NOT SIGNAL SET VECTORS                        *        MTS00660
***********************************************************************        MTS00670
          MOVE     SSVECAD,PRCVECAD   GET CURRENT PROCESS VECTOR                MTS00680
          CALL     MTSDRMCH,(MCHPARM) GO CHECK FOR VECTOR MATCH                 MTS00690
          IF       (NOTFLG,EQ,1),THEN TEST FOR NOT VECTOR                      MTS00700
             EOR      RETCODE4,X'FFFF'   REVERSE MATCH RETURN CODE              MTS00710
             MOVE     NOTFLG,0           RESET NOT FLAG                         MTS00720
          ENDIF                                                                 MTS00730
          IF       (RETCODE4,EQ,-1),THEN                                        MTS00740
             CALL     MTSDRTIM,(TIMPARM) GO CALCULATE RESULT TIME               MTS00750
          ENDIF                                                                 MTS00760
***********************************************************************        MTS00770
* UPDATE INPUT PARMS                                                   *        MTS00780
***********************************************************************        MTS00790
          MOVE     #1,NOTFLGAD        RETURN NOT FLAG                           MTS00800
          MOVE     (0,#1),NOTFLG                                                MTS00810
          MOVE     #1,RETCODE3        SET PVC RETURN CODE                       MTS00820
          MOVE     (0,#1),RETCODE4                                              MTS00830
          MOVE     #1,SAVEREGS,2      RESTORE CONTENTS OF REG #1 & #2           MTS00840
          RETURN                                                                MTS00850
***********************************************************************        MTS00860
* EXTRN LIST                                                           *        MTS00870
***********************************************************************        MTS00880
          EXTRN    MTSDRMCH,MTSDRTIM                                            MTS00890
***********************************************************************        MTS00900
*    PARAMETER LIST SENT TO THIS ROUTINE BY CALLER                     *        MTS00910
***********************************************************************        MTS00920
INPARMS   EQU      *                  PARAMETER LIST POINTER                    MTS00930
PRVBUFAD  DATA     F'0'               ADDRESS OF PROCESS DEFINITION BUFFER3     MTS00940
DMSTATAD  DATA     F'0'               ADDRESS OF CURRENT DMS STATUS VECTOR      MTS00950
TCBAD     DATA     F'0'               ADDRESS OF TASK CONTROL BLOCK             MTS00960
PRCVECAD  DATA     F'0'               ADDRESS OF CURRENT PROCESS VECTOR         MTS00970
ETSDTAD   DATA     F'0'               ADDRESS OF ETS TIME VALUE                 MTS00980
OVFLCTAD  DATA     F'0'               ADDRESS OF RUNNING TIME OVERFLOW COUNT    MTS00990
```

```
NOTFLGAD  DATA      F'0'         ADDRESS OF NOT PROCESS VECTOR FLAG           MTS01000
PRCINDAD  DATA      F'0'         ADDRESS OF PROCESS VECTOR INDEX              MTS01010
TIMFLGAD  DATA      F'0'         ADDRESS OF TIME FLAG                         MTS01020
RSLTIMAD  DATA      F'0'         ADDRESS OF RESULT TIME                       MTS01030
RETCODE3  DATA      F'0'         ADDRESS OF RETURN CODE AREA FOR CALLER       MTS01040
***************************************************************************  MTS01050
*   DATA CONSTANTS AREA                                                   *   MTS01060
***************************************************************************  MTS01070
SAVEREGS  DATA      2F'0'        REGISTER #1 & #2 SAVE AREA                   MTS01080
NOTFLG    DATA      F'0'         NOT PROCESS VECTOR FLAG                      MTS01090
RETCODE4  DATA      F'0'         RETURN CODE FOR SUBROUTINES                  MTS01100
***************************************************************************  MTS01110
* PARAMETER LIST FOR MTSDRMCH                                             *   MTS01120
***************************************************************************  MTS01130
MCHPARM   EQU       *                                                         MTS01140
DMSTAT    DATA      F'0'         ADDRESS OF CURRENT DMS STATUS VECTOR         MTS01150
TCBAREA   DATA      F'0'         ADDRESS OF TASK CONTROL BLOCK                MTS01160
SSVECAD   DATA      F'0'         ADDRESS OF PROCESS VEC TO BE MATCHED         MTS01170
          DATA      A(RETCODE4)  ADDRESS OF RETURN CODE FOR SSV               MTS01180
***************************************************************************  MTS01190
* PARAMETER LIST FOR MTSDRTIM                                             *   MTS01200
***************************************************************************  MTS01210
TIMPARM   EQU       *                                                         MTS01220
PRVCBUF   DATA      F'0'         ADDRESS OF PROCESS DEFINITION BUFFER3        MTS01230
ETSDTA    DATA      F'0'         ADDRESS OF ETS TIME VALUE                    MTS01240
OVFLCNT   DATA      F'0'         ADDRESS OF RUNNING TIME OVERFLOW CT          MTS01250
PROCINDX  DATA      F'0'         ADDRESS OF PROCESS VECTOR INDEX              MTS01260
RSLTIM    DATA      F'0'         ADDRESS OF RESULT TIME                       MTS01270
TIMFLG    DATA      F'0'         ADDRESS OF TIME FLAG                         MTS01280
          DATA      A(RETCODE4)  ADDRESS OF RETURN CODE FOR SSV               MTS01290
          END                                                                 MTS01300
*************** MTS MODULE PROLOG *****************************************   MTS00010
*                                                                             MTS00020
*                                                                             MTS00030
* SUBROUTINE NAME: MTSDRDLY                                                   MTS00040
*                                                                             MTS00050
* LEVEL: 01                                                                   MTS00060
*                                                                             MTS00070
* FUNCTION: PROCESS DELAY SIGNAL SET                                          MTS00080
*                                                                             MTS00090
* INPUT PARAMETERS:                                                           MTS00100
* 1.   ADDRESS OF TIME DELAY PROCESS VECTOR                                   MTS00110
* 2.   ADDRESS OF ETS TIME VALUE                                              MTS00120
* 3.   ADDRESS OF RUNNING TIME OVERFLOW COUNT                                 MTS00130
* 4.   ADDRESS OF TEST CASE TIME BASE                                         MTS00140
* 5.   ADDRESS OF DELAY FLAG                                                  MTS00150
* 6.   ADDRESS OF DELAY COUNTER                                               MTS00160
* 7.   ADDRESS OF RETURN CODE AREA                                            MTS00170
*                                                                             MTS00180
* OUTPUT PARAMETERS: NONE                                                     MTS00190
*                                                                             MTS00200
* PROGRAMS LOADED: NONE                                                       MTS00210
*                                                                             MTS00220
* SUBROUTINES CALLED: NONE                                                    MTS00230
*                                                                             MTS00240
* SUBTASKS ATTACHED: NONE                                                     MTS00250
*                                                                             MTS00260
* DATA SETS USED: NONE                                                        MTS00270
*                                                                             MTS00280
* RETURN CODES:   -1=DELAY DONE,  0=DELAY NOT DONE                            MTS00290
*                                                                             MTS00300
* ERROR EXITS:  NONE                                                          MTS00310
*                                                                             MTS00320
* REASON:  ORIGINAL VERSION                                                   MTS00330
*                                                                             MTS00340
***************************************************************************  MTS00350
          ENTRY     MTSDRDLY                                                  MTS00360
          SUBROUT   MTSDRDLY,PARMADDR                                         MTS00370
          MOVE      SAVEREGS,#1,2     SAVE CONTENTS OF REG #1 & #2            MTS00380
***************************************************************************  MTS00390
* SET UP INPUT PARM LIST AND GET INPUT PARMS                              *   MTS00400
***************************************************************************  MTS00410
          MOVE      #1,PARMADDR       GET INPUT PARMS FROM MTSDRPVC           MTS00410
```

```
              MOVE      INPARMS,(0,#1),7                              MTS00420
              MOVE      #1,DLYCTRAD       GET DELAY COUNTER           MTS00430
              MOVE      DLYCTR,(0,#1),DWORD                           MTS00440
              MOVE      #1,DLYFLGAD       GET DELAY FLAG              MTS00450
              MOVE      DLYFLG,(0,#1)                                 MTS00460
              MOVE      #1,TCTMBSAD       GET TEST CASE TIME BASE     MTS00470
              MOVE      TCTIMBAS,(0,#1)                               MTS00480
                                                                      MTS00490
    ****************************                                     MTS00500
    * BEGIN PROCESS DELAY TIME *                                     MTS00510
    ****************************
              MOVE      #1,RETCODE3       SET RETURN CODE FOR DELAY IN PROCESS  MTS00520
              MOVE      (0,#1),0                                      MTS00530
              IF        (DLYFLG,EQ,0),THEN    TEST DELAY PROCESS FLAG MTS00540
                 MOVE   #1,DLYVECAD    GET DELAY TIME                 MTS00550
                 ADD    #1,2                                          MTS00560
                 MOVE   DLYCTR+2,(0,#1)    SET DELAY COUNTER          MTS00570
                 MOVE   #1,DLYVECAD    GET DELAY TIME BASE            MTS00580
                 AND    (0,#1),X'0800',RESULT=DLYTIMBS                MTS00590
                 SHIFTL DLYTIMBS,4                                    MTS00600
    * MATCH TEST CASE TIME BASE WITH DELAY TIME BASE *                MTS00610
                 IF     (DLYTIMBS,EQ,0),THEN   IS TIME BASE IN USEC   MTS00620
                    IOR DLYTIMBS,X'1000'    IF SO, SET FOR COMPARE WITH MTS00630
    *                                           TEST CASE TIME BASE   MTS00640
                                                                      MTS00650
                 ENDIF
                 IF     (DLYTIMBS,NE,TCTIMBAS),THEN   COMPARE TIME BASES MTS00660
                    IF     (DLYTIMBS,EQ,X'1000'),THEN    NOT MATCHED, MTS00670
    *                                                   DELAY IN USEC MTS00680
                       DIVIDE DLYCTR,10,PREC=DSD   CHANGE TO 10 USEC BASE MTS00690
                       IF     (TCTIMBAS,NE,X'2000'),THEN              MTS00700
                          DIVIDE DLYCTR,10,PREC=DSD   CHANGE TO 100 USEC BASE MTS00710
                          IF     (TCTIMBAS,NE,X'4000'),THEN           MTS00720
                             DIVIDE DLYCTR,10,PREC=DSD  CHANGE TO MSEC BASE MTS00730
                          ENDIF                                       MTS00740
                       ENDIF                                          MTS00750
                    ELSE                             NOT MATCHED,     MTS00760
    *                                                DELAY IN MSEC    MTS00770
                       MULT   DLYCTR,10,PREC=DSD  CHANGE TO 100 USEC  MTS00780
                       IF     (TCTIMBAS,NE,X'4000'),THEN              MTS00790
                          MULT DLYCTR,10,PREC=DSD   CHANGE TO 10 USEC MTS00800
                          IF     (TCTIMBAS,NE,X'2000'),THEN           MTS00810
                             MULT DLYCTR,10,PREC=DSD   CHANGE TO USEC MTS00820
                          ENDIF                                       MTS00830
                       ENDIF                                          MTS00840
                    ENDIF                                             MTS00850
                 ENDIF                                                MTS00860
    * SET UP DELAY START TIME *                                       MTS00870
                 MOVE   #1,ETSDTAD    GET CURRENT RUNNING TIME        MTS00880
                 MOVE   DLYSTTIM+2,(0,#1)  SET DELAY START TIME       MTS00890
                 MOVE   #1,OVFLCTAD   GET CURRENT OVERFLOW COUNT      MTS00900
                 MOVE   DLSTOVFL,(0,#1),DWORD                         MTS00910
                 MOVE   DLYFLG,1   SET DELAY FLAG FOR DELAY IN PROCESS MTS00920
              ELSE                                                    MTS00930
    * GET TIME ELAPSED *                                              MTS00940
                 MOVE   #1,ETSDTAD    GET CURRENT RUNNING TIME        MTS00950
                 MOVE   CURTIM+2,(0,#1)                               MTS00960
                 MOVE   #1,OVFLCTAD   GET CURRENT OVERFLOW COUNT      MTS00970
                 MOVE   CUROVFL,(0,#1),DWORD                          MTS00980
                 IF     (DLYSTTIM,GT,CURTIM,DWORD),THEN   TEST RELATIVE MTS00990
    *                                                    NUMBER SIZE  MTS01000
                    ADD  CURTIM,D65536,PREC=DDD   BORROW FROM OVERFLOW MTS01010
                    SUB  CUROVFL,1,PREC=DSD       TIME FOR SUBTRACTION MTS01020
                 ENDIF                                                MTS01030
                 SUB    CURTIM,DLYSTTIM,RESULT=ELPSTIM,PREC=DDD       MTS01040
    *                                             GET ELAPSED TIME    MTS01050
                 SUB    CUROVFL,DLSTOVFL,RESULT=ELPSOVFL,PREC=DDD     MTS01060
    *                                             GET ELAPSED OVERFLOW TIME MTS01070
                 SHIFTL ELPSOVFL,4        ADD OVERFLOW TO ELAPSED TIME MTS01080
                 ADD    ELPSTIM,ELPSOVFL                              MTS01090
    * CHECK FOR END OF DELAY *                                        MTS01100
                 IF     (ELPSTIM,EQ,DLYCTR,DWORD),OR,                *MTS01110
                        (ELPSTIM,GT,DLYCTR,DWORD),THEN   TEST FOR DELAY DONE MTS01120
                    MOVE   #1,RETCODE3  SET RETURN CODE FOR DELAY DONE MTS01130
```

```
            MOVE        (0,#1),-1                              MTS01140
            MOVE        DLYFLG,0      CLEAR DELAY FLAG         MTS01150
            MOVE        ELPSTIM,0,DWORD   CLEAR TIME COUNTERS  MTS01160
            MOVE        CURTIM,0,DWORD                         MTS01170
          ENDIF                                                MTS01180
        ENDIF                                                  MTS01190
***************************************************************  MTS01200
* UPDATE INPUT PARMS                                        *  MTS01210
***************************************************************  MTS01220
        MOVE    #1,DLYCTRAD       RETURN DELAY COUNTER         MTS01230
        MOVE    (0,#1),DLYCTR,DWORD                            MTS01240
        MOVE    #1,DLYFLGAD       RETURN DELAY FLAG            MTS01250
        MOVE    (0,#1),DLYFLG                                  MTS01260
        MOVE    #1,SAVEREGS,2     RESTORE CONTENTS OF REG #1 & #2  MTS01270
        RETURN                                                 MTS01280
***************************************************************  MTS01290
*   EXTRN LIST                                              *  MTS01300
***************************************************************  MTS01310
***************************************************************  MTS01320
*   PARAMETER LIST SENT TO THIS ROUTINE BY CALLER           *  MTS01330
***************************************************************  MTS01340
INPARMS EQU     *              PARAMETER LIST POINTER          MTS01350
DLYVECAD DATA   F'0'           ADDRESS OF TIME DELAY PROCESS VECTOR  MTS01360
ETSDTAD  DATA   F'0'           ADDRESS OF ETS TIME VALUE       MTS01370
OVFLCTAD DATA   F'0'           ADDRESS OF RUNNING TIME OVERFOW CT  MTS01380
TCTMBSAD DATA   F'0'           ADDRESS OF TEST CASE TIME BASE  MTS01390
DLYCTRAD DATA   F'0'           ADDRESS OF DELAY COUNTER        MTS01400
DLYFLGAD DATA   F'0'           ADDRESS OF DELAY FLAG           MTS01410
RETCODE3 DATA   F'0'           ADDRESS OF RETURN CODE AREA FOR PVC  MTS01420
***************************************************************  MTS01430
*   DATA CONSTANTS AREA                                     *  MTS01440
***************************************************************  MTS01450
SAVEREGS DATA   2F'0'          REGISTER #1 & #2 SAVE AREA      MTS01460
DLYCTR   DATA   D'0'           DELAY COUNTER                   MTS01470
DLYFLG   DATA   F'0'           DELAY FLAG                      MTS01480
TCTIMBAS DATA   F'0'           TEST CASE TIME BASE             MTS01490
DLYTIMBS DATA   F'0'           DELAY TIME BASE                 MTS01500
DLYSTTIM DATA   D'0'           DELAY START TIME                MTS01510
CURTIM   DATA   D'0'           CURRENT TIME                    MTS01520
ELPSTIM  DATA   D'0'           ELAPSED TIME                    MTS01530
DLSTOVFL DATA   D'0'           DELAY START TIME OVERFLOW       MTS01540
CUROVFL  DATA   D'0'           CURRENT TIME OVERFLOW           MTS01550
ELPSOVFL DATA   D'0'           ELAPSED TIME OVERFLOW           MTS01560
D65536   DATA   D'65536'       EQUATE FOR DOUBLEWORD VALUE 65,536  MTS01570
         END                                                   MTS01580
**************** MTS MODULE PROLOG ****************************  MTS00010
*                                                              MTS00020
* SUBROUTINE NAME: MTSDRPLS                                    MTS00030
*                                                              MTS00040
* LEVEL: 01                                                    MTS00050
*                                                              MTS00060
* FUNCTION:  PROCESS MULTIPLE SIGNAL TRANSITION SIGNAL SET     MTS00070
*                                                              MTS00080
* INPUT PARAMETERS:                                            MTS00090
* 1.  ADDRESS OF CURRENT DMS STATUS VECTOR                     MTS00100
* 2.  ADDRESS OF TASK CONTROL BLOCK                            MTS00110
* 3.  ADDRESS OF MULTIPLE TRANSITION PROCESS VECTOR            MTS00120
* 4.  ADDRESS OF MULTIPLE TRANSITION COUNTER                   MTS00130
* 5.  ADDRESS OF MULTIPLE TRANSITION FLAG                      MTS00140
* 6.  ADDRESS OF RETURN CODE AREA                              MTS00150
*                                                              MTS00160
* OUTPUT PARAMETERS:                                           MTS00170
* 1.  ADDRESS OF CURRENT DMS STATUS VECTOR                     MTS00180
* 2.  ADDRESS OF TASK CONTROL BLOCK                            MTS00190
* 3.  ADDRESS OF MULTIPLE TRANSITION PROCESS VECTOR            MTS00200
* 4.  ADDRESS OF RETURN CODE AREA                              MTS00210
*                                                              MTS00220
* PROGRAMS LOADED: NONE                                        MTS00230
*                                                              MTS00240
* SUBROUTINES CALLED: MTSDRMCH                                 MTS00250
*                                                              MTS00260
* SUBTASKS ATTACHED: NONE                                      MTS00270
```

```
*                                                                       MTS00280
* DATA SETS USED: NONE                                                  MTS00290
*                                                                       MTS00300
* RETURN CODES:  -1=COUNT DONE, 0=COUNT NOT DONE                        MTS00310
*                                                                       MTS00320
* ERROR EXITS:  NONE                                                    MTS00330
*                                                                       MTS00340
* REASON: ORIGINAL VERSION                                              MTS00350
*                                                                       MTS00360
************************************************************************ MTS00370
      ENTRY    MTSDRPLS                                                 MTS00380
      SUBROUT  MTSDRPLS,PARMADDR                                        MTS00390
      MOVE     SAVEREGS,#1,2     SAVE CONTENTS OF REG #1 & #2           MTS00400
************************************************************************ MTS00410
* SET UP INPUT PARM LIST AND GET INPUT PARMS                          * MTS00420
************************************************************************ MTS00430
      MOVE     #1,PARMADDR       GET INPUT PARMS FROM MTSDRPVC          MTS00440
      MOVE     INPARMS,(0,#1),6                                         MTS00450
      MOVE     MULVEC,MULVECAD   MOVE MULT TRANS PROCESS VECTOR ADDR    MTS00460
      MOVE     DMSTAT,DMSTATAD   MOVE CURRENT DMS STAT VECTOR ADDR      MTS00470
      MOVE     TCBAREA,TCBAD     MOVE TASK CONTROL BLOCK ADDRESS        MTS00480
      MOVE     #1,MTNSCTAD       GET MULTIPLE TRANSITION COUNTER        MTS00490
      MOVE     MTNSCTR,(0,#1)                                           MTS00500
      MOVE     #1,MULFLGAD       GET MULTIPLE TRANSITION FLAG           MTS00510
      MOVE     MULFLG,(0,#1)                                            MTS00520
************************************************************************ MTS00530
* PROCESS MULTIPLE SIGNAL TRANSITION VECTOR                           * MTS00540
************************************************************************ MTS00550
      IF       (MULFLG,EQ,0),THEN   TEST MULT TRANS PROCESS FLAG        MTS00560
        MOVE   #1,MULVECAD       GET NO. OF TRANSITIONS                 MTS00570
        ADD    #1,2                                                     MTS00580
        MOVE   MTNSCTR,(0,#1)    SET MULTIPLE TRANSITION CTR            MTS00590
        MOVE   #1,RETCODE3       SET RET CODE FOR COUNTING              MTS00600
        MOVE   (0,#1),0                                                 MTS00610
        MOVE   MULFLG,1          SET MULT TRANS PROCESS FLAG            MTS00620
      ENDIF                                                             MTS00630
      CALL     MTSDRMCH,(MCHPARM) GO CHECK FOR VECTOR MATCH             MTS00640
      IF       (RETCODE4,EQ,-1),THEN                                    MTS00650
        IF     (TRNSFLG,EQ,0),THEN  TEST TRANSITION FLAG                MTS00660
          MOVE TRNSFLG,1         SET  TRANSITION FLAG                   MTS00670
          SUB  MTNSCTR,1         DECREMENT TRANSITION CTR               MTS00680
        ENDIF                                                           MTS00690
      ELSE                                                              MTS00700
        IF     (TRNSFLG,EQ,1),THEN  TEST TRANSITION FLAG                MTS00710
          MOVE TRNSFLG,0         RESET TRANSITION FLAG                  MTS00720
        ENDIF                                                           MTS00730
        IF     (MTNSCTR,EQ,0),THEN  TEST TRANS COUNTER                  MTS00740
          MOVE #1,RETCODE3       SET RET CODE FOR COUNT DONE            MTS00750
          MOVE (0,#1),-1                                                MTS00760
          MOVE MULFLG,0          RESET MULT TRANS PROCESS FLAG          MTS00770
        ENDIF                                                           MTS00780
      ENDIF                                                             MTS00790
************************************************************************ MTS00800
* UPDATE INPUT PARMS                                                  * MTS00810
************************************************************************ MTS00820
      MOVE     #1,MTNSCTAD       RETURN MULTIPLE TRANSITION COUNTER     MTS00830
      MOVE     (0,#1),MTNSCTR                                           MTS00840
      MOVE     #1,MULFLGAD       RETURN MULTIPLE TRANSITION FLAG        MTS00850
      MOVE     (0,#1),MULFLG                                            MTS00860
      MOVE     #1,SAVEREGS,2     RESTORE CONTENTS OF REG #1 & #2        MTS00870
      RETURN                                                            MTS00880
************************************************************************ MTS00890
*   EXTRN LIST                                                        * MTS00900
************************************************************************ MTS00910
      EXTRN    MTSDRMCH                                                 MTS00920
************************************************************************ MTS00930
*   PARAMETER LIST SENT TO THIS ROUTINE BY CALLER                     * MTS00940
************************************************************************ MTS00950
INPARMS   EQU      *      PARAMETER LIST POINTER                        MTS00960
DMSTATAD  DATA     F'0'   ADDRESS OF CURRENT DMS STATUS VECTOR          MTS00970
TCBAD     DATA     F'0'   ADDRESS OF TASK CONTROL BLOCK                 MTS00980
MULVECAD  DATA     F'0'   ADDRESS OF MULTIPLE TRANSITION PROCESS VECTOR MTS00990
```

```
MTNSCTAD  DATA      F'0'        ADDRESS OF MULTIPLE TRANSITION COUNTER          MTS01000
MULFLGAD  DATA      F'0'        ADDRESS OF MULTIPLE TRANSITION FLAG             MTS01010
RETCODE3  DATA      F'0'        ADDRESS OF RETURN CODE AREA FOR PVC             MTS01020
***********************************************************************        MTS01030
*   DATA CONSTANTS AREA                                                *        MTS01040
***********************************************************************        MTS01050
SAVEREGS  DATA      2F'0'       REGISTER #1 & #2 SAVE AREA                      MTS01060
TRNSFLG   DATA      F'0'        TRANSITION FLAG                                 MTS01070
MULFLG    DATA      F'0'        MULTIPLE FLAG                                   MTS01080
MTNSCTR   DATA      F'0'        MULTIPLE TRANSITION COUNTER                     MTS01090
RETCODE4  DATA      F'0'        RETURN CODE AREA FOR SUBROUTINES                MTS01100
***********************************************************************        MTS01110
* PARAMETER LIST FOR MTSDRMCH                                          *        MTS01120
***********************************************************************        MTS01130
                                                                                MTS01140
MCHPARM   EQU       *                                                           MTS01150
DMSTAT    DATA      F'0'        ADDRESS OF CURRENT DMS STATUS VECTOR            MTS01160
TCBAREA   DATA      F'0'        ADDRESS OF TASK CONTROL BLOCK                   MTS01170
MULVEC    DATA      F'0'        ADDRESS OF PROCESS VECTOR TO BE MATCHED         MTS01180
          DATA      A(RETCODE4) ADDRESS OF RETURN CODE AREA                     MTS01190
          END
***************** MTS MODULE PROLOG ***********************************         MTS00010
*                                                                               MTS00020
* SUBROUTINE NAME: MTSDRADC                                                     MTS00030
*                                                                               MTS00040
* LEVEL: 01                                                                     MTS00050
*                                                                               MTS00060
* FUNCTION:   PROCESS ADDRESS COMPARE SIGNAL SETS                               MTS00090
*                                                                               MTS00100
* INPUT PARAMETERS:                                                             MTS00110
* 1.  ADDRESS OF ADDRESS COMPARE PROCESS VECTOR                                 MTS00120
* 2.  ADDRESS OF CURRENT ADDRESS COMPARE                                        MTS00130
* 3.  ADDRESS OF CURRENT ADDRESS COMPARE TIME                                   MTS00140
* 4.  ADDRESS OF VALID ADDRESS TABLE                                            MTS00150
* 5.  ADDRESS OF ERROR FLAG FOR ADDRESS COMPARE                                 MTS00160
* 6.  ADDRESS OF ADDRESS COMPARE TABLE FLAG                                     MTS00170
* 7.  ADDRESS OF TEST CASE HEADER RECORD                                        MTS00180
* 8.  ADDRESS OF PROCESS DEFINITION BUFFER3                                     MTS00190
* 9.  ADDRESS OF RUNNING TIME OVERFLOW COUNT                                    MTS00200
*10.  ADDRESS OF PROCESS VECTOR INDEX                                           MTS00210
*11.  ADDRESS OF RESULT TIME                                                    MTS00220
*12.  ADDRESS OF TIME FLAG                                                      MTS00230
*13.  ADDRESS OF RETURN CODE AREA                                               MTS00240
*                                                                               MTS00250
* OUTPUT PARAMETERS:                                                            MTS00260
* 1.  ADDRESS OF PROCESS DEFINITION BUFFER3                                     MTS00270
* 2.  ADDRESS OF CURRENT ADDRESS COMPARE TIME                                   MTS00280
* 3.  ADDRESS OF RUNNING TIME OVERFLOW COUNT                                    MTS00290
* 4.  ADDRESS OF PROCESS VECTOR INDEX                                           MTS00300
* 5.  ADDRESS OF RESULT TIME                                                    MTS00310
* 6.  ADDRESS OF TIME FLAG                                                      MTS00320
* 7.  ADDRESS OF RETURN CODE AREA                                               MTS00330
*                                                                               MTS00340
* PROGRAMS LOADED: NONE                                                         MTS00350
*                                                                               MTS00360
* CALLED SUBROUTINES: MTSDRTIM                                                  MTS00370
*                                                                               MTS00380
* INTERNAL SUBROUTINES: ADRVER                                                  MTS00390
*                                                                               MTS00400
* SUBTASKS ATTACHED: NONE                                                       MTS00410
*                                                                               MTS00420
* DATA SETS USED: NONE                                                          MTS00430
*                                                                               MTS00440
* RETURN CODES:  NONE                                                           MTS00450
*                                                                               MTS00460
* ERROR EXITS:  NONE                                                            MTS00470
*                                                                               MTS00480
* REASON:  ORIGINAL VERSION                                                     MTS00490
*                                                                               MTS00500
***********************************************************************        MTS00510
          ENTRY     MTSDRADC                                                    MTS00520
          SUBROUT   MTSDRADC,PARMADDR                                           MTS00530
          MOVE      SAVEREGS,#1,2       SAVE CONTENTS OF REG #1 & #2            MTS00540
```

```
**************************************************************** MTS00550
*                                                              * MTS00560
* SET UP INPUT PARM LIST AND GET INPUT PARMS                   * MTS00570
****************************************************************
        MOVE    #1,PARMADDR     GET INPUT PARMS FROM MTSDRPVC    MTS00580
        MOVE    INPARMS,(0,#1),13                                MTS00590
        MOVE    PRVCBUF,PRVBUFAD    MOVE PROCESS DEFINITION BUFFER3  MTS00600
        MOVE    PRVCBUF1,PRVBUFAD                                MTS00610
        MOVE    ADDRTIME,ADRTIMAD   MOVE ADDRESS COMPARE TIME    MTS00620
        MOVE    OVFLCNT,OVFLCTAD    MOVE RUNNING TIME OVERFLOW CT MTS00630
        MOVE    PROCINDX,PRCINDAD   MOVE PROCESS VECTOR INDEX    MTS00640
        MOVE    RSLTIM,RSLTIMAD     MOVE RESULT TIME             MTS00650
        MOVE    TIMFLG,TIMFLGAD     MOVE TIME FLAG               MTS00660
****************************************************************  MTS00670
* PROCESS ADDRESS COMPARE VECTORS                              * MTS00680
****************************************************************  MTS00690
        MOVE    #1,RETCODE3   SET RET CODE FOR ADDRESS MATCH FOUND  MTS00700
        MOVE    (0,#1),-1                                        MTS00710
        MOVE    #1,ADRVECAD     GET CURRENT PROCESS VECTOR       MTS00720
        MOVE    TYPE,(0,#1)     FIND VECTOR TYPE                 MTS00730
        AND     TYPE,X'F000'                                     MTS00740
        SHIFTR  TYPE,12                                          MTS00750
        DIVIDE  TYPE,3,RESULT=INDEX   OBTAIN INDEX FOR CASE STATEMENT  MTS00760
        IF      (VERFLG,EQ,0),THEN   TEST IF ADDR VALIDITY HAS BEEN MTS00770
*                                    CHECKED                     MTS00780
           MOVE   #1,VALIDADR   GET VALID ADDRESS TABLE          MTS00790
           MOVE   TABSTAT,(2,#1)                                 MTS00800
           IF     (TABSTAT,EQ,X'0100'),THEN   TEST FOR VALID ADDR MTS00810
              MOVE   #1,ADRERRFL                 TABLE OVERFLOW  MTS00820
              IOR    (0,#1),2                                    MTS00830
           ENDIF                                                 MTS00840
        ENDIF                                                    MTS00850
        IF      (VERFLG,EQ,0),THEN                               MTS00860
           CALL    ADRVER      CALL ADDR VERIFY ROUTINE          MTS00870
           AND     ADRERRFL,1,RESULT=PROCERR                     MTS00880
           IF      (PROCERR,EQ,1),THEN  TEST FOR ADDRESS MIS-MATCH MTS00890
              MOVE    INDEX,0   SET INDEX TO END PROCESSING      MTS00900
           ENDIF                                                 MTS00910
        ENDIF                                                    MTS00920
        GOTO    (ERROR,SINGLADR,ADRTABL),INDEX                   MTS00930
ERROR   EQU     *               CASE 1                           MTS00940
        GOTO    ENDCASE                                          MTS00950
SINGLADR EQU    *               CASE 2                           MTS00960
        MOVE    #1,ADRVECAD     GET CURRENT PROCESS VECTOR       MTS00970
        MOVE    PROCADR,(0,#1),(4,BYTE)  GET PROC VEC ADDR COMPARE MTS00980
        AND     PROCADR,X'00FF'   ISOLATE HIGH ORDER ADDRESS     MTS00990
        MOVE    #2,ADDRCPAD     GET CURRENT ADDRESS COMPARE      MTS01000
        MOVE    ADDRCOMP,(0,#2),(4,BYTE)                         MTS01010
        IF      (PROCADR,NE,ADDRCOMP,DWORD),THEN  CHECK ADDR MATCH MTS01020
           MOVE    #1,RETCODE3  SET RET CODE FOR NO ADDRESS MATCH MTS01030
           MOVE    (0,#1),0                                      MTS01040
        ENDIF                                                    MTS01050
        GOTO    ENDCASE                                          MTS01060
ADRTABL EQU     *               CASE 3                           MTS01070
        MOVE    #1,PRVCBUF      GET PROCESS DEFINITION BUFFER3   MTS01080
        MOVE    LOOPCTR,(ADDRCNT,#1)   SET LOOP CTR TO NUMBER OF MTS01090
*                                      ADDRESS TABLE ENTRIES     MTS01100
        MOVE    #2,ADDRCPAD     GET CURRENT ADDRESS COMPARE      MTS01110
        MOVE    ADDRCOMP,(0,#2),(4,BYTE)                         MTS01120
        DO      UNTIL,(LOOPCTR,EQ,0)   CHECK ADDRESS MATCH       MTS01130
           MOVE   PROCADR,(+ADDRTBLE,#1),(4,BYTE) GET ADR TABL ENTRY MTS01140
           IF     (PROCADR,EQ,ADDRCOMP,DWORD),THEN               MTS01150
              MOVE    LOOPCTR,0   SET LOOP COUNTER TO QUIT       MTS01160
              MOVE    #1,TBLFLG    SET ADDRESS COMPARE TABLE FLAG MTS01170
              MOVE    (0,#1),1                                   MTS01180
           ELSE                                                  MTS01190
              SUB     LOOPCTR,1 DECREMENT LOOP COUNTER           MTS01200
              IF      (LOOPCTR,EQ,0),THEN  CHECK FOR END OF TABLE MTS01210
                 MOVE    #1,RETCODE3  SET RET CODE FOR NO ADDR MATCH MTS01220
                 MOVE    (0,#1),0                                MTS01230
              ELSE                                               MTS01240
                 ADD     #1,4       POINT AT NEXT ADDRESS TABLE ENTRY MTS01250
              ENDIF                                              MTS01260
```

```
              ENDIF                                                    MTS01270
           ENDDO                                                       MTS01280
           GOTO      ENDCASE                                           MTS01290
ENDCASE    EQU       *                                                 MTS01300
           MOVE      #1,RETCODE3                                       MTS01310
           IF        ((0,#1),EQ,-1),THEN  TEST FOR ADDR MATCH          MTS01320
              CALL      MTSDRTIM,(TIMPARM)  GO CALCULATE RESULT TIME   MTS01330
           ENDIF                                                       MTS01340
           MOVE      #1,SAVEREGS,2  RESTORE CONTENTS OF REG #1 & #2    MTS01350
           RETURN                                                      MTS01360
***********************************************************************MTS01370
* SUBROUTINE TO VERIFY VALIDITY OF ADDRESS COMPARE USER ENTRIES      * MTS01380
* WITH TEST CASE ADDRESS COMPARES IN VALID ADDRESS TABLE             * MTS01390
***********************************************************************MTS01400
           SUBROUT   ADRVER                                            MTS01410
           IF        (TYPE,EQ,4),THEN                                  MTS01420
              MOVE      USRCTR,1   SET CTR FOR ONE SEARCH THRU TABLE   MTS01430
              MOVE      #2,ADRVECAD  POINT AT USER ADDRESS             MTS01440
           ELSE                                                        MTS01450
              IF        (TYPE,EQ,6),THEN                               MTS01460
                 MOVE      #2,PRVCBUF  GET NO OF ENTRIES IN USER TABLE MTS01470
                 MOVE      USRCTR,(+ADDRCNT,#2)   SET CTR FOR TABLE SEARCH MTS01480
                 ADD       #2,+ADDRTBLE  POINT AT USER TABLE           MTS01490
              ENDIF                                                    MTS01500
           ENDIF                                                       MTS01510
           DO        WHILE,(USRCTR,NE,0)                               MTS01520
              MOVE      PROCADR,(0,#2),(4,BYTE)  GET USER ADDRESS      MTS01530
              AND       PROCADR,X'00FF'  ISOLATE HIGH ORDER ADDRESS    MTS01540
              MOVE      #1,VALIDADR           GET VALID ADDR TABLE     MTS01550
              MOVE      TBLCTR,(0,#1)  GET NO ENTRIES IN VALID ADDR TBL MTS01560
              ADD       #1,4           POINT AT FIRST ADDR IN VALID ADR TBL MTS01570
              DO        WHILE,(TBLCTR,NE,0)                            MTS01580
                 IF        (PROCADR,NE,(0,#1),4),THEN  CHECK FOR VERIFY MTS01590
                    SUB       TBLCTR,1   DECR TABLE COUNTER            MTS01600
                    ADD       #1,4       POINT AT NEXT TABLE ADDRESS   MTS01610
                    IF        (TBLCTR,EQ,0),THEN  CHECK FOR END OF TABLE MTS01620
                       MOVE      #1,ADRERRFL  SET ERROR FLAG IF NO VERIFY MTS01630
                       IOR       (0,#1),1                              MTS01640
                       MOVE      USRCTR,1    SET CTR TO QUIT VERIFY CHECK MTS01650
                    ENDIF                                              MTS01660
                 ELSE                                                  MTS01670
                    MOVE      TBLCTR,0   FOUND ADDRESS, SET CTR TO QUIT MTS01680
                 ENDIF                                                 MTS01690
              ENDDO                                                    MTS01700
              SUB       USRCTR,1  DECREMENT USER ADDRESS COUNTER       MTS01710
              IF        (USRCTR,NE,0),THEN  CHECK FOR END OF USER ADDR MTS01720
                 ADD       #2,4    POINT AT NEXT USER ADDRESS          MTS01730
              ENDIF                                                    MTS01740
           ENDDO                                                       MTS01750
           MOVE      VERFLG,1    SET ADDRESS VERIFY FLAG               MTS01760
           RETURN                                                      MTS01770
***********************************************************************MTS01780
*   EXTRN LIST                                                       * MTS01790
***********************************************************************MTS01800
           EXTRN     MTSDRTIM                                          MTS01810
***********************************************************************MTS01820
* PARAMETER LIST SENT TO THIS ROUTINE BY CALLER                      * MTS01830
***********************************************************************MTS01840
INPARMS    EQU       *          PARAMETER LIST POINTER                 MTS01850
PRVBUFAD   DATA      F'0'       ADDRESS OF PROCESS DEFINITION BUFFER3  MTS01860
ADRVECAD   DATA      F'0'       ADDRESS OF ADDRESS COMPARE PROCESS VECTOR MTS01870
ADDRCPAD   DATA      F'0'       ADDRESS OF CURRENT ADDRESS COMPARE     MTS01880
ADRTIMAD   DATA      F'0'       ADDRESS OF CURRENT ADDRESS COMPARE TIME MTS01890
OVFLCTAD   DATA      F'0'       ADDRESS OF RUNNING TIME OVERFLOW COUNT MTS01900
PRCINDAD   DATA      F'0'       ADDRESS OF PROCESS VECTOR INDEX        MTS01910
RSLTIMAD   DATA      F'0'       ADDRESS OF RESULT TIME                 MTS01920
TIMFLGAD   DATA      F'0'       ADDRESS OF TIME FLAG                   MTS01930
VALIDADR   DATA      F'0'       ADDRESS OF VALID ADDRESS TABLE         MTS01940
ADRERRFL   DATA      F'0'       ADDRESS OF ERROR FLAG FOR ADDRESS COMPARE MTS01950
TBLFLG     DATA      F'0'       ADDRESS OF ADDRESS COMPARE TABLE FLAG  MTS01960
TCHDRAD    DATA      F'0'       ADDRESS OF TEST CASE HEADER RECORD     MTS01970
RETCODE3   DATA      F'0'       ADDRESS OF RETURN CODE FOR CALLER      MTS01980
***********************************************************************MTS01990
*   DATA CONSTANTS AREA                                              * MTS02000
```

```
***************************************************************** MTS02010
SAVEREGS DATA     2F'0'         REGISTER #1 & #2 SAVE AREA          MTS02020
PRVCBUF  DATA     F'0'          PROCESS DEFINITION BUFFER3          MTS02030
TYPE     DATA     F'0'          PROCESS VECTOR TYPE                 MTS02040
VERFLG   DATA     F'0'          ADDRESS VERIFY FLAG                 MTS02050
INDEX    DATA     F'0'          INDEX FOR CASE STATEMENT            MTS02060
PROCADR  DATA     D'0'          PROCESS VECTOR ADDRESS COMPARE      MTS02070
ADDRCOMP DATA     D'0'          CURRENT ADDRESS COMPARE FROM TEST CASE MTS02080
LOOPCTR  DATA     F'0'          LOOP COUNTER                        MTS02090
TCBIT    DATA     F'0'          TEST CASE ADDRESS SIZE INDICATOR    MTS02100
PROCBIT  DATA     F'0'          PROCESS ADDRESS SIZE INDICATOR      MTS02110
TABSTAT  DATA     F'0'          VAID ADDRESS TABLE OVERFLOW INDICATOR MTS02120
USRCTR   DATA     F'0'          TABLE ENTRIES COUNTER FOR USER ADDR TABLE MTS02130
TBLCTR   DATA     F'0'          TABLE ENTRIES COUNTER FOR VALID ADDR TABLE MTS02140
PROCERR  DATA     F'0'          ADDRESS COMPARE ERROR CODE          MTS02150
RETCODE4 DATA     F'0'          RETURN CODE AREA FOR SUBROUTINES    MTS02160
***************************************************************** MTS02170
* EQUATE TABLES                                                  * MTS02180
***************************************************************** MTS02190
         COPY     MTSDREQU      GET BUFFER3 EQUATES                 MTS02200
         COPY     MTSETHDR      GET TEST CASE HEADER RECORD EQUATES MTS02210
***************************************************************** MTS02220
* PARAMETER LIST FOR MTSDRTIM                                    * MTS02230
***************************************************************** MTS02240
TIMPARM  EQU      *                                                 MTS02250
PRVCBUF1 DATA     F'0'          ADDRESS OF PROCESS DEFINITION BUFFER3 MTS02260
ADDRTIME DATA     F'0'          ADDRESS OF CURRENT ADDRESS COMPARE TIME MTS02270
OVFLCNT  DATA     F'0'          ADDRESS OF RUNNING TIME OVERFLOW COUNT MTS02280
PROCINDX DATA     F'0'          ADDRESS OF PROCESS VECTOR INDEX     MTS02290
RSLTIM   DATA     F'0'          ADDRESS OF RESULT TIME              MTS02300
TIMFLG   DATA     F'0'          ADDRESS OF TIME FLAG                MTS02310
         DATA     A(RETCODE4)   ADDRESS OF RETURN CODE              MTS02320
         END                                                        MTS02330
*************** MTS MODULE PROLOG ******************************** MTS00010
*                                                                   MTS00020
* SUBROUTINE NAME: MTSDRMCH                                         MTS00030
*                                                                   MTS00040
* LEVEL: 01                                                         MTS00050
*                                                                   MTS00060
* FUNCTION: MATCH SIGNAL SETS TO DMS SIGNALS                        MTS00070
*                                                                   MTS00080
* INPUT PARAMETERS:                                                 MTS00090
* 1.   ADDRESS OF CURRENT DMS STATUS VECTOR                         MTS00100
* 2.   ADDRESS OF TASK CONTROL BLOCK                                MTS00110
* 3.   ADDRESS OF PROCESS VECTOR TO BE MATCHED                      MTS00120
* 4.   ADDRESS OF RETURN CODE AREA                                  MTS00130
*                                                                   MTS00140
* OUTPUT PARAMETERS: NONE                                           MTS00150
*                                                                   MTS00160
* PROGRAMS LOADED: NONE                                             MTS00170
*                                                                   MTS00180
* SUBROUTINES CALLED: NONE                                          MTS00190
*                                                                   MTS00200
* SUBTASKS ATTACHED: NONE                                           MTS00210
*                                                                   MTS00220
* DATA SETS USED: NONE                                              MTS00230
*                                                                   MTS00240
* RETURN CODES:  -1=MATCH, 0=NO MATCH                               MTS00250
*                                                                   MTS00260
* ERROR EXITS: NONE                                                 MTS00270
*                                                                   MTS00280
* REASON: ORIGINAL VERSION                                          MTS00290
*                                                                   MTS00300
***************************************************************** MTS00310
         ENTRY    MTSDRMCH                                          MTS00320
         SUBROUT  MTSDRMCH,PARMADDR                                 MTS00330
         MOVE     SAVEREGS,#1,2    SAVE CONTENTS OF REG #1 & #2     MTS00340
***************************************************************** MTS00350
* SET UP INPUT PARM LIST AND GET INPUT PARMS                     * MTS00360
***************************************************************** MTS00370
         MOVE     #1,PARMADDR      GET INPUT PARMS FROM MTSDRPVC    MTS00380
         MOVE     INPARMS,(0,#1),4                                  MTS00390
```

```
****************************************************************  MTS00400
* MATCH CURRENT PROCESS VECTOR LEVEL TO CURRENT DMS STATUS LEVEL *  MTS00410
****************************************************************  MTS00420
          MOVE      VECCNT,0          INIT PROCESS VECTOR WORD COUNTER   MTS00430
          MOVE      #1,RETCODE4       SET RETURN CODE FOR MATCH FOUND    MTS00440
          MOVE      (0,#1),-1                                             MTS00450
          MOVE      MTCHIND,-1        SET MATCH INDICATOR                MTS00460
          MOVE      #1,MCHADR         GET CURRENT PROCESS VECTOR         MTS00470
          AND       (0,#1),X'07FF',RESULT=SIGNAL  GET CURRENT PROCESS    MTS00480
*                                             VECTOR SIGNAL NO.         MTS00490
          DO        UNTIL,(VECCNT,EQ,4),OR,(MTCHIND,EQ,0)                MTS00500
            AND     (0,#1),X'0800',RESULT=PRVCLEV GET CURRENT PROCESS    MTS00510
*                                             VECTOR SIGNAL LEVEL       MTS00520
                                                                         MTS00530
            SHIFTL  PRVCLEV,4                                            MTS00540
            MOVE    #1,DMSTAT         GET CURRENT DMS STATUS VECTOR      MTS00550
            SUB     SIGNAL,1          GET DMS STATUS VECTOR BYTE POINTER MTS00560
            DIVIDE  SIGNAL,8,RESULT=BYTEPTR                              MTS00570
            MOVE    #2,TCBAREA        GET DMS STATUS VECTOR BIT OFFSET   MTS00580
            MOVE    BITOFSET,(0,#2)                                      MTS00590
            ADD     #1,BYTEPTR                                           MTS00600
            MOVE    WORKINDX,(0,#1),(2,BYTE)  GET DMS STAT VECTOR WORD   MTS00610
            SHIFTL  WORKINDX,BITOFSET,RESULT=DMSLEV  GET DMS SIGNAL      MTS00620
            AND     DMSLEV,X'8000'    GET DMS SIGNAL LEVEL               MTS00630
            IF      (PRVCLEV,NE,DMSLEV),THEN  TEST FOR SIGNAL MATCH      MTS00640
              MOVE  #1,RETCODE4                                          MTS00650
              MOVE  (0,#1),0          SET FOR NO MATCH FOUND             MTS00660
              MOVE  MTCHIND,0         SET MATCH INDICATOR                MTS00670
            ELSE
              ADD   VECCNT,1          INCREMENT PROCESS VECTOR WORD CTR  MTS00680
              ADD   MCHADR,2          INCR CURRENT PROCESS VECTOR ADDR   MTS00690
              IF    (VECCNT,NE,4),THEN  TEST FOR END OF PROC VECTOR      MTS00700
                MOVE  #1,MCHADR       GET NEXT PROCESS VECTOR WORD       MTS00710
                AND   (0,#1),X'07FF',RESULT=SIGNAL                       MTS00720
                IF    (SIGNAL,EQ,0),THEN                                 MTS00730
                  MOVE  VECCNT,4      SET PROCESS VECTOR WORD CTR        MTS00740
*                                     TO END OF VECTOR                  MTS00750
                                                                         MTS00760
                ENDIF                                                    MTS00770
              ENDIF                                                      MTS00780
            ENDIF                                                        MTS00790
          ENDDO
          MOVE      #1,SAVEREGS,2     RESTORE CONTENTS OF REG #1 & #2    MTS00800
          RETURN                                                         MTS00810
****************************************************************  MTS00820
*                                                                *  MTS00830
* EXTRN LIST                                                        MTS00840
****************************************************************  MTS00850
*   PARAMETER LIST SENT TO THIS ROUTINE BY CALLER               *   MTS00860
****************************************************************  MTS00870
INPARMS   EQU       *                 PARAMETER LIST POINTER            MTS00880
DMSTAT    DATA      F'0'              ADDRESS OF CURRENT DMS STATUS VECTOR MTS00890
TCBAREA   DATA      F'0'              ADDRESS OF TASK CONTROL BLOCK     MTS00900
MCHADR    DATA      F'0'              ADDRESS OF PROCESS VECTOR TO BE MATCHED MTS00910
RETCODE4  DATA      F'0'              ADDRESS OF RETURN CODE AREA FOR CALLER MTS00920
****************************************************************  MTS00930
*  DATA CONSTANTS AREA                                          *  MTS00940
****************************************************************  MTS00950
SAVEREGS  DATA      2F'0'             REGISTER #1 & #2 SAVE AREA        MTS00960
SIGNAL    DATA      F'0'              CURRENT PROCESS VECTOR SIGNAL     MTS00970
VECCNT    DATA      F'0'              SIGNAL SET TYPE VECTOR COUNTER    MTS00980
BYTEPTR   DATA      F'0'              DMS STATUS VECTOR WORD POINTER    MTS00990
BITOFSET  DATA      F'0'              DMS STATUS VECTOR WORD OFFSET POINTER MTS01000
DMSLEV    DATA      F'0'              CURRENT DMS SIGNAL STATUS         MTS01010
PRVCLEV   DATA      F'0'              CURRENT PROCESS VECTOR SIGNAL STATUS MTS01020
WORKINDX  DATA      F'0'              WORK INDEX FOR PROCESS VECTOR LOCATORS MTS01030
MTCHIND   DATA      F'0'              MATCH INDICATOR FOR DO LOOP       MTS01040
****************************************************************  MTS01050
*                                                                *  MTS01060
* EQUATE TABLES                                                     MTS01070
****************************************************************  MTS01080
          COPY      MTSDREQU          GET BUFFER3 EQUATES               MTS01090
          END
```

```
**************** MTS MODULE PROLOG ******************************************  MTS00010
*                                                                              MTS00020
* SUBROUTINE NAME: MTSDRTIM                                                    MTS00030
*                                                                              MTS00040
* LEVEL: 01                                                                    MTS00050
*                                                                              MTS00060
* FUNCTION:   CALCULATE RESULT TIME FOR REDUCED DATA VECTOR                    MTS00070
*                                                                              MTS00080
* INPUT PARAMETERS:                                                            MTS00090
* 1.   ADDRESS OF ETS TIME VALUE                                               MTS00100
* 2.   ADDRESS OF RUNNING TIME OVERFLOW COUNT                                  MTS00110
* 3.   ADDRESS OF PROCESS DEFINITION BUFFER3                                   MTS00120
* 4.   ADDRESS OF PROCESS VECTOR INDEX                                         MTS00130
* 5.   ADDRESS OF RESULT TIME                                                  MTS00140
* 6.   ADDRESS OF TIME FLAG                                                    MTS00150
* 7.   ADDRESS OF RETURN CODE AREA                                             MTS00160
*                                                                              MTS00170
* OUTPUT PARAMETERS: NONE                                                      MTS00180
*                                                                              MTS00190
* PROGRAMS LOADED: NONE                                                        MTS00200
*                                                                              MTS00210
* SUBROUTINES CALLED: NONE                                                     MTS00220
*                                                                              MTS00230
* SUBTASKS ATTACHED: NONE                                                      MTS00240
*                                                                              MTS00250
* DATA SETS USED: NONE                                                         MTS00260
*                                                                              MTS00270
* RETURN CODES:   -1=NO PROBLEMS                                               MTS00280
*                                                                              MTS00290
* ERROR EXITS:  NONE                                                           MTS00300
*                                                                              MTS00310
*******************************************************************************MTS00320
         ENTRY    MTSDRTIM                                                     MTS00330
         SUBROUT  MTSDRTIM,PARMADDR                                            MTS00340
         MOVE     SAVEREGS,#1,2     SAVE CONTENTS OF REG #1 & #2               MTS00350
*******************************************************************************MTS00360
* SET UP INPUT PARM LIST AND GET INPUT PARMS                                *  MTS00370
*******************************************************************************MTS00380
         MOVE     #1,PARMADDR       GET INPUT PARMS FROM MTSDRPVC              MTS00390
         MOVE     INPARMS,(0,#1),7                                             MTS00400
         MOVE     #1,PRCINDAD       GET PROCESS VECTOR INDEX                   MTS00410
         MOVE     PROCINDX,(0,#1)                                              MTS00420
         MOVE     #1,RSLTIMAD       GET RESULT TIME                            MTS00430
         MOVE     RSLTIM,(0,#1),DWORD                                          MTS00440
         MOVE     #1,TIMFLGAD       GET TIME FLAG                              MTS00450
         MOVE     TIMFLG,(0,#1)                                                MTS00460
*******************************************************************************MTS00470
* CALCULATE RESULT TIME                                                     *  MTS00480
*******************************************************************************MTS00490
         MOVE     #1,RETCODE4       SET RETURN CODE FOR GOOD TIME              MTS00500
         MOVE     (0,#1),-1                                                    MTS00510
         IF       (TIMFLG,EQ,0),THEN   TEST FOR TIMING IN PROCESS              MTS00520
           MOVE   #1,PRVCBUF        GET PROCESS DEFINITION BUFFER3             MTS00530
           ADD    #1,+PVFROM        POINT AT FROM VECTOR                       MTS00540
           MOVE   FROMVEC,(0,#1)    GET FROM VECTOR                            MTS00550
           MOVE   #1,PRVCBUF                                                   MTS00560
           ADD    #1,+PVTO          POINT AT TO VECTOR                         MTS00570
           MOVE   TOVEC,(0,#1)      GET TO VECTOR                              MTS00580
         ENDIF                                                                 MTS00590
         IF       (FROMVEC,EQ,PROCINDX),THEN   CHECK FOR FROM VECTOR           MTS00600
           MOVE   #1,ETSDTAD        GET CURRENT RUNNING TIME                   MTS00610
           MOVE   FRMTIME+2,(0,#1)  SET FROM TIME                              MTS00620
           MOVE   #1,OVFLCTAD       GET CURRENT OVERFLOW COUNT                 MTS00630
           MOVE   FRMOVFL,(0,#1),DWORD  SET FROM OVERFLOW TIME                 MTS00640
           MOVE   TIMFLG,1          SET TIME FLAG                              MTS00650
         ELSE                                                                  MTS00660
           IF     (TOVEC,EQ,PROCINDX),THEN                                     MTS00670
             MOVE #1,ETSDTAD        GET CURRENT RUNNING TIME                   MTS00680
             MOVE TOTIME+2,(0,#1)   SET TO TIME                                MTS00690
             MOVE #1,OVFLCTAD       GET CURRENT OVERFLOW COUNT                 MTS00700
             MOVE TOOVFL,(0,#1),DWORD  SET TO OVERFLOW TIME                    MTS00710
             IF   (FRMTIME,GT,TOTIME,DWORD),THEN   TEST RELATIVE               MTS00720
```

```
*                                     NUMBER SIZE TO SET UP FOR       MTS00730
*                                     COMPUTING RESULT TIME           MTS00740
            ADD      TOTIME,D65536,PREC=DDD  BORROW FROM OVERFLOW     MTS00750
            SUB      TOOVFL,1,PREC=DSD       TIME FOR SUBTRACTION     MTS00760
         ENDIF                                                        MTS00770
         SUB         TOTIME,FRMTIME,RESULT=RSLTIM,PREC=DDD            MTS00780
*                                     CALC RESULT TIME                MTS00790
         IF          (FRMOVFL,GT,TOOVFL,DWORD),THEN  TEST OVFL        MTS00800
*                                                   COUNT     /C     MTS00810
*           ADD      TOOVFL,1,PREC=DSD  ADJUST IF OVFL CTR   /C      MTS00820
*                                       NOT UP WITH EVENT    /C      MTS00830
*                                       TIMER OVERFLOW       /C      MTS00840
         ENDIF                                                        MTS00850
         SUB         TOOVFL,FRMOVFL,RESULT=RSLOVFL,PREC=DDD           MTS00860
*                                     CALC RESULT OVERFLOW TIME       MTS00870
         IF          (RSLOVFL,GT,D32767,DWORD),THEN  TEST FOR         MTS00880
*                                                   RESULT TIME       MTS00890
*                                                   OVERFLOW          MTS00900
            MOVE     RSLTIM,0,DWORD  PUT OVERFLOW IN RESULT TIME      MTS00910
            ADD      RSLTIM,OVFLVAL,PREC=DDD                          MTS00920
         ELSE                                                         MTS00930
            SHIFTL   RSLOVFL,16,DWORD  ADD OVFLOW TO RESULT TIME      MTS00940
            ADD      RSLTIM,RSLOVFL,PREC=DDD                          MTS00950
         ENDIF                                                        MTS00960
         MOVE        FRMTIME,0,DWORD  CLEAR FROM TIME                 MTS00970
         MOVE        FRMOVFL,0,DWORD                                  MTS00980
         MOVE        TOTIME,0,DWORD   CLEAR TO TIME                   MTS00990
         MOVE        TOOVFL,0,DWORD                                   MTS01000
         MOVE        TIMFLG,0  RESET TIME FLAG                        MTS01010
      ENDIF                                                           MTS01020
   ENDIF                                                              MTS01030
**************************************************************       MTS01040
*                                                             *       MTS01050
* UPDATE INPUT PARMS                                                  MTS01060
**************************************************************       MTS01070
         MOVE        #1,PRCINDAD      RETURN PROCESS VECTOR INDEX     MTS01080
         MOVE        (0,#1),PROCINDX                                  MTS01090
         MOVE        #1,RSLTIMAD      RETURN RESULT TIME              MTS01100
         MOVE        (0,#1),RSLTIM,DWORD                              MTS01110
         MOVE        #1,TIMFLGAD      RETURN TIME FLAG                MTS01120
         MOVE        (0,#1),TIMFLG                                    MTS01130
         MOVE        #1,SAVEREGS,2    RESTORE CONTENTS OF REG #1 & #2 MTS01140
         RETURN                                                       MTS01150
**************************************************************       MTS01160
*                                                             *       MTS01170
*   EXTRN LIST                                                        MTS01180
**************************************************************       MTS01190
*                                                             *       MTS01200
*   PARAMETER LIST SENT TO THIS ROUTINE BY CALLER                     MTS01210
**************************************************************       MTS01220
INPARMS  EQU         *                PARAMETER LIST POINTER          MTS01230
PRVCBUF  DATA        F'0'             ADDRESS OF PROCESS DEFINITION BUFFER3  MTS01240
ETSDTAD  DATA        F'0'             ADDRESS OF ETS TIME VALUE       MTS01250
OVFLCTAD DATA        F'0'             ADDRESS OF RUNNING TIME OVERFLOW CT  MTS01260
PRCINDAD DATA        F'0'             ADDRESS OF PROCESS VECTOR INDEX MTS01270
RSLTIMAD DATA        F'0'             ADDRESS OF RESULT TIME          MTS01280
TIMFLGAD DATA        F'0'             ADDRESS OF TIME FLAG            MTS01290
RETCODE4 DATA        F'0'             ADDRESS OF RETURN CODE AREA FOR SSV  MTS01300
**************************************************************       MTS01310
*                                                             *       MTS01320
*  DATA CONSTANTS AREA                                                MTS01330
**************************************************************       MTS01340
SAVEREGS DATA        2F'0'            REGISTER #1 & #2 SAVE AREA      MTS01350
TIMFLG   DATA        F'0'             TIME FLAG                       MTS01360
PROCINDX DATA        F'0'             PROCESS VECTOR INDEX            MTS01370
RSLTIM   DATA        D'0'             RESULT TIME                     MTS01380
FROMVEC  DATA        F'0'             FROM PROCESS VECTOR             MTS01390
TOVEC    DATA        F'0'             TO PROCESS VECTOR               MTS01400
FRMTIME  DATA        D'0'             FROM RUNNING TIME               MTS01410
FRMOVFL  DATA        D'0'             FROM OVERFLOW TIME              MTS01420
TOTIME   DATA        D'0'             TO RUNNING TIME                 MTS01430
TOOVFL   DATA        D'0'             TO OVERFLOW TIME                MTS01440
RSLOVFL  DATA        D'0'             RESULT OVERFLOW TIME WORK AREA
ZERO     DATA        D'0'             DOUBLEWORD ZERO
D32767   DATA        D'32767'         DOUBLEWORD VALUE 32,767
```

```
D65536     DATA      D'65536'        DOUBLEWORD VALUE 65,536              MTS01450
OVFLVAL    DATA      X'7FFFFFFF'     DOUBLEWORD VALUE 2,147,483,647       MTS01460
***********************************************************************  MTS01470
* EQUATE TABLES                                                        *  MTS01480
***********************************************************************  MTS01490
           COPY      MTSDREQU        SER3 EQUATES                         MTS01500
           END                                                            MTS01510
```

What is claimed is:

1. A method for testing a device by monitoring a plurality of device signals and displaying only those portions of the signals occurring between specified sets of signal values, comprising the steps of:
 specifying, in sequence, conditions defining limits of the signal portions to be displayed;
 specifying, for each condition, values of signals within each set; and
 beginning display of the signals whenever the specified values for one of the defined limits occurs and ending display whenever the specified values for another of the defined limits occur.

2. The method of claim 1 wherein the conditions include a beginning condition defining a limit, an end condition and qualifying conditions defining events that must occur before the end condition can define a limit.

* * * * *